US012740229B2

(12) United States Patent
Langguth et al.

(10) Patent No.: US 12,740,229 B2
(45) **Date of Patent: *Sep. 15, 2026**

(54) SHEET RESISTANCE COMPONENT

(71) Applicant: Novaled GmbH, Dresden (DE)

(72) Inventors: Oliver Langguth, Dresden (DE); Thomas Rosenow, Dresden (DE); Steffen Runge, Dresden (DE); Benjamin Schulze, Dresden (DE); Max Peter Nüllen, Dresden (DE); Jakob Jacek Wudarczyk, Dresden (DE); Vladimir Uvarov, Dresden (DE); Ulrich Heggemann, Dresden (DE); Steffen Willmann, Dresden (DE)

(73) Assignee: Novaled GmbH, Dresden (DE)

( * ) Notice: Subject to any disclaimer, the term of this patent is extended or adjusted under 35 U.S.C. 154(b) by 301 days.

This patent is subject to a terminal disclaimer.

(21) Appl. No.: 18/262,482

(22) PCT Filed: Jun. 15, 2022

(86) PCT No.: PCT/EP2022/066336

§ 371 (c)(1),
(2) Date: Jul. 21, 2023

(87) PCT Pub. No.: WO2022/263524

PCT Pub. Date: Dec. 22, 2022

(65) Prior Publication Data

US 2024/0107793 A1 Mar. 28, 2024

(30) Foreign Application Priority Data

Jun. 18, 2021 (EP) .................................... 21180327

(51) Int. Cl.

*H10K 50/155* (2023.01)
*H10K 50/15* (2023.01)

(Continued)

(52) U.S. Cl.

CPC ........... *H10K 50/155* (2023.02); *H10K 50/15* (2023.02); *H10K 50/17* (2023.02); *H10K 50/181* (2023.02)

(58) Field of Classification Search

CPC .... H10K 50/155; H10K 50/181; H10K 50/17; H10K 50/15

(Continued)

(56) References Cited

U.S. PATENT DOCUMENTS

| | | | |
|---|---|---|---|
| 5,093,698 A | 3/1992 | Egusa | |
| 8,253,119 B1 * | 8/2012 | Brodie | B82Y 10/00 716/54 |

(Continued)

FOREIGN PATENT DOCUMENTS

| | | |
|---|---|---|
| CN | 111613547 A | 9/2020 |
| EP | 1970371 A1 | 9/2008 |

(Continued)

OTHER PUBLICATIONS

International Preliminary Report on Patentability issued in international application No. PCT/EP2022/066336, mailed Dec. 14, 2023, 9 pages.

(Continued)

*Primary Examiner* — James R Greece
*Assistant Examiner* — Hana S Featherly
(74) *Attorney, Agent, or Firm* — Eversheds Sutherland (US) LLP

(57) ABSTRACT

The present invention relates to an active-matrix OLED display, comprising a plurality of OLED pixels, wherein each pixel itself comprises a stack of organic layers and each layer of the stack of organic layers can form a common semiconductor layer, wherein—at least a first OLED pixel and a second OLED pixel comprising—an anode layer, —a (Continued)

common cathode layer, —at least a stack of organic layers, comprising a plurality of semiconductor layers.

32 Claims, 5 Drawing Sheets

(51) Int. Cl.
*H10K 50/17* (2023.01)
*H10K 50/18* (2023.01)

(58) Field of Classification Search
USPC .......................................................... 313/500
See application file for complete search history.

(56) References Cited

U.S. PATENT DOCUMENTS

| | | | | |
|---|---|---|---|---|
| 2017/0222170 | A1 | 8/2017 | Rothe et al. | |
| 2020/0006689 | A1 * | 1/2020 | Heggemann .......... | C09K 11/06 |

FOREIGN PATENT DOCUMENTS

| | | | |
|---|---|---|---|
| EP | 2722908 | A1 | 4/2014 |
| EP | 3364476 | A1 | 8/2018 |
| GB | 2492400 | A | 1/2013 |
| JP | 2014022221 | A | 2/2014 |
| JP | 2019080044 | A | 5/2019 |
| KR | 20040000630 | A | 1/2004 |
| KR | 20190107484 | A | 9/2019 |
| WO | 0215292 | A2 | 2/2002 |
| WO | 2013079217 | A1 | 6/2013 |
| WO | 2018051487 | A1 | 3/2018 |

OTHER PUBLICATIONS

Yamazaki, Asumi et al., Spatial Resolution Characteristics of Organic Light-emitting Diode Displays: A comparative Analysis of MTF for Handheld and Workstation Formats, SID Symposium Digest of Technical Papers, vol. 44 (2013) pp. 419-422.

Williams, Ralph, Modern GaAs Processing Methods, Artech House (1990) ISBN 0890063435 (8 pages).

Schroder, Dieter K., Semiconductor Material and Device Characterization, John Wiley & Sons, 146 (2006) ISBN 0471739065 (2 pages).

Reeves, G.K. et al., Obtaining the specific contact resistance from transmission line model measurements, IEEE Electron Device Letters (vol. 3, Issue: 5, May 1982), pp. 113-133 (Abstract only).

Allen, Leland C., Electronegativity Is the Average One-Electron Energy of the Valence-Shell Electrons in Ground-State Free Atoms, J. Am. Chem. Soc. 1989, 111, 9003-9014.

Sawada, Taiki et al., Correlation between the static and dynamic responses of organic single-crystal field-effect transistors, Nature Communications (2020) (8 pages).

International Search Report and Written Opinion issued in international application No. PCT/EP2022/066336, mailed Oct. 7, 2022, 10 pages.

Ueno, Nobuo, Electronic Structure of Molecular Solids: Bridge to the Electrical Conduction, Physics of Organic Semiconductors, Second Edition, 2012, Wiley-VCH Verlag GmbH & Co. KGaA, p. 65.

Alghamdi, Noweir Ahmad, Study and Analysis of Simple and Precise of Contact Resistance Single-Transistor Extracting Method for Accurate Analytical Modeling of OTFTs Current-Voltage Characteristics: Application to Different Organic Semiconductors, Crystals 2021, 11, 1448, 11 pages.

Schroder, Dieter K., Contact Resistance and Schottky Barriers, Measurement Techniques, 2006, pp. 146-147.

Tang et al., Organic electroluminescent diodes, Appl. Phys. Lett. 51 (12), Sep. 21, 1987, pp. 913-915.

* cited by examiner

SHEET RESISTANCE COMPONENT

CROSS-REFERENCE TO RELATED APPLICATIONS

This application is a U.S. national phase entry of PCT/EP2022/066336, filed Jun. 15, 2022, which claims priority to European Patent Application No. 21180327.5, filed Jun. 18, 2021. The content of these applications is incorporated by referenced herein.

TECHNICAL FIELD

The present invention relates to an active OLED display having a plurality of OLED pixels, and method for manufacture of at least one common layer.

BACKGROUND ART

Since 1987, when low operating voltages have been demonstrated by Tang et al. (C. W. Tang et al. Appl. Phys. Lett. 51 (12) 913 (1987)), organic light-emitting diodes have been promising candidates for the realization of large-area displays. They consist of a sequence of thin (typically 1 nm to 1 μm) layers of organic materials, which can be deposited, for example, by thermal vacuum evaporation or solution processing, followed by formation of the electrical contacts through metallic layers. Organic electrical devices offer a great variety of electronic or optoelectronic components, such as diodes, light-emitting diodes, photodiodes and thin film transistors (TFT), which, in terms of properties, compete with established components based on inorganic materials.

In the case of organic light-emitting diodes (OLEDs), light is produced and emitted by the light-emitting diode through the injection of charge carriers (electrons from one side, holes from another side) from the contacts into adjacent organic layers as a result of an externally applied voltage, subsequent formation of excitons (electron-hole pairs) in an active zone, and radiative recombination of these excitons.

The advantage of such organic components over conventional inorganic components (based on inorganic semiconductors such as silicon or gallium arsenide) is the option to produce large-area elements, e.g. large display elements (visual displays, screens) or lamps (for lighting applications). Organic materials, compared to inorganic materials, are relatively inexpensive (less expenditure of material and energy). Moreover, these materials, because of their low processing temperature compared to inorganic materials, can be deposited on flexible substrates, thereby opening up a whole series of new applications in display and illuminating engineering. The basic construction of such a component includes an arrangement of one or more of the following layers: Carrier substrate; hole-injecting (positive contact) base electrode which is usually transparent; hole-injecting layer (HIL); hole-transporting layer (HTL); light-emitting layer (EL); electron-transporting layer (ETL); electron-injecting layer (EIL); electron-injecting (negative contact) cover electrode, usually a metal with low work function; and encapsulation, to exclude ambient influences.

While the foregoing represents the most typical case, often several layers may be (with the exception of HTL and ETL) omitted, or else one layer may combine several properties.

The use of doped charge-carrier transport layers (p-doping of the HTL by admixture of acceptor-like molecules, n-doping of the ETL by admixture of donor-like molecules) is described in document U.S. Pat. No. 5,093,698. Doping in this sense means that the admixture of doping substances into the layer increases the equilibrium charge-carrier concentration in this layer, compared to the pure layers of one of the two substances concerned, which results in improved electrical conductivity and better charge-carrier injection from the adjacent contact layers into this mixed layer. The transport of charge carriers still takes place on the matrix molecules. According to U.S. Pat. No. 5,093,698, the doped layers are used as injection layers at the interface to the contact materials, the light-emitting layer being found in between (or, when only one doped layer is used, next to the other contact). Equilibrium charge-carrier density, increased by doping, and associated band bending, facilitate charge-carrier injection. The energy levels of the organic layers (HOMO=highest occupied molecular orbital or highest energetic valence band energy; LUMO=lowest unoccupied molecular orbital or lowest energetic conduction band energy), according to U.S. Pat. No. 5,093,698, should be obtained so that electrons in the ETL as well as holes in the HTL can be injected into the EL (emitting layer) without further barriers, which requires very high ionization energy of the HTL material and very low electron affinity of the ETL material.

With respect to active OLED displays, so-called crosstalk between pixels of the display has been a major problem. Pixel or colour crosstalk refers to photons of one colour generated by a pixel falsely mixing with photons of another colour scattered from a close pixel. For example, documents GB 2 492 400 A and WO 2002/015292 A2 provide measures for reducing colourcrosstalk in OLED devices. In addition, or as an alternative aspect, electrical crosstalk may occur. In this case, for example, a driving current applied to one of the pixels may cause light emission from another pixel close to the pixel for which the driving current is provided. Both will have a negative impact on the performance of the display device, (see Yamazaki et al., A. (2013), 33.2: Spatial Resolution Characteristics of Organic Light-emitting Diode Displays: A comparative Analysis of MTF for Handheld and Workstation Formats. SID Symposium Digest of Technical Papers, 44: 419-422. doi: 10.1002/j.2168-0159.2013.tb06236.x).

In a typical commercial active-matrix OLED display, electrical pixel cross talk may be caused by the application of redox p-doping in a hole transport layer (HTL) which is shared by more OLED pixels (in the sense that the shared HTL is electrically connected to anodes of a plurality of pixels present in the display). The use of redox p-dopants which increase charge carrier density by creation of new charge carriers (holes) by transfer of an electron from a molecule of the doped matrix to a dopant molecule is beneficial for low-operating voltage, high operational stability and high production yield. On the other hand, redox p-doping increases electrical conductivity of hole transport layers from less than $10^{-8}$ S/cm without p-dopant, usually from less than $10^{-10}$ S/cm, to more than $10^{-6}$ S/cm (typically, with concentrations of the p-dopant in the range between 1 and 5 wt. %). Therefore, redox-doped HTL is usually responsible for any electrical pixel cross talk in active matrix displays comprising a HTL shared by plurality of pixels. The ETL, if n-doped with redox n-dopants, might also show similarly high conductivity as the redox-doped HTL, however, due to display layout with a common cathode, the ETL does not cause electrical pixel cross talk.

DISCLOSURE

It is an object to provide improved technologies for active-matrix OLED displays, in particular, cross talk between neighbor pixels of the active OLED display shall be reduced.

In one aspect, an active-matrix OLED display is provided, comprising a plurality of OLED pixels, wherein each pixel itself comprises a stack of organic layers and each layer of the stack of organic layers can form a common semiconductor layer, wherein at least a first OLED pixel and a second OLED pixel comprising an anode layer, a common cathode layer, at least a stack of organic layers, comprising a plurality of semiconductor layers, and the plurality of semiconductor layers comprising of at least two or more common semiconductor layers, wherein the plurality of semiconductor layers comprising at least a common first semiconductor layer that is a common hole injection layer, wherein the common hole injection layer comprises a hole injection material, at least a common second semiconductor layer, at least one emission layer, which is optional a common emission layer, and wherein the common hole injection layer and the common second semiconductor layer have together a sheet resistance of ≥50 giga ohms per square.

According to one embodiment, wherein the sheet resistance of the common first semiconductor layer and the common second semiconductor layer is measured together alone.

According to one embodiment, wherein the sheet resistance of the common first semiconductor layer and the common second semiconductor layer is measured together alone, wherein for measurement of the sheet resistance the common second semiconductor layer is directly deposited on the common first semiconductor layer and the common first semiconductor layer is directly deposited on measurement electrodes, preferably ITO electrodes.

In one aspect, an active-matrix OLED display is provided, comprising a plurality of OLED pixels, wherein each pixel itself comprises a stack of organic layers and each layer of the stack of organic layers can form a common semiconductor layer, wherein at least a first OLED pixel and a second OLED pixel comprising an anode layer, a common cathode layer, at least a stack of organic layers, comprising a plurality of semiconductor layers, and the plurality of semiconductor layers comprising of at least two or more common semiconductor layers, wherein the plurality of semiconductor layers comprising at least a common first semiconductor layer that is a common hole injection layer, wherein the common hole injection layer comprises a hole injection material, at least a common second semiconductor layer, at least one emission layer, which is optional a common emission layer, and wherein the common hole injection layer and the common second semiconductor layer have together a sheet resistance of ≥50 giga ohms per square, wherein the sheet resistance of the common first semiconductor layer and the common second semiconductor layer is measured together alone, wherein for measurement of the sheet resistance the common second semiconductor layer is directly deposited on the common first semiconductor layer and the common first semiconductor layer is directly deposited on measurement electrodes, preferably ITO electrodes.

In one aspect, an active-matrix OLED display is provided, comprising a plurality of OLED pixels, wherein each pixel itself comprises a stack of organic layers and each layer of the stack of organic layers can form a common semiconductor layer, wherein at least a first OLED pixel and a second OLED pixel comprising an anode layer, a common cathode layer, at least a stack of organic layers, comprising a plurality of semiconductor layers, and the plurality of semiconductor layers comprising of at least two or more common semiconductor layers, wherein the plurality of semiconductor layers comprising at least a common first semiconductor layer that is a common hole injection layer, wherein the common hole injection layer comprises a hole injection material, at least a common second semiconductor layer, at least one emission layer, which is optional a common emission layer, and wherein the common hole injection layer and the common second semiconductor layer have together a sheet resistance of ≥50 giga ohms per square, wherein the sheet resistance of the common first semiconductor layer and the common second semiconductor layer is measured together alone, wherein for measurement of the sheet resistance the common second semiconductor layer is directly deposited on the common first semiconductor layer and the common first semiconductor layer is directly deposited on measurement electrodes, preferably ITO electrodes.

According to one embodiment, an active-matrix OLED display is provided, comprising a plurality of OLED pixels, wherein each pixel itself comprises a stack of organic layers and each layer of the stack of organic layers can form a common semiconductor layer, wherein at least a first OLED pixel and a second OLED pixel comprising an anode layer, a common cathode layer, at least a stack of organic layers, comprising a plurality of semiconductor layers, wherein the common first semiconductor layer extends over all pixels of the plurality of pixels or extends over at least two pixels of the plurality of pixels in the OLED display, and the plurality of semiconductor layers comprising of at least two or more common semiconductor layers, wherein the plurality of semiconductor layers comprising at least a common first semiconductor layer that is a common hole injection layer, wherein the common hole injection layer comprises a hole injection material, at least a common second semiconductor layer, at least one emission layer, which is optional a common emission layer, and wherein the common hole injection layer and the common second semiconductor layer have together a sheet resistance of ≥50 giga ohms per square, wherein optional the sheet resistance of the common first semiconductor layer and the common second semiconductor layer is measured together alone, wherein for measurement of the sheet resistance the common second semiconductor layer is directly deposited on the common first semiconductor layer and the common first semiconductor layer is directly deposited on measurement electrodes, preferably ITO electrodes.

According to one embodiment, an active-matrix OLED display is provided, comprising a plurality of OLED pixels, wherein each pixel itself comprises a stack of organic layers and each layer of the stack of organic layers can form a common semiconductor layer, wherein at least a first OLED pixel and a second OLED pixel comprising an anode layer, a common cathode layer, at least a stack of organic layers, comprising a plurality of semiconductor layers, wherein the common first semiconductor layer extends over all pixels of the plurality of pixels or extends over at least two pixels of the plurality of pixels in the OLED display, and the plurality of semiconductor layers comprising of at least two or more common semiconductor layers, wherein the plurality of semiconductor layers comprising at least a common first semiconductor layer that is a common hole injection layer, wherein the common hole injection layer comprises a hole injection material, at least a common second semiconductor layer, at least one emission layer, which is optional a common emission layer, and wherein the common hole injection layer and the common second semiconductor layer have together a sheet resistance of ≥50 giga ohms per square, wherein optional the sheet resistance of the common first semiconductor layer and the common second semiconductor layer is measured together alone, wherein optional the sheet resistance of the common first semiconductor layer and the common second semiconductor layer is measured together alone, wherein for measurement of the sheet resistance the common second semiconductor layer is directly deposited on the common first semiconductor layer and the common first semiconductor layer is directly deposited on measurement electrodes preferably ITO electrodes.

According to one embodiment, an active-matrix OLED display is provided, comprising a plurality of OLED pixels, wherein each pixel itself comprises a stack of organic layers and each layer of the stack of organic layers can form a common semiconductor layer, wherein at least a first OLED pixel and a second OLED pixel comprising an anode layer, a common cathode layer, at least a stack of organic layers, comprising a plurality of semiconductor layers, wherein the common first semiconductor layer extends over all pixels of the plurality of pixels or extends over at least two pixels of the plurality of pixels in the OLED display, and the plurality of semiconductor layers comprising of at least two or more common semiconductor layers, wherein the plurality of semiconductor layers comprising at least a common first semiconductor layer that is a common hole injection layer, wherein the common hole injection layer comprises a hole injection material, at least a common second semiconductor layer, at least one emission layer, which is optional a common emission layer, and wherein the common hole injection layer and the common second semiconductor layer have together a sheet resistance of ≥50 giga ohms per square, wherein the common hole injection layer and the common second semiconductor layer is measured together alone, wherein for measurement of the sheet resistance the common second semiconductor layer is directly deposited on the common first semiconductor layer and the common first semiconductor layer is directly deposited on measurement electrodes, preferably ITO electrodes.

According to one embodiment, an active-matrix OLED display is provided, comprising a plurality of OLED pixels, wherein each pixel itself comprises a stack of organic layers and each layer of the stack of organic layers can form a common semiconductor layer, wherein at least a first OLED pixel and a second OLED pixel comprising an anode layer, a common cathode layer, at least a stack of organic layers, comprising a plurality of semiconductor layers, wherein the common first semiconductor layer extends over all pixels of the plurality of pixels or extends over at least two pixels of the plurality of pixels in the OLED display, and the plurality of semiconductor layers comprising of at least two or more common semiconductor layers, wherein the plurality of semiconductor layers comprising at least a common first semiconductor layer that is a common hole injection layer, wherein the common hole injection layer comprises a hole injection material, at least a common second semiconductor layer, at least one emission layer, which is optional a common emission layer, and wherein the common hole injection layer and the common second semiconductor layer have together a sheet resistance of ≥50 giga ohms per square, wherein the common hole injection layer and the common second semiconductor layer is measured together alone, wherein for measurement of the sheet resistance the common second semiconductor layer is directly deposited on the common hole injection layer, and the common hole injection layer is directly deposited on measurement electrodes, preferably ITO electrodes.

A property of organic semi-conducting devices is their conductivity. By using a hole injection material, the electrical conductivity of a layer of an organic semi-conducting device can be significantly increased. The sheet resistance is for example determined by the so called "transmission line method". At this, a voltage is applied to the thin layer and the current flowing through the layer is measured. The sheet resistance, respectively the electrical conductivity, results by considering the geometry of the contacts and the thickness of the layer of the sample.

The sheet resistance is determined by the transmission line method.

According to embodiment an active-matrix OLED display is provided, comprising a plurality of OLED pixels, wherein each pixel itself comprises a stack of organic layers and each layer of the stack of organic layers can form a common semiconductor layer, wherein at least a first OLED pixel and a second OLED pixel comprising
an anode layer,
a common cathode layer,
at least a stack of organic layers, comprising
a plurality of semiconductor layers, and the plurality of semiconductor layers comprising at least two or more common semiconductor layers, wherein the plurality of semiconductor layers comprising
at least a common first semiconductor layer that is a common hole injection layer, wherein the common hole injection layer comprises a hole injection material,
at least a common second semiconductor layer,
at least one emission layer, which is optional a common emission layer, and wherein the common hole injection layer and the common second semiconductor layer have together a sheet resistance of ≥50 giga ohms per square, wherein the sheet resistance is determined by transmission line method, wherein optional the sheet resistance of the common first semiconductor layer and the common second semiconductor layer is measured together alone, wherein for measurement of the sheet resistance the common second semiconductor layer is directly deposited on the common first semiconductor layer and the common first semiconductor layer is directly deposited on measurement electrodes, preferably ITO electrodes.

The sheet resistance is determined by the transmission line method.

According to embodiment an active-matrix OLED display is provided, comprising a plurality of OLED pixels, wherein each pixel itself comprises a stack of organic layers and each layer of the stack of organic layers can form a common semiconductor layer, wherein at least a first OLED pixel and a second OLED pixel comprising
an anode layer,
a common cathode layer,
at least a stack of organic layers, comprising
a plurality of semiconductor layers, and the plurality of semiconductor layers comprising at least two or more common semiconductor layers, wherein the plurality of semiconductor layers comprising
at least a common first semiconductor layer that is a common hole injection layer, wherein the common hole injection layer comprises a hole injection material,
at least a common second semiconductor layer,
at least one emission layer, which is optional a common emission layer, and wherein the common hole injection layer and the common second semiconductor layer have together a sheet resistance of ≥50 giga ohms per square, wherein the sheet resistance is determined by transmission line method, wherein optional the sheet resistance of the common first semiconductor layer and the common second semiconductor layer is measured together alone, wherein for measurement of the sheet resistance the common second semiconductor layer is directly deposited on the common first semiconductor layer and the common first semiconductor layer is directly deposited on measurement electrodes, preferably ITO electrodes.

According to embodiment an active-matrix OLED display is provided, comprising a plurality of OLED pixels, wherein each pixel itself comprises a stack of organic layers and each layer of the stack of organic layers can form a common semiconductor layer, wherein at least a first OLED pixel and a second OLED pixel comprising
an anode layer,
a common cathode layer,
at least a stack of organic layers, comprising
a plurality of semiconductor layers, and the plurality of semiconductor layers comprising at least two or more common semiconductor layers, wherein the plurality of semiconductor layers comprising
at least a common first semiconductor layer that is a common hole injection layer, wherein the common hole injection layer comprises a hole injection material,
at least a common second semiconductor layer,
at least one emission layer, which is optional a common emission layer, and wherein the common hole injection layer and the common second semiconductor layer have together a sheet resistance of ≥50 giga ohms per square, wherein the sheet resistance is determined by transmission line method, wherein the sheet resistance of the common hole injection layer and the common second semiconductor layer is measured together alone, wherein for measurement of the sheet resistance the common second semiconductor layer is directly deposited on the common first semiconductor layer and the common first semiconductor layer is directly deposited on measurement electrodes, preferably ITO electrodes.

According to embodiment an active-matrix OLED display is provided, comprising a plurality of OLED pixels, wherein each pixel itself comprises a stack of organic layers and each layer of the stack of organic layers can form a common semiconductor layer, wherein at least a first OLED pixel and a second OLED pixel comprising
an anode layer,
a common cathode layer,
at least a stack of organic layers, comprising
a plurality of semiconductor layers, and the plurality of semiconductor layers comprising at least two or more common semiconductor layers, wherein the plurality of semiconductor layers comprising
at least a common first semiconductor layer that is a common hole injection layer, wherein the common hole injection layer comprises a hole injection material,
at least a common second semiconductor layer,
at least one emission layer, which is optional a common emission layer, and wherein the common hole injection layer and the common second semiconductor layer have together a sheet resistance of ≥50 giga ohms per square, wherein the sheet resistance is determined by transmission line method, wherein the sheet resistance of the common hole injection layer and the common second semiconductor layer is measured together alone, wherein for measurement of the sheet resistance the common second semiconductor layer is directly deposited on the common hole injection layer and the common hole injection layer is directly deposited on measurement electrodes, preferably ITO electrodes.

In the present specification, when a definition is not otherwise provided, "hole injection material" refers to a material capable of facilitating hole injection, i.e. positive charges injected from an anode preferably into an organic layer in particular a hole transport layer, and wherein said material is capable of reducing the operational voltage at a certain current density if present.

The hole injection material can be a metal compound or an organic compound.

The hole injection material may provide a hole injection from anodes into hole transport matrices, without substantially increasing the concentration of free charge carriers above the level which corresponds to conductivities observed in a neat matrix or may capable of increasing the density of positive charge carriers in a hole transport material or hole transport layer, when added to a semiconductor. The hole injection material can be used alone within a layer or in conjunction with a hole transport material or hole transport layer.

Preferably, the hole injection material is a redox-dopant, i.e. capable of increasing the density of positive charge carriers in a hole transport material or hole transport layer, when added to a semiconductor.

According to one embodiment an intrinsic layer of the hole injection layer may only consist or essentially consist of a hole injection material. The hole injection material is not the same as the hole transport material or hole transport matrix compound.

The term "Measured together alone" refers to the measurement of the sheet resistance of the respective layers without other layers or common layers of the OLED display.

In other words, the term "Measured together alone" refers to the measurement of the sheet resistance of the respective layers on top of each other without other layers or common layers of the OLED display.

Thus, the term "measured together alone" refers to the measurement of the sheet resistance of the combination of the respective common layers, wherein said common layers are on top of each other without other layers or common layers of the OLED display.

For example, in a case wherein the sheet resistance of the common first semiconductor layer and the common second semiconductor layer is measured together alone, the common first semiconductor layer and the common second semiconductor layer are on top of each other and other layers are not present for measurement of the sheet resistance.

In another example, in a case wherein the sheet resistance of the common hole injection layer and the common second semiconductor layer is measured together alone, the common hole injection layer and the common second semiconductor layer are on top of each other and other layers are not present for measurement of the sheet resistance.

In another example, in a case wherein the sheet resistance of the common hole semiconductor layer and the common hole transport layer is measured together alone, the common hole injection layer and the common hole transport layer are on top of each other and other layers are not present for measurement of the sheet resistance.

In another example, in a case wherein the sheet resistance of the common first semiconductor layer, the common second semiconductor layer and common third semiconductor layer is measured together alone, the common first semiconductor layer, the common second semiconductor layer, and the common third semiconductor layer are on top of each other and other layers are not present for measurement of the sheet resistance.

In another example, in a case wherein the sheet resistance of the common first semiconductor layer, the common second semiconductor layer, common third semiconductor layer and common emission layer is measured together alone, the common first semiconductor layer, the common second semiconductor layer, the common third semiconductor layer and the common emission layer are on top of each other and other layers are not present for measurement of the sheet resistance.

In another example, in a case wherein the sheet resistance of the common first semiconductor layer, the common second semiconductor layer, common third semiconductor layer and emission layer is measured together alone, the common first semiconductor layer, the common second semiconductor layer, the common third semiconductor layer and the emission layer are on top of each other and other layers are not present for measurement of the sheet resistance.

Transmission Line Method

Sheet resistance Rs is measured for a given deposited layer stack on a test element group (see FIG. 2) consisting of test elements called channel providing two highly conductive electrodes with gap "l" between each other and a width "w" of each (see FIG. 1). To improve noise level large "w" may be used and electrodes formed in interdigitated finger structure for reduced area requirement (see FIG. 3). At least three of such channels with different channel length "l" are needed for reliable Rs calculation.

The measurement is done in following way:

First voltage is swept between −5V to +5V with step size smaller than 1V and current is measured. The substrate temperature during this measurement is preferably 23+/−2° C. Using a linear fit with current values on x-axis and voltage values on y-axis slope of the fit gives channel resistance "R". This procedure is repeated for each channel "n", resulting in an "Rn" for channel "n" with gap "ln" and width "w". For Rs calculation width "w" must be constant over all channels. Fit quality index R 2 must be larger than 0.9 for a reliable resistance value.

In the second step resistance "Rn" is plotted over channel with gap "ln" and linear fitted. Slope of this fit multiplied with channel width "w" gives sheet resistance Rs for deposited layer stack. This calculation removes influence of contact- and series resistance from measurement setup. Electrode gap should be close to target application gap, for example 20 μm, 40 μm, 60 μm. Channel width for low conductive layers might be 100000 μm.

The measurement is done on glass substrates (Corning Eagle XG) with ITO electrodes. After wet cleaning with water based tenside solution and drying by blowing with nitrogen followed by 200° C. 120 minutes baking in nitrogen atmosphere substrates are conditioned with nitrogen plasma. After organic layer deposition before electrical measurement samples are encapsulated using encapsulation glass lids including a desiccant.

The transmission line method is a common method to measure a sheet resistance and is described inter alia:

Williams, Ralph (1990). *Modern GaAs Processing Methods. Artech House*. ISBN 0890063435.

Schroder, Dieter K. (2006). *Semiconductor Material and Device Characterization*. John Wiley & Sons. ISBN 0471739065.

Reeves, G. K., IEEE Electron Device Letters (Volume: 3, Issue: 5, May 1982), pages 113-133 (https://ieeexplore.ieee.org/document/1482607)

Preferred Sheet Resistance Measurement

In case of contact resistance much lower than resistance of channel area between the electrodes, a simplified method for sheet resistance measurement might be used. On electrode pair with channel width w of for example 103500 μm and channel length 1 of 80 μm a voltage V of 5V is applied and current I measured using a Keithley SM2635 source measure unit. Channel resistance R is calculated by formula R=V/I. In following step sheet resistance Rs is calculated by Rs=12*w/l. The sheet resistance was measured at 23+/−2° C. Taking 80 μm channel current at 5V form example data in FIG. 6, gives R=5V/1.33e.7A=3.76e7 Ohm and Rs=R*w/l=3.76e7 Ohm*103500 μm/80 μm=48.6 GOhm/sq.

Alternative Sheet Resistance Measurement

As an alternative the sheet resistance can be measured as follows:

ITO coated substrates with 90 nm ITO with 10 Ohm/sq sheet resistance were patterned with interdigitated finger structure according to FIG. 4. 12 ITO fingers on both electrodes form a total of 23 conductive areas: n=23. Interdigitation length w e was 4.5 mm. Thus total channel width was 103.5 mm. Channel length was varied between 20 and 80 μm in 20 μm steps. Electrode pairs with 4 different channel lengths were combined on one substrate with 25×25 mm 2 dimension like displayed in FIG. 5. Organic layers were deposited on the substrate covering the complete interdigitated finger pattern. On the substrates a first common semiconductor layer comprises at least one hole injection material with a 10 nm thickness, for example the first common semiconductor layer is a hole injection layer that consists of a doped covalent matrix compound, suitable covalent matrix compounds are described in the specification, was deposited by co-evaporation. The temperature range depends on the material and is limited by the vaporization temperature at which vaporization begins and the decomposition temperature. These values are material parameters and are different for each material. The values are typically between 50° C. and 500° C., mostly between 150° C. and 350° C. For example, the covalent matrix compound deposition took place at constant rate of 1 Å/s (Angstrom per second) with evaporation source temperature of 272° C. The hole injection material source was for example operated with 0.068 Å/s at 174° C. On this layer the second common semiconductor layer, which is for example a common hole transport layer or a common electron blocking layer, wherein a hole transport layer is preferred, with a thickness of 128 nm was deposited at a deposition rate of 2 Å/s and temperature of 280° C. Chamber pressure was 3e-7 mbar during the whole deposition process. However, as explained above, the evaporation temperatures used depends on the vaporization temperature at which vaporization begins and the decomposition temperature. Evaporation temperatures for organic materials are material dependent and usually between 80° C. and 500° C. The obtained substrate layer device were encapsulated in a Nitrogen filled glovebox using glass lids with integrated desiccant, to prevent sample degradation, after organic layer deposition.

On each electrode pair corresponding to a given channel length a voltage between −5V and +5V in steps of 0.5V was applied and the current measured. This was done using a Keithley SM2635 source measure unit. FIG. 6 shows an exemplary diagram of such a measurement. Calculation of slope for each measurement corresponding to a given channel length gives resistance Rn for this channel length. Plotting Rn over corresponding channel length, calculating this slope and multiplying it with channel width of 103500 μm gives sheet resistance Rs of the measured layer stack. In the given example slope of 470199 Ohm/μm is multiplied with channel width of 103500 μm. The result is a sheet resistance of 48.7 GOhm/square. The sheet resistance was measured at 23° C. and 1013 mbar.

Common Layer

A common layer refers to layers deposited onto the complete display area or the area of at least two pixels, through one large mask opening in one processing step and/or layers consisting of several overlapping areas deposited in several consecutive steps, even if the overlapping layers consists of different materials.

According to one embodiment of the active-matrix OLED display, the common second semiconductor layer can be a common hole transport layer or a common electron blocking layer, more preferred the common hole injection layer is in direct contact with the second common semiconductor layer that is a common hole transport layer or common electron blocking layer; and further more preferred the common second semiconductor layer is a common hole transport layer.

According to another embodiment of the active-matrix OLED display, the plurality of common semiconductor layers may comprise in addition a common third semiconductor layer, wherein the common first semiconductor layer, the common second semiconductor layer and the common third semiconductor layer have together a sheet resistance of ≥50 giga ohms per square.

According to another embodiment of the active-matrix OLED display, the plurality of common semiconductor layers may comprise in addition a common third semiconductor layer, wherein the common first semiconductor layer, the common second semiconductor layer and the common third semiconductor layer have together a sheet resistance of ≥50 giga ohms per square, wherein the sheet resistance of the common first semiconductor layer, the common second semiconductor layer and the common third semiconductor layer is measured together alone.

According to another embodiment of the active-matrix OLED display, the plurality of common semiconductor layers may comprise in addition a common third semiconductor layer, wherein the common first semiconductor layer, the common second semiconductor layer and the common third semiconductor layer have together a sheet resistance of ≥50 giga ohms per square, wherein the sheet resistance of the common first semiconductor layer, the common second semiconductor layer and the common third semiconductor layer is measured together alone, wherein for measurement of the sheet resistance the common third semiconductor layer is directly deposited on the common second semiconductor layer and the common second semiconductor layer is directly deposited on the common first semiconductor layer and the common first semiconductor layer is directly deposited on measurement electrodes preferably ITO electrodes.

According to another embodiment of the active-matrix OLED display, the common third semiconductor layer can be a common electron blocking layer, wherein the common first semiconductor layer is a common hole injection layer, and the common second semiconductor layer is a common hole transport layer; and wherein the common first semiconductor layer that is a common hole injection layer, and the common second semiconductor layer that is a common hole transport layer, and the common third semiconductor layer that is a common electron blocking layer have together a sheet resistance of ≥50 giga ohms per square.

According to another embodiment of the active-matrix OLED display, the common third semiconductor layer can be a common electron blocking layer, wherein the common first semiconductor layer is a common hole injection layer, and the common second semiconductor layer is a common hole transport layer; and wherein the common first semiconductor layer that is a common hole injection layer, and the common second semiconductor layer that is a common hole transport layer, and the common third semiconductor layer that is a common electron blocking layer have together a sheet resistance of ≥50 giga ohms per square, wherein the sheet resistance of the common first semiconductor layer, the common second semiconductor layer and the common third semiconductor layer is measured together alone.

According to another embodiment of the active-matrix OLED display, the common third semiconductor layer can be a common electron blocking layer, wherein the common first semiconductor layer is a common hole injection layer, and the common second semiconductor layer is a common hole transport layer; and wherein the common first semiconductor layer that is a common hole injection layer, and the common second semiconductor layer that is a common hole transport layer, and the common third semiconductor layer that is a common electron blocking layer have together a sheet resistance of ≥50 giga ohms per square, wherein the sheet resistance of the common first semiconductor layer, the common second semiconductor layer and the common third semiconductor layer is measured together alone, wherein for measurement of the sheet resistance the common third semiconductor layer is directly deposited on the common second semiconductor layer and the common second semiconductor layer is directly deposited on the common first semiconductor layer and the common first semiconductor layer is directly deposited on measurement electrodes preferably ITO electrodes.

According to another embodiment of the active-matrix OLED display, the common third semiconductor layer can be a common electron blocking layer, wherein the common first semiconductor layer is a common hole injection layer, and the common second semiconductor layer is a common hole transport layer; and wherein the common first semiconductor layer that is a common hole injection layer, and the common second semiconductor layer that is a common hole transport layer, and the common third semiconductor layer that is a common electron blocking layer have together a sheet resistance selected from ≥100 giga ohms per square, ≥150 giga ohms per square, ≥200 giga ohms per square, ≥300 giga ohms per square, ≥400 giga ohms per square, ≥500 giga ohms per square, ≥1000 giga ohms per square, ≥2500 giga ohms per square, ≥5000 giga ohms per square, ≥10000 giga ohms per square, ≥20000 giga ohms per square, ≥30000 giga ohms per square, ≥40000 giga ohms per square, or ≥50000 giga ohms per square.

According to another embodiment of the active-matrix OLED display, the common third semiconductor layer can be a common electron blocking layer, wherein the common first semiconductor layer is a common hole injection layer, and the common second semiconductor layer is a common hole transport layer; and wherein the common first semiconductor layer that is a common hole injection layer, and the common second semiconductor layer that is a common hole transport layer, and the common third semiconductor layer that is a common electron blocking layer have together a sheet resistance selected from ≥100 giga ohms per square, ≥150 giga ohms per square, ≥200 giga ohms per square, ≥300 giga ohms per square, ≥400 giga ohms per square, ≥500 giga ohms per square, ≥1000 giga ohms per square, ≥2500 giga ohms per square, ≥5000 giga ohms per square, ≥10000 giga ohms per square, ≥20000 giga ohms per square, ≥30000 giga ohms per square, ≥40000 giga ohms per square, or ≥50000 giga ohms per square, wherein the sheet resistance of the common first semiconductor layer, the common second semiconductor layer and the common third semiconductor layer is measured together alone.

According to another embodiment of the active-matrix OLED display, the common third semiconductor layer can be a common electron blocking layer, wherein the common first semiconductor layer is a common hole injection layer, and the common second semiconductor layer is a common hole transport layer; and wherein the common first semiconductor layer that is a common hole injection layer, and the common second semiconductor layer that is a common hole transport layer, and the common third semiconductor layer that is a common electron blocking layer have together a sheet resistance selected from ≥100 giga ohms per square, ≥150 giga ohms per square, ≥200 giga ohms per square, ≥300 giga ohms per square, ≥400 giga ohms per square, ≥500 giga ohms per square, ≥1000 giga ohms per square, ≥2500 giga ohms per square, ≥5000 giga ohms per square, ≥10000 giga ohms per square, ≥20000 giga ohms per square, ≥30000 giga ohms per square, ≥40000 giga ohms per square, or ≥50000 giga ohms per square, wherein the sheet resistance of the common first semiconductor layer, the common second semiconductor layer and the common third semiconductor layer is measured together alone, wherein for measurement of the sheet resistance the common third semiconductor layer is directly deposited on the common second semiconductor layer and the common second semiconductor layer is directly deposited on the common first semiconductor layer and the common first semiconductor layer is directly deposited on measurement electrodes preferably ITO electrodes.

According to another embodiment of the active-matrix OLED display, wherein the common third semiconductor layer that is a common electron blocking layer can be arranged between the common second semiconductor layer that is a common hole transport layer and the emission layer.

According to another embodiment of the active-matrix OLED display, wherein the emission layer of each pixel is doped with a color defining emitter dopant, wherein the color of the color defining emitter dopant is independently selected for each pixel or selected the same.

According to another embodiment of the active-matrix OLED display, wherein the anode layer of the first OLED pixel and the anode layer of the second OLED pixel may be separated by a pixel definition layer, so that the anode layer of the first OLED pixel and the anode layer of the second OLED pixel are not formed as a common layer and do not contact each other.

According to another embodiment of the active-matrix OLED display, wherein the common hole injection layer can be at least partly arranged in direct contact to the anode layer and the common hole transport layer is arranged between the common emission layer and the common hole injection layer.

According to another embodiment of the active-matrix OLED display, wherein every individual pixel may have its own anode that may not touch anodes of other individual pixels.

According to another embodiment of the active-matrix OLED display, wherein every individual pixel may comprise its own semiconductor layer that may not touch semiconductor layer of other individual pixels, if these semiconductor layer or layers are not a common semiconductor layer.

According to another embodiment of the active-matrix OLED display, wherein the common hole injection layer, the common second semiconductor layer, the common third semiconductor layer, and the common emission layer may have together a sheet resistance of ≥50 giga ohms per square.

According to another embodiment of the active-matrix OLED display, wherein the common hole injection layer, the common second semiconductor layer, the common third semiconductor layer, and the emission layer may have together a sheet resistance of ≥50 giga ohms per square, wherein the sheet resistance of the common hole injection layer, the common second semiconductor layer, the common third semiconductor layer and the emission layer is measured together alone.

According to another embodiment of the active-matrix OLED display, wherein the common hole injection layer, the common second semiconductor layer, the common third semiconductor layer, and the emission layer may have together a sheet resistance of ≥50 giga ohms per square, wherein the sheet resistance of the common hole injection layer, the common second semiconductor layer, the common third semiconductor layer and the emission layer is measured together alone, wherein for measurement of the sheet resistance the emission layer is directly deposited on the common third semiconductor layer, and the common third semiconductor layer is directly deposited on the common second semiconductor layer, and the common second semiconductor layer is directly deposited on the common hole injection layer and the common hole injection layer is directly deposited on measurement electrodes preferably ITO electrodes.

According to another embodiment of the active-matrix OLED display, wherein the common hole injection layer, the common second semiconductor layer, the common third semiconductor layer, and the common emission layer may have together a sheet resistance of ≥50 giga ohms per square, wherein the sheet resistance of the common hole injection layer, the common second semiconductor layer, the common third semiconductor layer and the common emission layer is measured together alone.

According to another embodiment of the active-matrix OLED display, wherein the common hole injection layer, the common second semiconductor layer, the common third semiconductor layer, and the common emission layer may have together a sheet resistance of ≥50 giga ohms per square, wherein the sheet resistance of the common hole injection layer, the common second semiconductor layer, the common third semiconductor layer and the common emission layer is measured together alone, wherein for measurement of the sheet resistance the common emission layer is directly deposited on the common third semiconductor layer, the common third semiconductor layer is directly deposited on the common second semiconductor layer and the common second semiconductor layer is directly deposited on the common hole injection layer and the common hole injection layer is directly deposited on measurement electrodes preferably ITO electrodes.

According to another embodiment of the active-matrix OLED display, wherein the common hole injection layer, the common second semiconductor layer, the common third semiconductor layer, and the common emission layer may have together a sheet resistance selected from ≥100 giga ohms per square, ≥150 giga ohms per square, ≥200 giga ohms per square, ≥300 giga ohms per square, ≥400 giga ohms per square, ≥500 giga ohms per square, ≥1000 giga ohms per square, ≥2500 giga ohms per square, ≥5000 giga ohms per square, ≥10000 giga ohms per square, ≥20000 giga ohms per square, ≥30000 giga ohms per square, ≥40000 giga ohms per square, or ≥50000 giga ohms per square.

According to another embodiment of the active-matrix OLED display, wherein the common hole injection layer, the common second semiconductor layer, the common third semiconductor layer, and the common emission layer may have together a sheet resistance selected from ≥100 giga ohms per square, ≥150 giga ohms per square, ≥200 giga ohms per square, ≥300 giga ohms per square, ≥400 giga ohms per square, ≥500 giga ohms per square, ≥1000 giga ohms per square, ≥2500 giga ohms per square, ≥5000 giga ohms per square, ≥10000 giga ohms per square, ≥20000 giga ohms per square, ≥30000 giga ohms per square, ≥40000 giga ohms per square, or ≥50000 giga ohms per square, wherein the sheet resistance of the common hole injection layer, the common second semiconductor layer, the common third semiconductor layer and emission layer is measured together alone.

According to another embodiment of the active-matrix OLED display, wherein the common hole injection layer, the common second semiconductor layer, the common third semiconductor layer, and the common emission layer may have together a sheet resistance selected from ≥100 giga ohms per square, ≥150 giga ohms per square, ≥200 giga ohms per square, ≥300 giga ohms per square, ≥400 giga ohms per square, ≥500 giga ohms per square, ≥1000 giga ohms per square, ≥2500 giga ohms per square, ≥5000 giga ohms per square, ≥10000 giga ohms per square, ≥20000 giga ohms per square, ≥30000 giga ohms per square, ≥40000 giga ohms per square, or ≥50000 giga ohms per square, wherein the sheet resistance of the common hole injection layer, the common second semiconductor layer, the common third semiconductor layer and emission layer is measured together alone, wherein for measurement of the sheet resistance the emission layer is directly deposited on the common third semiconductor layer, and the common third semiconductor layer is directly deposited on the common second semiconductor layer, and the common second semiconductor layer is directly deposited on the common hole injection layer and the common hole injection layer is directly deposited on measurement electrodes preferably ITO electrodes.

According to another embodiment of the active-matrix OLED display, wherein the common hole injection layer, the common second semiconductor layer, the common third semiconductor layer, and the common emission layer may have together a sheet resistance selected from ≥100 giga ohms per square, ≥150 giga ohms per square, ≥200 giga ohms per square, ≥300 giga ohms per square, ≥400 giga ohms per square, ≥500 giga ohms per square, ≥1000 giga ohms per square, ≥2500 giga ohms per square, ≥5000 giga ohms per square, ≥10000 giga ohms per square, ≥20000 giga ohms per square, ≥30000 giga ohms per square, ≥40000 giga ohms per square, or ≥50000 giga ohms per square, wherein the sheet resistance of the common hole injection layer, the common second semiconductor layer, the common third semiconductor layer and the common emission layer are measured together alone.

According to another embodiment of the active-matrix OLED display, wherein the common hole injection layer, the common second semiconductor layer, the common third semiconductor layer, and the common emission layer may have together a sheet resistance selected from ≥100 giga ohms per square, ≥150 giga ohms per square, ≥200 giga ohms per square, ≥300 giga ohms per square, ≥400 giga ohms per square, ≥500 giga ohms per square, ≥1000 giga ohms per square, ≥2500 giga ohms per square, ≥5000 giga ohms per square, ≥10000 giga ohms per square, ≥20000 giga ohms per square, ≥30000 giga ohms per square, ≥40000 giga ohms per square, or ≥50000 giga ohms per square, wherein the sheet resistance of the common hole injection layer, the common second semiconductor layer, the common third semiconductor layer and the common emission layer are measured together alone, wherein for measurement of sheet resistance the common emission layer is directly deposited on the common third semiconductor layer, the common third semiconductor layer is directly deposited on the common second semiconductor layer, and the common second semiconductor layer is directly deposited on the common emission layer and the common hole injection layer is directly deposited on measurement electrodes preferably ITO electrodes.

According to another embodiment of the active-matrix OLED display, wherein the active-matrix OLED display comprises a plurality of OLED pixels, wherein each pixel itself comprises a stack of organic layers and each layer of the stack of organic layers can form a common semiconductor layer or a plurality of organic layers can form a plurality of semiconductor layers, wherein at least a first OLED pixel and a second OLED pixel comprising each an anode layer, wherein the anode layer of the first OLED pixel and the second OLED pixel are optional separated by a pixel definition layer, and wherein the at least first OLED pixel and the at least second OLED pixel comprising a common cathode layer and at least a stack of organic layers, comprising a plurality of semiconductor layers, and the plurality of semiconductor layers comprising at least two or more common semiconductor layers, wherein the at least two common semiconductor layer or the plurality of semiconductor layers of the stack of organic layers is arranged between the common cathode layer and the anode layer, wherein the anode layer is not a common layer, and wherein the at least two common semiconductor layers or the plurality of the common semiconductor layers comprising at least a first common semiconductor layer that is a common hole injection layer, and at least a common second semiconductor layer that is a common hole transport layer or an electron blocking layer and at least an emission layer, which is optional a common emission layer, and preferably the at least common second semiconductor layer is a common hole transport layer, wherein the common hole injection layer is at least partly arranged in direct contact to the anode layer and the at least common second semiconductor layer, preferably that is a common hole transport layer, is arranged between the emission layer and the common hole injection layer, wherein the emission layer is optional a common emission layer;

and wherein the common hole injection layer and the common hole transport layer have together a sheet resistance of ≥50 giga ohms per square.

According to another embodiment of the active-matrix OLED display, wherein the active-matrix OLED display comprises a plurality of OLED pixels, wherein each pixel itself comprises a stack of organic layers and each layer of the stack of organic layers can form a common semiconductor layer or a plurality of organic layers can form a plurality of semiconductor layers, wherein at least a first OLED pixel and a second OLED pixel comprising each an anode layer, wherein the anode layer of the first OLED pixel and the second OLED pixel are optional separated by a pixel definition layer, and wherein the at least first OLED pixel and the at least second OLED pixel comprising a common cathode layer and at least a stack of organic layers, comprising a plurality of semiconductor layers, and the plurality of semiconductor layers comprising at least two or more common semiconductor layers, wherein the at least two common semiconductor layer or the plurality of semiconductor layers of the stack of organic layers is arranged between the common cathode layer and the anode layer, wherein the anode layer is not a common layer, and wherein the at least two common semiconductor layers or the plurality of the common semiconductor layers comprising at least a first common semiconductor layer that is a common hole injection layer, and at least a common second semiconductor layer that is a common hole transport layer or an electron blocking layer and at least an emission layer, which is optional a common emission layer, and preferably the at least common second semiconductor layer is a common hole transport layer, wherein the common hole injection layer is at least partly arranged in direct contact to the anode layer and the at least common second semiconductor layer, preferably that is a common hole transport layer, is arranged between the emission layer and the common hole injection layer, wherein the emission layer is optional a common emission layer;

and wherein the common hole injection layer and the common hole transport layer have together a sheet resistance of ≥50 giga ohms per square, wherein the sheet resistance of the common hole injection layer and the common hole transport layer is measured together alone.

According to another embodiment of the active-matrix OLED display, wherein the active-matrix OLED display comprises a plurality of OLED pixels, wherein each pixel itself comprises a stack of organic layers and each layer of the stack of organic layers can form a common semiconductor layer or a plurality of organic layers can form a plurality of semiconductor layers, wherein at least a first OLED pixel and a second OLED pixel comprising each an anode layer, wherein the anode layer of the first OLED pixel and the second OLED pixel are optional separated by a pixel definition layer, and wherein the at least first OLED pixel and the at least second OLED pixel comprising a common cathode layer and at least a stack of organic layers, comprising a plurality of semiconductor layers, and the plurality of semiconductor layers comprising at least two or more common semiconductor layers, wherein the at least two common semiconductor layer or the plurality of semiconductor layers of the stack of organic layers is arranged between the common cathode layer and the anode layer, wherein the anode layer is not a common layer, and wherein the at least two common semiconductor layers or the plurality of the common semiconductor layers comprising at least a first common semiconductor layer that is a common hole injection layer, and at least a common second semiconductor layer that is a common hole transport layer or an electron blocking layer and at least an emission layer, which is optional a common emission layer, and preferably the at least common second semiconductor layer is a common hole transport layer, wherein the common hole injection layer is at least partly arranged in direct contact to the anode layer and the at least common second semiconductor layer, preferably that is a common hole transport layer, is arranged between the emission layer and the common hole injection layer, wherein the emission layer is optional a common emission layer;

and wherein the common hole injection layer and the common hole transport layer have together a sheet resistance of ≥50 giga ohms per square, wherein the sheet resistance of the common hole injection layer and the common hole transport layer is measured together alone, wherein for measurement of the sheet resistance the common hole transport layer is directly deposited on the common hole injection layer and the common hole injection layer is directly deposited on measurement electrodes preferably ITO electrodes.

According to another embodiment of the active-matrix OLED display, wherein the common hole injection layer and the common hole transport layer have together a sheet resistance selected from ≥100 giga ohms per square, ≥150 giga ohms per square, ≥200 giga ohms per square, ≥300 giga ohms per square, ≥400 giga ohms per square, ≥500 giga ohms per square, ≥1000 giga ohms per square, ≥2500 giga ohms per square, ≥5000 giga ohms per square, ≥10000 giga ohms per square, ≥20000 giga ohms per square, ≥30000 giga ohms per square, ≥40000 giga ohms per square, or ≥50000 giga ohms per square.

According to another embodiment of the active-matrix OLED display, wherein the common hole injection layer and the common hole transport layer have together a sheet resistance selected from ≥100 giga ohms per square, ≥150 giga ohms per square, ≥200 giga ohms per square, ≥300 giga ohms per square, ≥400 giga ohms per square, ≥500 giga ohms per square, ≥1000 giga ohms per square, ≥2500 giga ohms per square, ≥5000 giga ohms per square, ≥10000 giga ohms per square, ≥20000 giga ohms per square, ≥30000 giga ohms per square, ≥40000 giga ohms per square, or ≥50000 giga ohms per square, wherein the sheet resistance of the common hole injection layer and the common hole transport layer is measured together alone.

According to another embodiment of the active-matrix OLED display, wherein the common hole injection layer and the common hole transport layer have together a sheet resistance selected from ≥100 giga ohms per square, ≥150 giga ohms per square, ≥200 giga ohms per square, ≥300 giga ohms per square, ≥400 giga ohms per square, ≥500 giga ohms per square, ≥1000 giga ohms per square, ≥2500 giga ohms per square, ≥5000 giga ohms per square, ≥10000 giga ohms per square, ≥20000 giga ohms per square, ≥30000 giga ohms per square, ≥40000 giga ohms per square, or ≥50000 giga ohms per square, wherein the sheet resistance of the common hole injection layer and the common hole transport layer is measured together alone, wherein for measurement of the sheet resistance the common hole transport layer is directly deposited on the common hole injection layer and the common hole injection layer is directly deposited on measurement electrodes preferably ITO electrodes.

According to another embodiment of the active-matrix OLED display, wherein the common hole injection layer may contain a hole injection material and the common hole injection layer is selected from the group comprising an i-hole injection layer and/or hole injection doped layer, preferably the concentration of hole injection material, based on the weight of the hole injection material-doped hole injection layer, is ≥0.1 wt.-% and ≤40 wt.-%, preferably ≥0.5 wt.-% and ≤25 wt.-%, further preferred ≥1 wt.-% and ≤10 wt.-%, and more preferred ≥1 wt.-% and ≤5 wt.-%.

According to another embodiment of the active-matrix OLED display, wherein the common stack of organic layers may comprise in addition a common electron transport layer, preferably the common electron-transport layer is arranged between the emission layer and the common cathode layer.

According to another embodiment of the active-matrix OLED display, wherein the common stack of organic layers comprises in addition a common organic layer selected from the group comprising common electron injection layer, common hole blocking layer and/or electron transport layer, preferably the common electron injection layer is in direct contact with the common cathode layer.

According to another embodiment of the active-matrix OLED display, wherein the pixel definition layer is not positive charged and/or is not an anode or comprises an anode material, preferably the pixel definition layer comprises Si based compound, SiN, a non-positive charged oligomer and/or polymer material.

According to another embodiment of the active-matrix OLED display, wherein the common first semiconductor layer, preferably the common hole injection layer, may have a layer thickness ≥1 nm and ≤100 nm, preferably ≥2 nm and ≤50 nm, more preferably ≥3 nm and ≤40 nm, more preferably ≥4 nm and ≤30 nm, more preferably ≥5 nm and ≤20 nm, more preferably ≥6 nm and ≤15 nm, more preferably ≥8 nm and ≤10 nm.

According to another embodiment of the active-matrix OLED display, wherein the common second semiconductor layer, preferably the common hole transport layer, may have a layer thickness ≥5 nm and ≤250 nm, preferably ≥10 nm and ≤240 nm, more preferably ≥15 nm and ≤230 nm, more preferably ≥20 nm and ≤220 nm, more preferably ≥25 nm and ≤210 nm, more preferably ≥30 nm and ≤200 nm, more preferably ≥35 nm and ≤190 nm, more preferably ≥40 nm and ≤180 nm, and preferably ≥50 nm and ≤150 nm.

According to another embodiment of the active-matrix OLED display, wherein the common second semiconductor layer, preferably the common hole transport layer, may comprise a compound having energies of their highest occupied molecular orbitals, expressed in the absolute scale referring to vacuum energy level being zero, calculated using the hybrid functional B3LYP with a Gaussian 6-31G* basis set as implemented in the program package TURBOMOLE V6.5, in the range from <4.27 eV to ≥6.0 eV, <4.3 eV to ≥5.5 eV, preferably <−4.5 eV to ≥−5.4 eV, more preferably from <−4.6 eV to ≥5.3 eV.

According to another embodiment of the active-matrix OLED display, wherein the electron blocking layer may comprise a compound having energies of their highest occupied molecular orbitals, expressed in the absolute scale referring to vacuum energy level being zero, calculated using the hybrid functional B3LYP with a Gaussian 6-31G* basis set as implemented in the program package TURBOMOLE V6.5, in the range from in the range from <4.7 eV to ≥6.0 eV, <4.8 eV to ≥5.5 eV, preferably <−4.9 eV to ≥−5.4 eV, more preferably from <−5.0 eV to ≥5.3 eV.

According to another embodiment of the active-matrix OLED display, wherein the electron blocking layer (EBL) may have a layer thickness ≥1 nm and ≤20 nm, preferably ≥2 nm and ≤18 nm, more preferably ≥3 nm and ≤16 nm, more preferably ≥4 nm and ≤14 nm, more preferably ≥5 nm and ≤12 nm, more preferably ≥6 nm and ≤11 nm, more preferably ≥7 nm and ≤10 nm.

The electron blocking layer (EBL) is usually 5 nm to 10 nm thick and has low mobility. A high thickness >20 nm would result in significant voltage penalty. Layers thinner than 5 nm may not block sufficiently and are less preferred.

According to another embodiment of the active-matrix OLED display, wherein at least one anode layer may comprise a first anode sub-layer and a second anode sub-layer, wherein the first anode sub-layer comprises a first metal having a work function in the range of ≥4 and ≤6 eV, and the second anode sub-layer comprises a transparent conductive oxide; and the second anode sub-layer is arranged closer to the common hole injection layer.

According to another embodiment of the active-matrix OLED display, wherein the active-matrix OLED display comprises a driving circuit configured to separately driving the pixels of the plurality of organic-light emitting diode pixels.

According to one embodiment of the active-matrix OLED display, wherein the common first semiconductor layer that is a common hole injection layer may comprise a compound having a highest occupied level $E_{first}$ (HOMO), and the common second semiconductor layer, which is preferably a common hole transport layer, may comprise a compound having a highest occupied energy level $E_{second}$ (HOMO), wherein $E_{first}$ (HOMO)≥$E_{second}$ (HOMO). According to one embodiment the compound in the common second semiconductor layer, which is preferably a common hole transport layer, is not a hole injection material.

According to one embodiment of the active-matrix OLED display, wherein the common third semiconductor layer, which can be a common electron blocking layer, may comprise a compound having a lowest unoccupied energy level $E_{third}$(LUMO), and the emission layer may comprise a compound having a lowest unoccupied energy level $E_{EML}$ (LUMO), wherein $E_{third}$(LUMO)≥$E_{EML}$(LUMO), wherein preferably, the compound in the common third semiconductor layer and the compound in the emission layer are not hole injection materials, such as a redox dopant.

According to one embodiment of the active-matrix OLED display, wherein the common first semiconductor layer that is a common hole injection layer may comprise a hole injection material having a highest occupied level $E_{first}$ (HOMO), the common second semiconductor layer, which can be a common hole transport layer, may comprise a hole transport compound having a highest occupied energy level $E_{second}$ (HOMO), the common third semiconductor layer, which can be a common electron blocking layer, may comprise an electron blocking compound having a highest occupied energy level $E_{third}$ (HOMO), wherein $E_{first}$ (HOMO)≥$E_{second}$ (HOMO)≥$E_{third}$ (HOMO), wherein preferably, the compound in the common second semiconductor layer, and the compound in the common third semiconductor layer are not a hole injection material.

According to one embodiment of the active-matrix OLED display, wherein the common first semiconductor layer that is a common hole injection may comprise a hole injection material having a highest occupied level $E_{first}$ (HOMO), the common second semiconductor, which can be a common hole transport layer, may comprise a hole transport compound, having a highest occupied energy level $E_{second}$ (HOMO), the common third semiconductor layer, which can be a common electron blocking layer, may comprise an electron blocking compound, having a highest occupied energy level $E_{third}$ (HOMO), wherein $E_{first}$ (HOMO)=$E_{second}$ (HOMO)>$E_{third}$ (HOMO), wherein preferably, the compound in the common second semiconductor layer, and the compound in the common third semiconductor layer are not a hole injection material.

According to one embodiment of the active-matrix OLED display, wherein the common second semiconductor layer, which can be a common hole transport layer, may comprise a hole transport compound, having a highest occupied level E second (HOMO) and a lowest unoccupied energy level $E_{second}$(LUMO), the common third semiconductor layer, which can be a common electron blocking layer, may comprise an electron blocking compound, having a highest occupied energy level $E_{third}$(HOMO) and a lowest unoccupied energy level $E_{third}$(LUMO), and the emission layer may comprise a compound having a having a highest occupied level $E_{EML}$(HOMO) and) and a lowest unoccupied energy level $E_{EML}$(LUMO), wherein $$E_{third(HOMO)} - E_{EML(HOMO)} < 0.3\text{ eV}$$

$$E_{third(LUMO)} > E_{EML(LUMO)}$$

$$E_{second(HOMO)} > E_{third(HOMO)},\text{ if } E_{second(HOMO)} > E_{EML(HOMO)}$$

and $E_{second(LUMO)}$>$E_{EML(LUMO)}$, wherein preferably, the compound in the common second semiconductor layer, the compound in the common third semiconductor layer, and the compound in the emission layer are not hole injection materials.

Hole Injection Material

According to another embodiment of the active-matrix OLED display, wherein the common hole injection layer comprises a hole injection material that is a metal compound, wherein the hole injection material can be a metal complex, a covalent metal compound or an ionic compound. According to one embodiment, wherein the valency of the metal M can be 0, 1, 2, 3 or 4, preferably 1, 2, 3 or 4. According to one embodiment, wherein the metal M has an atomic mass of ≥22 Da, alternatively ≥24 Da.

According to one embodiment, wherein hole injection material comprises at least one metal, wherein the metal M may be selected from a metal ion wherein the corresponding metal has an electronegativity value according to Allen of less than 2.4, preferably less than 2, more preferred less than 1.9. Thereby, particularly good performance in organic electronic devices may be achievable.

The term "electronegativity according to Allen" especially refers to Allen, Leland C. (1989). "Electronegativity is the average one-electron energy of the valence-shell electrons in ground-state free atoms". Journal of the American Chemical Society. 111 (25): 9003-9014.

According to one embodiment the valency n of M is 1 or 2.

According to one embodiment, wherein the metal M is selected from a metal ion wherein the corresponding metal has an electronegativity value according to Allen of less than 2.4, preferably less than 2, more preferred less than 1.9, and the valency of the metal M is 1 or 2.

According to one embodiment, wherein the metal M is selected from an alkali, alkaline earth, rare earth or transition metal, alternatively M is selected from alkali, alkaline earth, or a period 4 or 5 transition metal.

According to one embodiment, wherein the metal M is selected from a metal ion wherein the corresponding metal has an electronegativity value according to Allen of less than 2.4, preferably less than 2, more preferred less than 1.9 and M is selected from alkali, alkaline earth, rare earth or a period 4 or 5 transition metal and the metal M has an atomic mass of ≥22 Da, alternatively ≥24 Da.

According to one embodiment, wherein the hole injection material is a metal compound, wherein the metal compound is selected from a compound that comprises at least one metal cation and at least one ligand or comprises at least one metal cation, at least one ligand and in addition at least one carbon atom, two carbon atoms, three carbon atoms or four carbon atoms.

According to one embodiment, wherein the metal M is selected from the group comprising Li, Na, K, Cs, Mg, Ca, Sr, Ba, Al, In, Bi, Sc, Ti, Zr, Hf, V, Cr, Mo, W, Mn, Re, Fe, Ru, Co Rh, Ir, Ni, Pd, Pt, Cu, Ag, Au, Zn, La, Ce, Eu, or Yb, preferably the metal is selected from the group comprising Al, Bi, Cr, Mn, Fe, Co, Ni, Cu, Zn, Mo, Ag, Re, Au or Ce, and more preferred the metal is selected from the group comprising Al, Mn, Fe, Cu, Mo, Ag, Au or Ce.

According to one embodiment, wherein the metal M is selected from an alkaline earth metal, transition metal or rare earth metal, preferably Cu(II), Ag(I), Zn(II), Fe(II), Fe(III), Ce(IV) and more preferred Fe(II).

According to one embodiment, wherein the metal M is selected from Li, Na, K, Cs, Mg, Mn, Cu, Zn, Ag and Mo; preferably M is selected from Na, K, Cs, Mg, Mn, Cu, Zn and Ag; also preferred M is selected from Na, K, Mg, Mn, Cu, Zn and Ag, wherein if the metal M is Cu, n is 2.

The hole injection material is non-emissive. In the context of the present specification the term "essentially non-emissive" or "non-emissive" means that the contribution of the hole injection material to the visible emission spectrum from an organic electronic device, preferably OLED or display device, is less than 10%, preferably less than 5% relative to the visible emission spectrum. The visible emission spectrum is an emission spectrum with a wavelength of about ≥380 nm to about ≤780 nm.

Semiconductor Layer the at least first common semiconductor layer, preferably a common HIL and the at least second common semiconductor layer, preferably a common HTL, are non-emissive.

According to one embodiment of the invention, at least one common semiconductor layer, preferably the first common layer, preferably a common HIL, may be arranged and/or provided adjacent to the anode, wherein the anode is not formed as a common layer.

According to one embodiment of the invention, at least one common semiconductor layer is in direct contact with the anode, wherein the anode is not formed as a common layer. Every individual pixel may have its own anode that may not touch anodes of other individual pixels.

According to one embodiment of the invention, wherein the at least one common semiconductor layer is a common hole-injection layer.

According to one embodiment of the invention, wherein the at least one common semiconductor layers is a common hole-injection layer, which consists of at least one hole injection material or comprises at least one hole injection material.

In case the at least one common semiconductor layer is a common hole-injection layer and/or is arranged and/or provided adjacent to the anode, wherein the anode is not formed as a common layer, then it can be preferred that this layer consists essentially of at least one hole injection material.

According to one preferred embodiment the hole injection material is only directed to compounds such metal compounds, capable of reducing the voltage at a certain current density if present. That means the hole injection material comprising metal compounds are able to facilitate the injection of holes.

Matrix Compound

According to one embodiment, wherein a semiconductor layer may comprise at least one matrix compound, wherein the at least one matrix compound is a non-polymeric compound, preferably the matrix compound is a covalent matrix compound or a substantially covalent matrix compound.

Preferably at least one common semiconductor layer comprising a covalent matrix compound or substantially covalent matrix compound.

The hole injection layer may comprise in addition to the hole injection material at least one matrix covalent matrix compound and/or or at least one substantially covalent matrix compound.

Preferred examples of covalent matrix compounds are organic compounds, consisting predominantly from covalently bound C, H, O, N, S, which may optionally comprise also covalently bound B, P, As, Se. Organometallic compounds comprising covalent bonds carbon-metal, metal complexes comprising organic ligands and metal salts of organic acids are further examples of organic compounds that may serve as organic covalent matrix compound or substantially covalent matrix compounds.

In one embodiment, wherein the covalent matrix compound or substantially covalent matrix compound lacks metal atoms and majority of its skeletal atoms is selected from C, O, S, N. Alternatively, the covalent matrix compound or substantially covalent matrix compound lacks metal atoms and majority of its skeletal atoms is selected from C and N.

According to one embodiment, the substantially covalent matrix compound may have a molecular weight Mw of ≥400 and ≤2000 g/mol, preferably a molecular weight Mw of ≥450 and ≤1500 g/mol, further preferred a molecular weight Mw of ≥500 and ≤1000 g/mol, in addition preferred a molecular weight Mw of ≥550 and ≤900 g/mol, also preferred a molecular weight Mw of ≥600 and ≤800 g/mol.

In one embodiment, wherein the HOMO level of the covalent matrix compound or substantially covalent matrix compound may be more negative than the HOMO level of N2,N2,N2',N2',N7,N7,N7',N7'-octakis(4-methoxyphenyl)-9,9'-spirobi[fluorene]-2,2',7,7'-tetraamine (CAS 207739-72-8) when determined under the same conditions.

In one embodiment, wherein the calculated HOMO level of the covalent matrix compound or substantially covalent matrix compound may be more negative than −4.27 eV, preferably more negative than −4.3 eV, alternatively more negative than −4.5 eV, alternatively more negative than −4.6 eV, alternatively more negative than −4.65 eV.

According to another aspect, the semiconductor layer further comprises a covalent matrix compound or substantially covalent matrix compound with an oxidation potential more positive than −0.2 V and more negative than 1.22 V, when measured by cyclic voltammetry in dichloromethane vs. Fc/Fc+, preferably more positive than −0.18 V and more negative than 1.12 V. Under these conditions the oxidation potential of spiro-MeO-TAD (CAS 207739-72-8) is −0.07 V.

In one embodiment, wherein the HOMO level of the covalent matrix compound or substantially covalent matrix compound may be more negative than the HOMO level of N2,N2,N2',N2',N7,N7,N7',N7'-octakis(4-methoxyphenyl)-9,9'-spirobi[fluorene]-2,2',7,7'-tetraamine (CAS 207739-72-8) and more positive than the HOMO level of N4,N4'''-di(naphthalen-1-yl)-N4,N4'''-diphenyl-[1,1':4',1'':4'',1'''-quaterphenyl]-4,4'''-diamine when determined under the same conditions.

In one embodiment, wherein the covalent matrix compound or substantially covalent matrix compound may be free of alkoxy groups.

In one embodiment, the HOMO level of the covalent matrix compound or substantially covalent matrix compound expressed in the absolute scale referring to vacuum energy level being zero, when calculated using TURBOMOLE V6.5 (TURBOMOLE GmbH, Litzenhardtstrasse 19, 76135 Karlsruhe, Germany) by applying the hybrid functional B3LYP with a 6-31G* basis set in the gas phase, may be selected in the range of <−4.27 eV and ≥−5.3 eV, alternatively in the range of <−4.3 eV and ≥−5.3 eV, alternatively in the range of <−4.5 eV and ≥−5.3 eV, alternatively in the range of <−4.6 eV and ≥−5.3 eV.

In one embodiment, wherein the calculated HOMO level of the covalent matrix compound or substantially covalent matrix compound expressed in the absolute scale referring to vacuum energy level being zero, when calculated using TURBOMOLE V6.5 (TURBOMOLE GmbH, Litzenhardtstrasse 19, 76135 Karlsruhe, Germany) by applying the hybrid functional B3LYP with a 6-31G* basis set in the gas phase may be selected in the range of <−4.27 eV and >−4.84 eV, alternatively in the range of <−4.3 eV and >−4.84 eV, alternatively in the range of <−4.5 eV and >−4.84 eV, alternatively in the range of <−4.5 eV and >−4.84 eV, alternatively in the range of <−4.6 eV and >−4.84 eV.

In one embodiment, wherein the calculated HOMO level of the covalent matrix compound or substantially covalent matrix compound expressed in the absolute scale referring to vacuum energy level being zero, when calculated using TURBOMOLE V6.5 (TURBOMOLE GmbH, Litzenhardtstrasse 19, 76135 Karlsruhe, Germany) by applying the hybrid functional B3LYP with a 6-31G* basis set in the gas phase may be selected in the range of <−4.27 eV and >−4.8 eV, alternatively in the range of <−4.3 eV and >−4.8 eV, alternatively in the range of <−4.5 eV and >−4.8 eV, alternatively in the range of <−4.5 eV and >−4.8 eV, alternatively in the range of <−4.6 eV and >−4.8 eV, alternatively in the range of <−4.65 eV and >−4.8 eV.

Preferably, the covalent matrix compound or substantially covalent matrix compound comprises at least one arylamine compound, alternatively a diarylamine compound, alternatively a triarylamine compound. According to an embodiment of the organic electronic device, wherein the common hole injection layer and/or common hole transport layer may comprise a diarylamine compound, alternatively a triarylamine compound.

According to an embodiment of the organic electronic device, wherein the common hole injection layer and/or common hole transport layer may comprise a compound of formula (2) or formula (3):

(2)

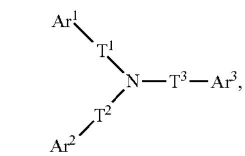

(3)

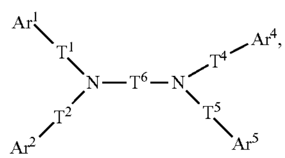

wherein $T^1$, $T^2$, $T^3$, $T^4$ and $T^5$ are independently selected from a single bond, phenylene, biphenylene, terphenylene or naphthenylene, preferably a single bond or phenylene;

$T^6$ is selected from substituted or unsubstituted phenylene, biphenylene, terphenylene or naphthenylene, wherein the substituent on phenylene is selected from $C_6$ to $C_{18}$ aryl, $C_3$ to $C_{18}$ heteroaryl, phenyl, biphenyl, carbazole, phenyl carbazole, preferably biphenyl or 9-phenyl carbazole;

$Ar^1$, $Ar^2$, $Ar^3$, $Ar^4$ and $Ar^5$ are independently selected from substituted or unsubstituted $C_6$ to $C_{20}$ aryl, or substituted or unsubstituted $C_3$ to $C_{20}$ heteroarylene, substituted or unsubstituted biphenylene, substituted or unsubstituted fluorene, substituted 9-fluorene, substituted 9,9-fluorene, substituted or unsubstituted naphthalene, substituted or unsubstituted anthracene, substituted or unsubstituted phenanthrene, substituted or unsubstituted pyrene, substituted or unsubstituted perylene, substituted or unsubstituted triphenylene, substituted or unsubstituted tetracene, substituted or unsubstituted tetraphene, substituted or unsubstituted dibenzofurane, substituted or unsubstituted dibenzothiophene, substituted or unsubstituted xanthene, substituted or unsubstituted carbazole, substituted 9-phenylcarbazole, substituted or unsubstituted azepine, substituted or unsubstituted dibenzo[b,f]azepine, substituted or unsubstituted 9,9'-spirobi[fluorene], substituted or unsubstituted 9,9'-spirobi[fluorene] with at least one fused aromatic ring, substituted or unsubstituted spiro[fluorene-9,9'-xanthene], a substituted or unsubstituted aromatic fused ring system comprising two aromatic 6-member rings and two aromatic 5-member rings, wherein at least one 5-member ring comprises a hetero atom, a substituted or unsubstituted aromatic fused ring system comprising two aromatic 6-member rings and two aromatic 5-member rings, wherein at least one 5-member ring comprises an O atom, or a substituted or unsubstituted aromatic fused ring system comprising at least three substituted or unsubstituted aromatic rings selected from the group comprising substituted or unsubstituted non-hetero, substituted or unsubstituted hetero 5-member rings, substituted or unsubstituted 6-member rings and/or substituted or unsubstituted 7-member rings, substituted or unsubstituted fluorene, substituted or unsubstituted fluorene with an annelated substituted or unsubstituted hetero or non-hetero ring system comprising 2 to 6 substituted or unsubstituted 5-, 6- or 7-member rings, or a fused ring system comprising 2 to 6 substituted or unsubstituted 5- to 7-member rings and the rings are selected from the group comprising (i) unsaturated 5- to 7-member ring of a heterocycle, (ii) 5- to 6-member of an aromatic heterocycle, (iii) unsaturated 5- to 7-member ring of a non-heterocycle, (iv) 6-member ring of an aromatic non-heterocycle;

wherein the substituents of $Ar^1$, $Ar^2$, $Ar^3$, $Ar^4$ and $Ar^5$ are selected the same or different from the group comprising H, D, F, $C({=}O)R^2$, CN, $Si(R^2)_3$, $P({=}O)(R^2)_2$, $OR^2$, $S({=}O)R^2$, $S({=}O)_2R^2$, substituted or unsubstituted straight-chain alkyl having 1 to 20 carbon atoms, substituted or unsubstituted branched alkyl having 1 to 20 carbon atoms, substituted or unsubstituted cyclic alkyl having 3 to 20 carbon atoms, substituted or unsubstituted alkenyl or alkynyl groups having 2 to 20 carbon atoms, substituted or unsubstituted alkoxy groups having 1 to 20 carbon atoms, substituted or unsubstituted aromatic ring systems having 6 to 40 aromatic ring atoms, and substituted or unsubstituted heteroaromatic ring systems having 5 to 40 aromatic ring atoms, unsubstituted $C_6$ to $C_{18}$ aryl, unsubstituted $C_3$ to $C_{18}$ heteroaryl, a fused ring system comprising 2 to 6 unsubstituted 5- to 7-member rings and the rings are selected from the group comprising unsaturated 5- to 7-member ring of a heterocycle, 5- to 6-member of an aromatic heterocycle, unsaturated 5- to 7-member ring of a non-heterocycle, and 6-member ring of an aromatic non-heterocycle, wherein $R^2$ is selected from H, D, straight-chain alkyl having 1 to 6 carbon atoms, branched alkyl having 1 to 6 carbon atoms, cyclic alkyl having 3 to 6 carbon atoms, alkenyl or alkynyl groups having 2 to 6 carbon atoms, $C_6$ to $C_{18}$ aryl or $C_3$ to $C_{18}$ heteroaryl.

Preferably, if not otherwise defined the substituents of $Ar^1$, $Ar^2$, $Ar^3$, $Ar^4$ and $Ar^5$ are selected the same or different from the group comprising H, straight-chain alkyl having 1 to 6 carbon atoms, branched alkyl having 1 to 6 carbon atoms, cyclic alkyl having 3 to 6 carbon atoms, alkenyl or alkynyl groups having 2 to 6 carbon atoms, alkoxy groups having 1 to 6 carbon atoms, $C_6$ to $C_{18}$ aryl, $C_3$ to $C_{18}$ heteroaryl, a fused ring system comprising 2 to 4 unsubstituted 5- to 7-member rings and the rings are selected from the group comprising unsaturated 5- to 7-member ring of a heterocycle, 5- to 6-member of an aromatic heterocycle, unsaturated 5- to 7-member ring of a non-heterocycle, and 6-member ring of an aromatic non-heterocycle; more preferred the substituents are selected the same or different from the group consisting of H, straight-chain alkyl having 1 to 4 carbon atoms, branched alkyl having 1 to 4 carbon atoms, cyclic alkyl having 3 to 4 carbon atoms and/or phenyl.

Thereby, the compound of formula (2) or (3) may have a rate onset temperature suitable for mass production.

According to an embodiment of the organic electronic device, wherein covalent matrix compound or substantially covalent matrix compound, preferably the matrix compound of the common hole injection layer or common hole transport layer may comprise a compound of formula (2) or formula (3):

(2)

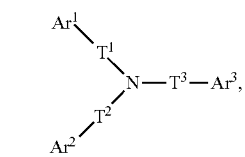

(3)

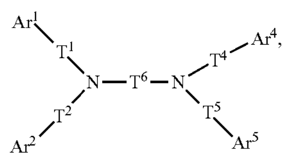

wherein $T^1$, $T^2$, $T^3$, $T^4$ and $T^5$ may be independently selected from a single bond, phenylene, biphenylene, terphenylene or naphthenylene, preferably a single bond or phenylene;

$T^6$ is phenylene, biphenylene, terphenylene or naphthenylene;

$Ar^1$, $Ar^2$, $Ar^3$, $Ar^4$ and $Ar^5$ may be independently selected from unsubstituted $C_6$ to $C_{20}$ aryl, or unsubstituted $C_3$ to $C_{20}$ heteroarylene, unsubstituted biphenylene, unsubstituted fluorene, substituted 9-fluorene, substituted 9,9-fluorene, unsubstituted naphthalene, unsubstituted anthracene, unsubstituted phenanthrene, unsubstituted pyrene, unsubstituted perylene, unsubstituted triphenylene, unsubstituted tetracene, unsubstituted tetraphene, unsubstituted dibenzofurane, unsubstituted dibenzothiophene, unsubstituted xanthene, unsubstituted carbazole, substituted 9-phenylcarbazole, unsubstituted azepine, unsubstituted dibenzo[b,f] azepine, unsubstituted 9,9'-spirobi[fluorene], unsubstituted spiro[fluorene-9,9'-xanthene], or a unsubstituted aromatic fused ring system comprising at least three unsubstituted aromatic rings selected from the group comprising unsubstituted non-hetero, unsubstituted hetero 5-member rings, unsubstituted 6-member rings and/or unsubstituted 7-member rings, unsubstituted fluorene, or a fused ring system comprising 2 to 6 unsubstituted 5- to 7-member rings and the rings are selected from the group comprising (i) unsaturated 5- to 7-member ring of a heterocycle, (2) 5- to 6-member of an aromatic heterocycle, (3) unsaturated 5- to 7-member ring of a non-heterocycle, and (iv) 6-member ring of an aromatic non-heterocycle.

According to an embodiment of the organic electronic device, wherein covalent matrix compound or substantially covalent matrix compound, preferably of the covalent matrix compound or substantially covalent matrix compound of common hole injection layer or common hole transport layer may comprise a compound of formula (2) or formula (3):

(2)

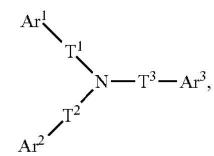

(3)

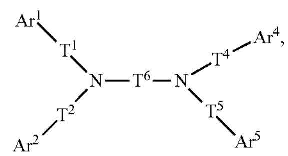

wherein $T^1$, $T^2$, $T^3$, $T^4$ and $T^5$ may be independently selected from a single bond, phenylene, biphenylene, terphenylene or naphthenylene, preferably a single bond or phenylene;

$T^6$ is phenylene, biphenylene, terphenylene or naphthenylene;

$Ar^1$, $Ar^2$, $Ar^3$, $Ar^4$ and $Ar^5$ may be independently selected from unsubstituted $C_6$ to $C_{20}$ aryl, or unsubstituted $C_3$ to $C_{20}$ heteroarylene, unsubstituted biphenylene, unsubstituted fluorene, substituted 9-fluorene, substituted 9,9-fluorene, unsubstituted naphthalene, unsubstituted anthracene, unsubstituted phenanthrene, unsubstituted pyrene, unsubstituted perylene, unsubstituted triphenylene, unsubstituted tetracene, unsubstituted tetraphene, unsubstituted dibenzofurane, unsubstituted dibenzothiophene, unsubstituted xanthene, unsubstituted carbazole, substituted 9-phenylcarbazole, unsubstituted azepine, unsubstituted dibenzo[b,f] azepine, unsubstituted 9,9'-spirobi[fluorene], unsubstituted spiro[fluorene-9,9'-xanthene].

Thereby, the compound of formula (2) or (3) may have a rate onset temperature suitable for mass production.

According to an embodiment wherein $T^1$, $T^2$, $T^3$, $T^4$ and $T^5$ may be independently selected from a single bond, phenylene, biphenylene or terphenylene. According to an embodiment wherein $T^1$, $T^2$, $T^3$, $T^4$ and $T^5$ may be independently selected from phenylene, biphenylene or terphenylene and one of $T^1$, $T^2$, $T^3$, $T^4$ and $T^5$ are a single bond. According to an embodiment wherein $T^1$, $T^2$, $T^3$, $T^4$ and $T^5$ may be independently selected from phenylene or biphenylene and one of $T^1$, $T^2$, $T^3$, $T^4$ and $T^5$ are a single bond. According to an embodiment wherein $T^1$, $T^2$, $T^3$, $T^4$ and $T^5$ may be independently selected from phenylene or biphenylene and two of $T^1$, $T^2$, $T^3$, $T^4$ and $T^5$ are a single bond.

According to an embodiment wherein $T^1$, $T^2$, $T^3$, $T^4$ and $T^5$, or $T^1$, $T^2$ and $T^3$ may be independently selected from phenylene and one of $T^1$, $T^2$, $T^3$, $T^4$ and $T^5$, or $T^1$, $T^2$ and $T^3$ are a single bond. According to an embodiment wherein $T^1$, $T^2$, $T^3$, $T^4$ and $T^5$, or $T^1$, $T^2$ and $T^3$ may be independently selected from phenylene and two of $T^1$, $T^2$, $T^3$, $T^4$ and $T^5$, or $T^1$, $T^2$ and $T^3$ are a single bond.

According to an embodiment wherein $T^6$ may be phenylene, biphenylene, terphenylene. According to an embodiment wherein $T^6$ may be phenylene. According to an embodiment wherein $T^6$ may be biphenylene. According to an embodiment wherein $T^6$ may be terphenylene.

According to an embodiment wherein $Ar^1$, $Ar^2$, $Ar^3$, $Ar^4$ and $Ar^5$ may be independently selected from D1 to D16:

(D1)

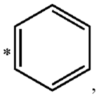

(D2)

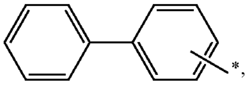

(D3)

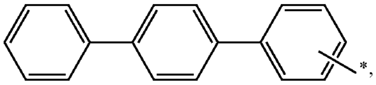

(D4)

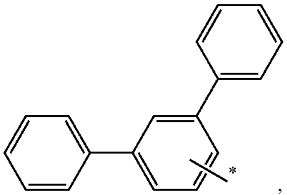

(D5)

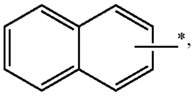

(D6)

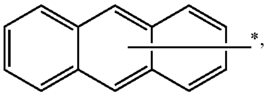

(D7)

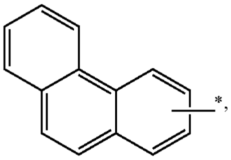

(D8)

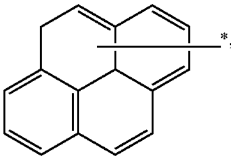

-continued (D9)

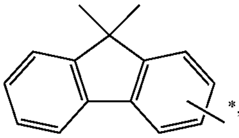

(D10)

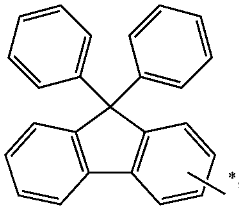

(D11)

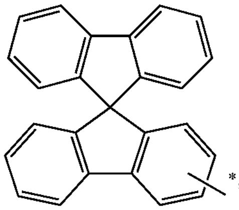

(D12)

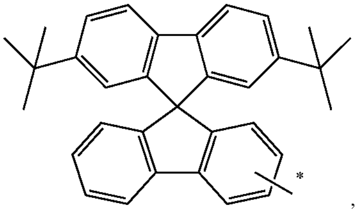

(D13)

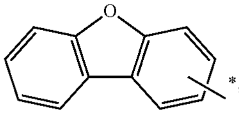

(D14)

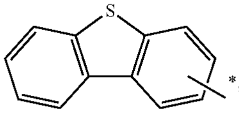

(D15)

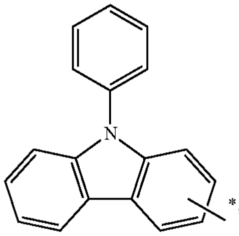

(D16)

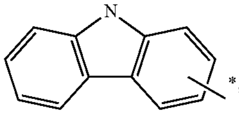

wherein the asterix "*" denotes the binding position.

According to an embodiment, wherein $Ar^1$, $Ar^2$, $Ar^3$, $Ar^4$ and $Ar^5$ may be independently selected from D1 to D15; alternatively selected from D1 to D10 and D13 to D15.

According to an embodiment, wherein $Ar^1$, $Ar^2$, $Ar^3$, $Ar^4$ and $Ar^5$ may be independently selected from the group consisting of D1, D2, D5, D7, D9, D10, D13 to D16.

The rate onset temperature may be in a range particularly suited to mass production, when $Ar^1$, $Ar^2$, $Ar^3$, $Ar^4$ and $Ar^5$ are selected in this range.

The "covalent matrix compound of formula (2) or formula (3)" may be used for a common hole injection layer and/or may be used as matrix compound for a common hole transport compound.

According to one embodiment the covalent matrix compound of formula (2) or formula (3) may comprise at least ≥1 to ≤6 substituted or unsubstituted aromatic fused ring systems comprising heteroaromatic rings.

According to one embodiment the covalent matrix compound of formula (2) or formula (3) may comprise at least ≥1 to ≤6 substituted or unsubstituted aromatic fused ring systems comprising heteroaromatic rings and at least ≥1 to ≤3 substituted or unsubstituted unsaturated 5- to 7-member ring of a heterocycle, preferably ≥2 to ≤5 substituted or unsubstituted aromatic fused ring systems comprising heteroaromatic rings.

According to one embodiment the covalent matrix compound of formula (2) or formula (3) may comprise at least ≥1 to ≤6 substituted or unsubstituted aromatic fused ring systems comprising heteroaromatic rings and at least ≥1 to ≤3 substituted or unsubstituted unsaturated 5- to 7-member ring of a heterocycle, preferably ≥2 to ≤5 substituted or unsubstituted aromatic fused ring systems comprising heteroaromatic rings, and at least ≥1 to ≤3 substituted or unsubstituted unsaturated 5- to 7-member ring of a heterocycle, further preferred 3 or 4 substituted or unsubstituted aromatic fused ring systems comprising heteroaromatic rings and optional at least ≥1 to ≤3 substituted or unsubstituted unsaturated 5- to 7-member ring of a heterocycle, and additional preferred wherein the aromatic fused ring systems comprising heteroaromatic rings are unsubstituted and optional at least ≥1 to ≤3 unsubstituted unsaturated 5- to 7-member ring of a heterocycle.

According to one embodiment the covalent matrix compound of formula (2) or formula (3) may comprise at least ≥1 to ≤6 substituted or unsubstituted aromatic fused ring systems, preferably ≥2 to ≤5 substituted or unsubstituted aromatic fused ring systems, and further preferred 3 or 4 substituted or unsubstituted aromatic fused ring systems.

According to one embodiment the covalent matrix compound of formula (2) or formula (3) may comprise at least ≥1 to ≤6 substituted or unsubstituted aromatic fused ring systems, preferably ≥2 to ≤5 substituted or unsubstituted aromatic fused ring systems, and further preferred 3 or 4 substituted or unsubstituted aromatic fused ring systems, which comprises substituted or unsubstituted heteroaromatic rings.

According to one embodiment the covalent matrix compound of formula (2) or formula (3) may comprise at least ≥1 to ≤3 or 2 substituted or unsubstituted unsaturated 5- to 7-member ring of a heterocycle.

According to one embodiment the covalent matrix compound of formula (2) or formula (3) may comprise at least ≥1 to ≤3 or 2 substituted or unsubstituted unsaturated 7-member ring of a heterocycle.

According to one embodiment substituted or unsubstituted aromatic fused ring systems of the covalent matrix compound or substantially covalent matrix compound of formula (2) or formula (3) may comprise at least ≥1 to ≤3 or 2 substituted or unsubstituted unsaturated 5- to 7-member ring of a heterocycle.

According to one embodiment the substituted or unsubstituted aromatic fused ring systems of the covalent matrix compound or substantially covalent matrix compound of formula (2) or formula (3) may comprise at least ≥1 to ≤3 or 2 substituted or unsubstituted unsaturated 7-member ring of a heterocycle.

According to one embodiment the covalent matrix compound of formula (2) or formula (3) may comprise at least ≥1 to ≤6 substituted or unsubstituted aromatic fused ring systems, preferably ≥2 to ≤5 substituted or unsubstituted aromatic fused ring systems, and further preferred 3 or 4 substituted or unsubstituted aromatic fused ring systems, and wherein the aromatic fused ring system comprises substituted or unsubstituted unsaturated 5- to 7-member ring of a heterocycle.

According to one embodiment the covalent matrix compound of formula (2) or formula (3) may comprise at least ≥1 to ≤6 substituted or unsubstituted aromatic fused ring systems, preferably ≥2 to ≤5 substituted or unsubstituted aromatic fused ring systems, and further preferred 3 or 4 substituted or unsubstituted aromatic fused ring systems, which comprises substituted or unsubstituted heteroaromatic rings, and wherein the aromatic fused ring system comprises substituted or unsubstituted unsaturated 5- to 7-member ring of a heterocycle.

According to one embodiment the covalent matrix compound of formula (2) or formula (3) may comprise at least ≥1 to ≤6 substituted or unsubstituted aromatic fused ring systems, preferably ≥2 to ≤5 substituted or unsubstituted aromatic fused ring systems, and further preferred 3 or 4 substituted or unsubstituted aromatic fused ring systems, and wherein the aromatic fused ring system comprises at least ≥1 to ≤3 or 2 substituted or unsubstituted unsaturated 5- to 7-member ring of a heterocycle.

According to one embodiment the covalent matrix compound of formula (2) or formula (3) may comprise at least ≥1 to ≤6 substituted or unsubstituted aromatic fused ring systems, preferably ≥2 to ≤5 substituted or unsubstituted aromatic fused ring systems, and further preferred 3 or 4 substituted or unsubstituted aromatic fused ring systems, which comprises substituted or unsubstituted heteroaromatic rings, and wherein the aromatic fused ring system comprises at least ≥1 to ≤3 or 2 substituted or unsubstituted unsaturated 5- to 7-member ring of a heterocycle.

According to one embodiment the covalent matrix compound of formula (2) or formula (3) may comprise:

- a substituted or unsubstituted aromatic fused ring system with at least ≥2 to ≤6, preferably ≥3 to ≤5, or 4 fused aromatic rings selected from the group comprising substituted or unsubstituted non-hetero aromatic rings, substituted or unsubstituted hetero 5-member rings, substituted or unsubstituted 6-member rings and/or substituted or unsubstituted unsaturated 5- to 7-member ring of a heterocycle; or
- an unsubstituted aromatic fused ring system with at least ≥2 to ≤6, preferably ≥3 to ≤5, or 4 fused aromatic rings selected from the group comprising unsubstituted non-hetero aromatic rings, unsubstituted hetero 5-member rings, unsubstituted 6-member rings and/or unsubstituted unsaturated 5- to 7-member ring of a heterocycle.

It should be noted here that the wording "aromatic fused ring system" may include at least one aromatic ring and at least one substituted or unsubstituted unsaturated 5- to 7-member ring.

It should be noted here that the substituted or unsubstituted unsaturated 5- to 7-member ring may not be an aromatic ring.

According to one embodiment the covalent matrix compound of formula (2) or formula (3) may comprise at least at least ≥1 to ≤6, preferably ≥2 to ≤5, or further preferred 3 or 4 of the substituted or unsubstituted aromatic fused ring systems with:

- at least one unsaturated 5-member ring, and/or
- at least one unsaturated 6-member ring, and/or
- at least one unsaturated 7-member ring; wherein preferably at least one unsaturated 5- and/or at least one unsaturated 7-member ring comprises at least 1 to 3, preferably 1 hetero-atom.

According to one embodiment the covalent matrix compound of formula (2) or formula (3) may comprise at least at least ≥1 to ≤6, preferably ≥2 to ≤5, or further preferred 3 or 4 of the substituted or unsubstituted aromatic fused ring systems with:

- at least one aromatic 5-member ring, and/or
- at least one aromatic 6-member ring, and/or
- at least one aromatic 7-member ring; wherein preferably at least one aromatic 5- and/or at least one aromatic 7-member ring comprises at least 1 to 3, preferably 1 hetero-atom;

wherein the substituted or unsubstituted aromatic fused ring system comprises at least ≥1 to ≤3 or 2 substituted or unsubstituted unsaturated 5- to 7-member ring of a heterocycle.

According to one embodiment the covalent matrix compound of formula (2) or formula (3) may comprise:

- at least ≥6 to ≤12, preferably ≥7 to ≤11, further preferred ≥8 to ≤10 or 9 aromatic rings; and/or
- at least ≥4 to ≤11, preferably ≥5 to ≤10, further preferred ≥6 to ≤9 or in addition preferred 7 or 8 non-hetero aromatic rings, preferably the non-hetero aromatic rings are aromatic $C_6$ rings; and/or
- at least ≥1 to ≤4, preferably 2 or 3 aromatic 5-member-rings, preferably hetero aromatic 5-member-rings; and/or
- at least 1 or 2 unsaturated 5- to 7-member-ring of a heterocycle, preferably at least 1 or 2 unsaturated 7-member-ring of a heterocycle;
- at least ≥6 to ≤12, preferably ≥7 to ≤11, further preferred ≥8 to ≤10 or 9 aromatic rings, wherein therefrom
  - at least ≥4 to ≤11, preferably ≥5 to ≤10, further preferred ≥6 to ≤9 or in addition preferred 7 or 8 are non-hetero aromatic rings, and
  - at least ≥1 to ≤4, preferably 2 or 3 aromatic rings are hetero aromatic rings, wherein the total number of non-hetero aromatic rings and hetero aromatic rings in total does not exceed 12 aromatic rings; and/or
- at least ≥6 to ≤12, preferably ≥7 to ≤11, further preferred ≥8 to ≤10 or 9 aromatic rings, wherein therefrom
  - at least ≥4 to ≤11, preferably ≥5 to ≤10, further preferred ≥6 to ≤9 or in addition preferred 7 or 8 are non-hetero aromatic rings, and
  - at least ≥1 to ≤4, preferably 2 or 3 aromatic rings are hetero aromatic rings, wherein the total number of non-hetero aromatic rings and hetero aromatic rings in total does not exceed 12 aromatic rings; and
  - the common hole injection layer or common hole transport layer according to formula I comprises at least ≥1 to ≤4, preferably 2 or 3 aromatic 5-member-rings, preferably hetero aromatic 5-member-rings, and/or
  - the compound according to formula (I) comprises at least 1 or 2 unsaturated 5- to 7-member-ring of a heterocycle, preferably at least 1 or 2 unsaturated 7-member-ring of a heterocycle.

According to one embodiment the covalent matrix compound of formula (2) or formula (3) may comprise a hetero-atom, which may be selected from the group comprising O, S, N, B or P, preferably the hetero-atom may be selected from the group comprising O, S or N.

According to one embodiment the covalent matrix compound of formula (2) or formula (3) may comprise at least at least ≥1 to ≤6, preferably ≥2 to ≤5, or further preferred 3 or 4 of the substituted or unsubstituted aromatic fused ring systems with:

- at least one aromatic 5-member ring, and/or
- at least one aromatic 6-member ring, and/or
- at least one aromatic 7-member ring; wherein preferably at least one aromatic 5- and/or at least one aromatic 7-member ring comprises at least 1 to 3, preferably 1 hetero-atom;
  - wherein the substituted or unsubstituted aromatic fused ring system optional comprises at least ≥1 to ≤3 or 2 substituted or unsubstituted unsaturated 5- to 7-member ring of a heterocycle; and wherein the substituted or unsubstituted aromatic fused ring system comprises a hetero-atom, which may be selected from the group comprising O, S, N, B, P or Si, preferably the hetero-atom may be selected from the group comprising O, S or N.

According to one embodiment the matrix covalent compound of formula (2) or formula (3) may be free of hetero-atoms which are not part of an aromatic ring and/or part of an unsaturated 7-member-ring, preferably the compound according to formula (I) may be free on N-atoms except N-atoms which are part of an aromatic ring or are part of an unsaturated 7-member-ring.

According to one embodiment, wherein the covalent matrix compound according to formula (I) comprises at least one naphthyl group, carbazole group, dibenzofurane group, dibenzothiophene group and/or substituted fluorenyl group, wherein the substituents are independently selected from methyl, phenyl or fluorenyl.

According to an embodiment of the electronic device, wherein the covalent matrix compound or substantially covalent matrix compound are selected from F1 to F21:

(F1)

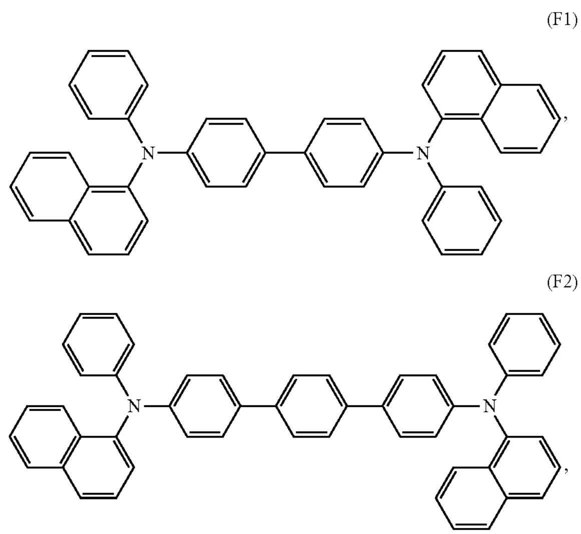

, (F2)

,

-continued
(F3)
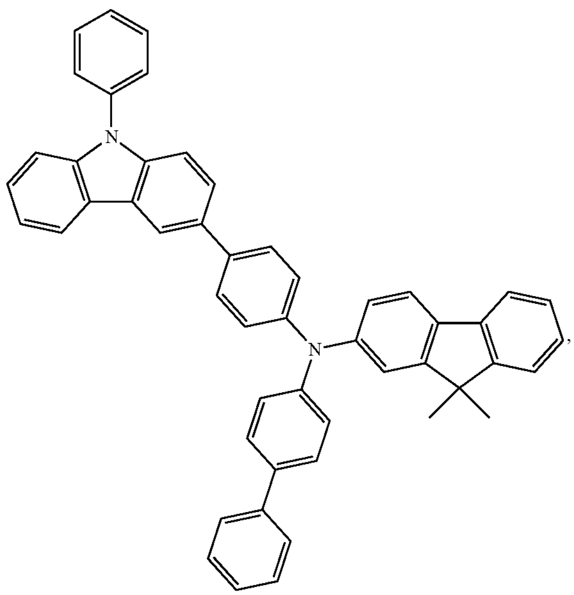
(F4)
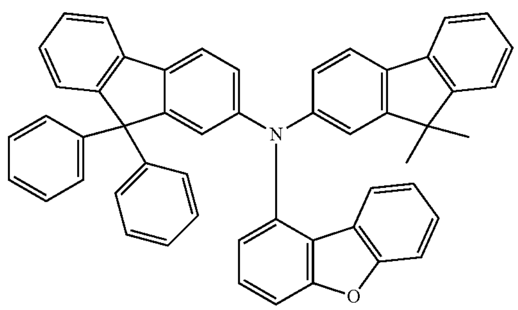
(F5)
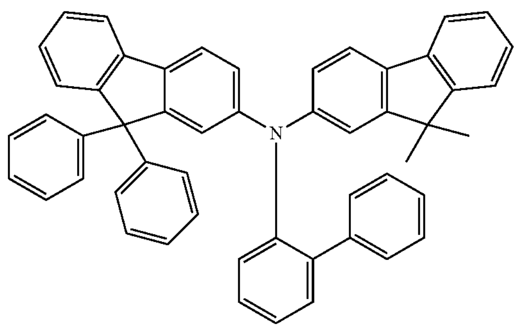
-continued
(F6)
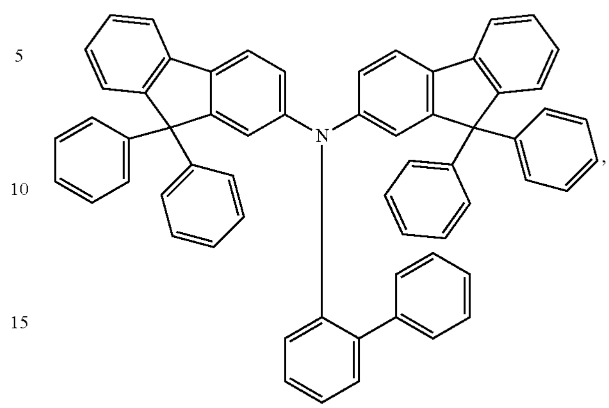
(F7)
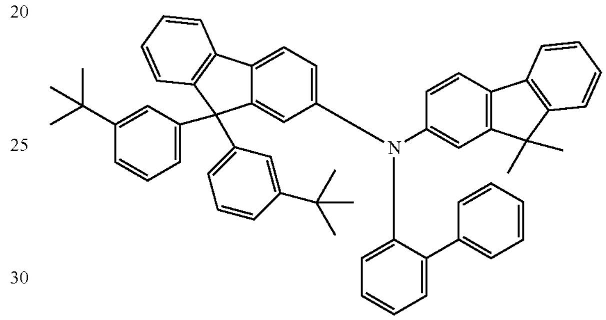
(F8)
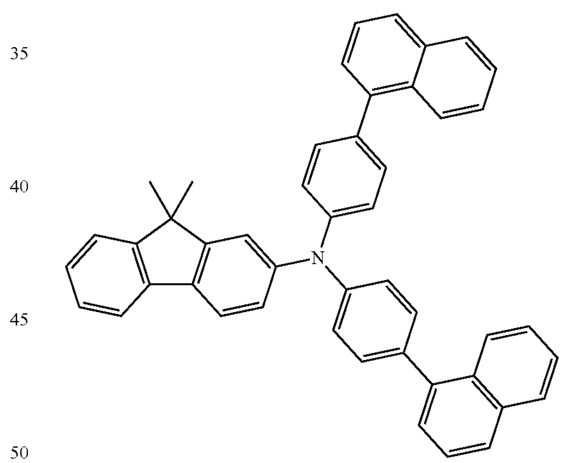
(F9)
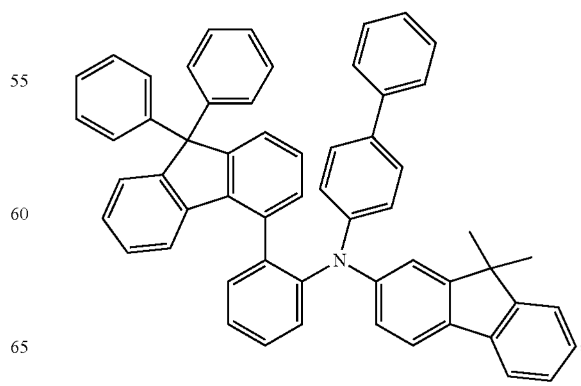

-continued
(F10)
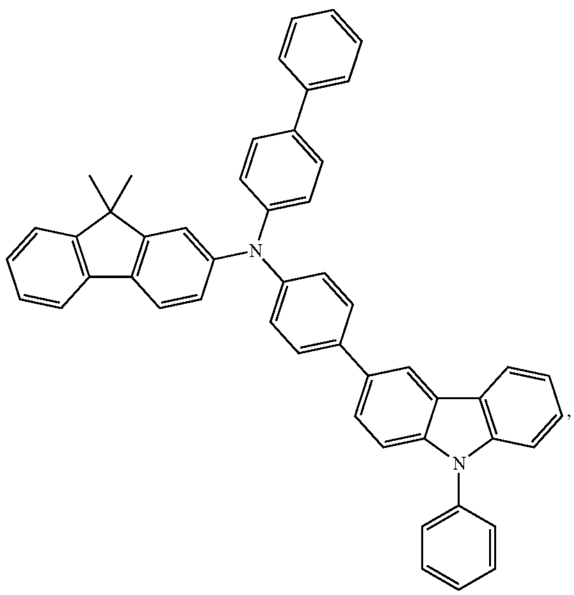
(F11)
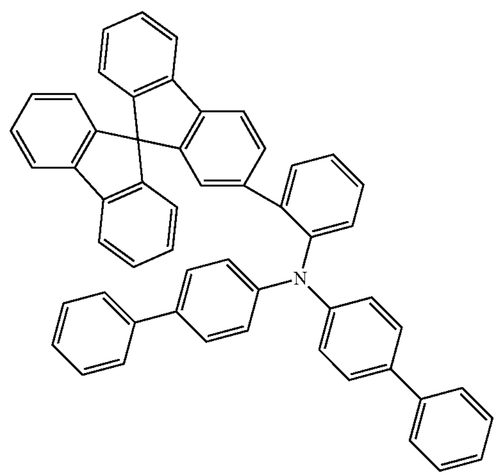
(F12)
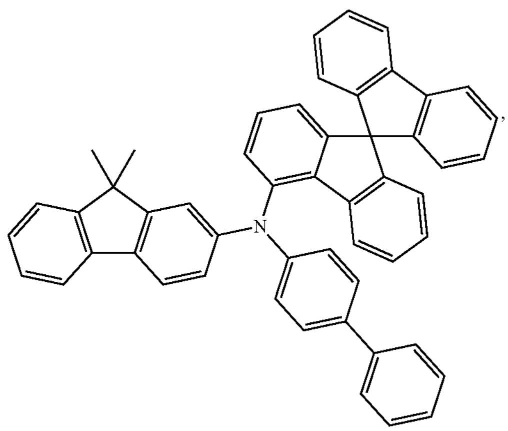
-continued
(F13)
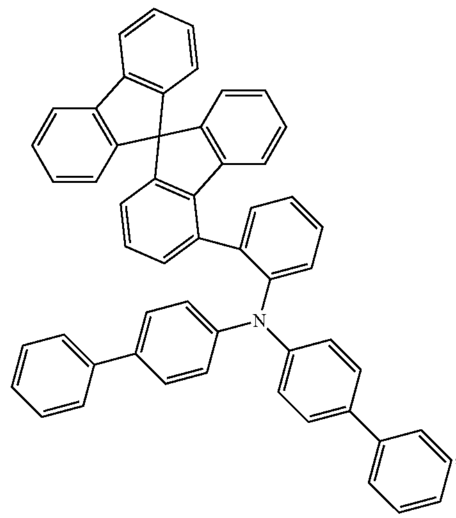
(F14)
(F15)
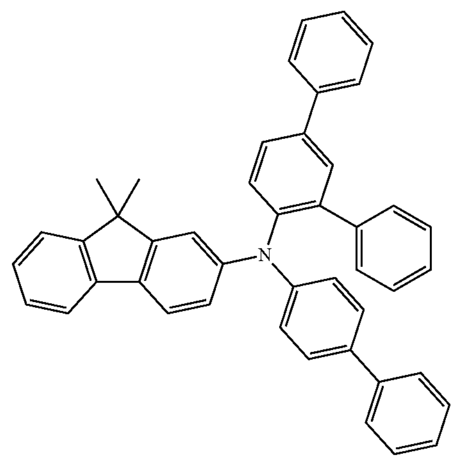

-continued
(F16)
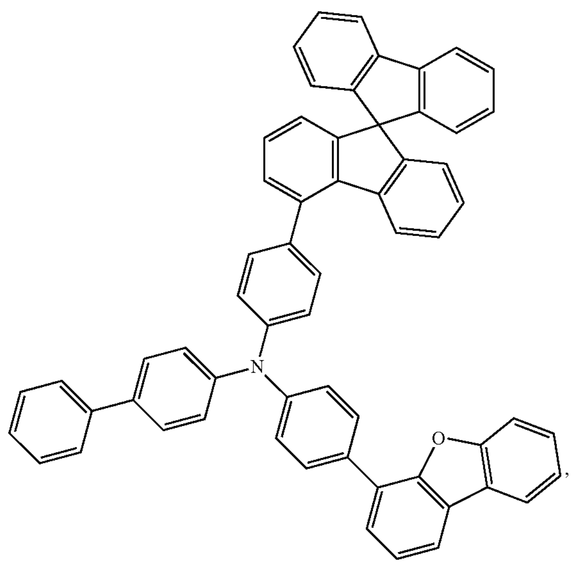
(F17)
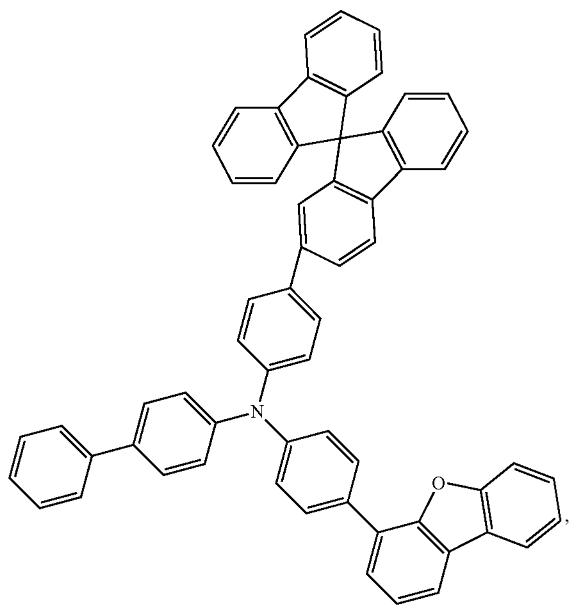
(F18)
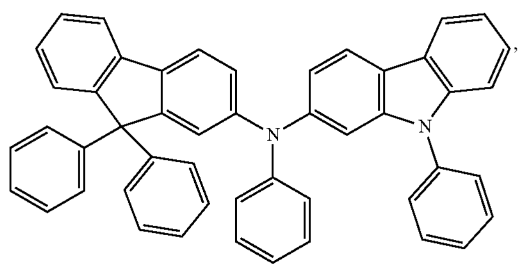
-continued
(F19)
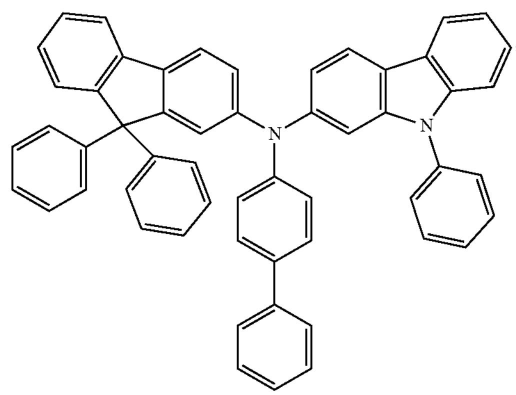
(F20)
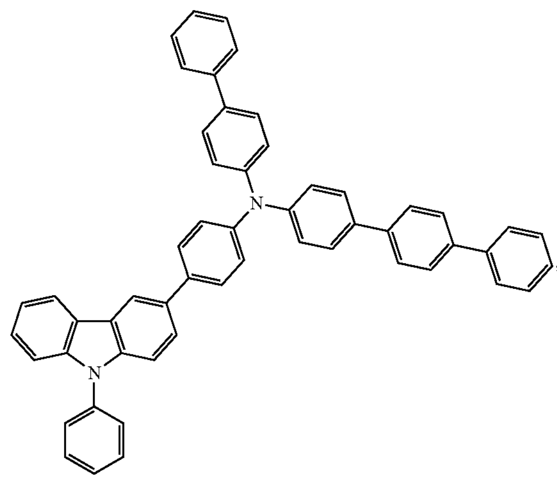
(F21)
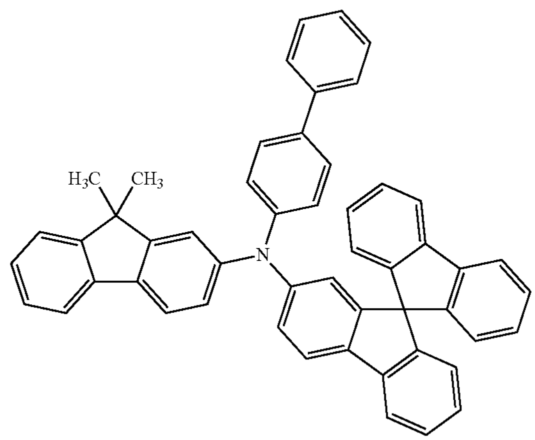

Matrix compounds may be suitable used in an electron-blocking layer selected from F22 to F25:

(F22)

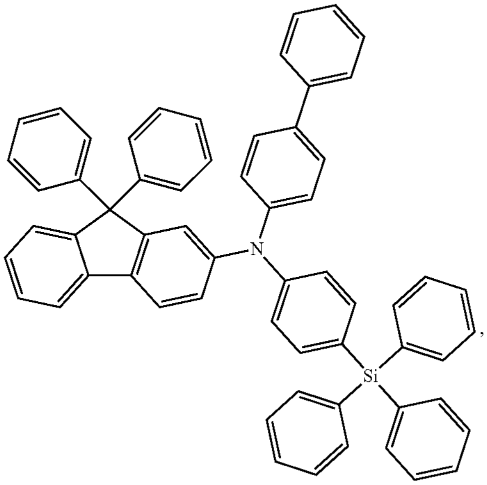

(F23)

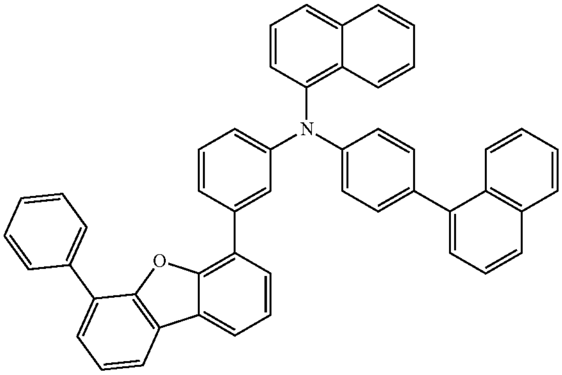

-continued (F24)

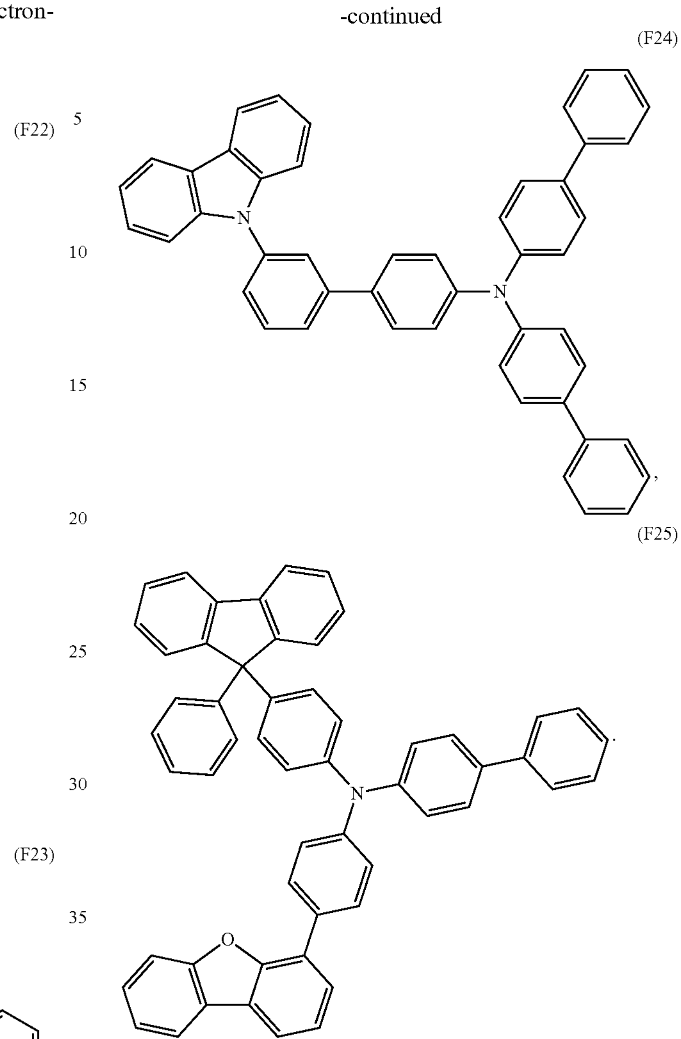

(F25)

The covalent matrix compound of the hole injection layer may be free of HTM014, HTM081, HTM163, HTM222, EL-301, HTM226, HTM355, HTM133, HTM334, HTM604 and EL-22T. The abbreviations denote the manufacturers' names, for example, of Merck or Lumtec.

According to a furthermore preferred embodiment the covalent matrix compound or substantially covalent matrix compound has the Formula (T-1) to (T-6) as shown in Table 1.

TABLE 1

| Name | Chemical Formula | Calculated HOMO (eV) |
| --- | --- | --- |
| N,N'-Bis-(3-methyl-phenyl)-N,N'-bis-(phenyl)-benzidine (T-1) | 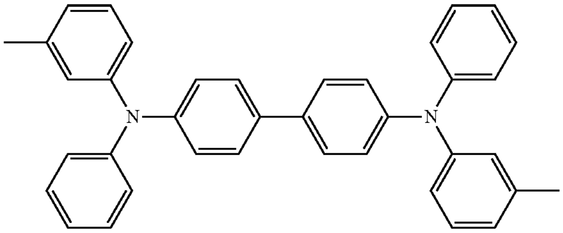 | −4.69 |

TABLE 1-continued
| Name | Chemical Formula | Calculated HOMO (eV) |
|---|---|---|
| Biphenyl-4-yl(9,9-diphenyl-9H-fluoren-2-yl)-[4-(9-phenyl-9H-carbazol-3-yl)-phenyl]-amine (T-2) | 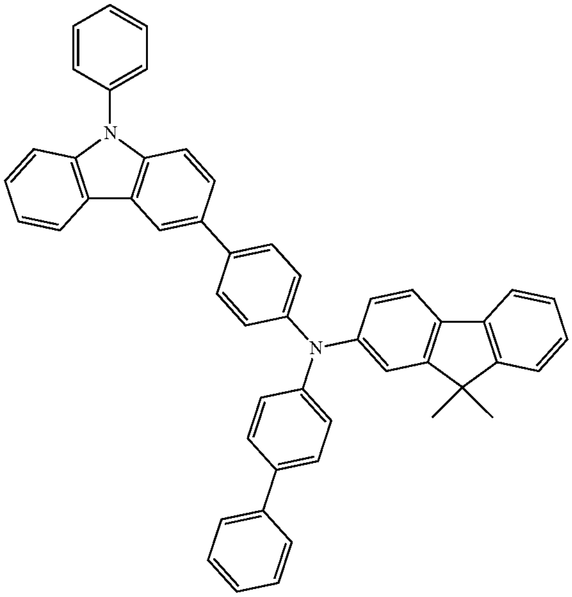 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21] | −4.69 |
| N,N'-Bis(naphthalen-1-yl)-N,N'-bis(phenyl)-benzidine (T-3) | 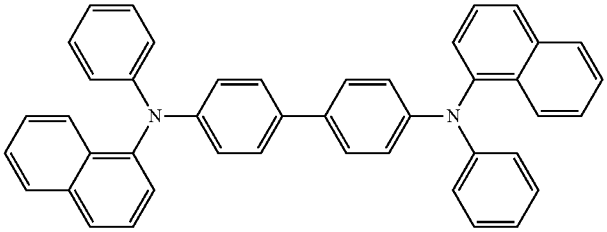 [SMILES: c1ccc(N(c2ccc(-c3ccc(N(c4ccccc4)c4cccc5ccccc45)cc3)cc2)c2cccc3ccccc23)cc1] | −4.72 |
| N4,N4,N4',N4'-tetra(biphenyl-4-yl)biphenyl-4,4'-diamine (T-4) | 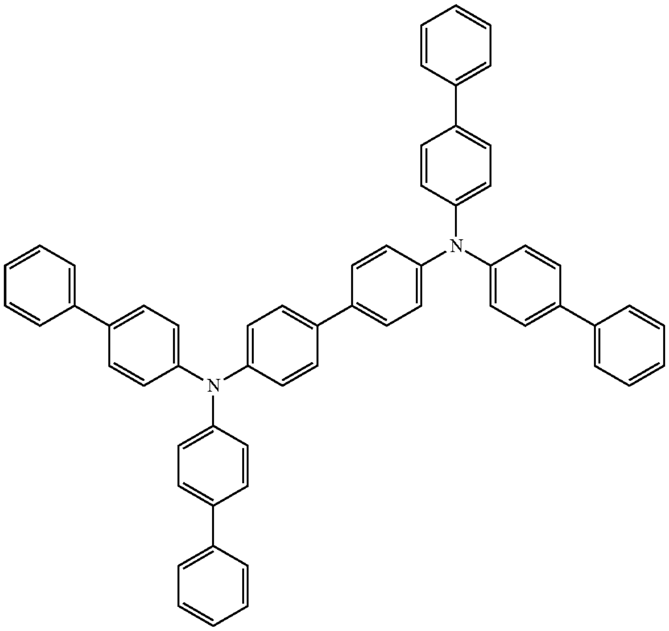 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1] | −4.73 |

TABLE 1-continued

| Name | Chemical Formula | Calculated HOMO (eV) |
|---|---|---|
| N4,N4''-di(naphthalen-1-yl)-N4,N4''-diphenyl-[1,1':4',1''-terphenyl]-4,4''-diamine (T-5) | 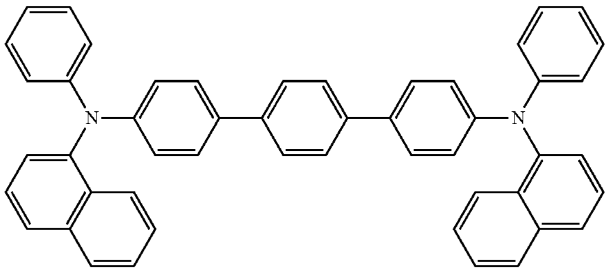 [SMILES: c1ccc(N(c2ccc(-c3ccc(-c4ccc(N(c5ccccc5)c5cccc6ccccc56)cc4)cc3)cc2)c2cccc3ccccc23)cc1] | −4.81 |
| 9,9-dimethyl-N,N-bis(4-(naphthalen-1-yl)phenyl)-9H-fluoren-2-amine (T-6) | 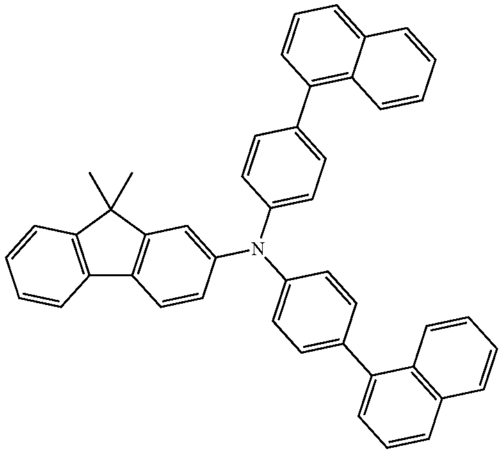 [SMILES: CC1(C)c2ccccc2-c2ccc(N(c3ccc(-c4cccc5ccccc45)cc3)c3ccc(-c4cccc5ccccc45)cc3)cc21] | −4.84 |

According to another aspect, the at least first common semiconductor layer, preferably a common HIL, and/or the common second semiconductor layer, preferably an HTL, may comprises a covalent matrix compound or substantially covalent matrix compound and may comprise at least about ≥0.1 wt.-% to about ≤50 wt.-%, preferably about ≥1 wt.-% to about ≤25 wt.-%, and more preferred about ≥2 wt.-% to about ≤15 wt.-%, of a covalent matrix compound or substantially covalent matrix compound, preferably of formula (2) or formula (3).

According to one embodiment, wherein the common semiconductor layer is arranged between the anode layer and the light emitting layer, preferably the common semiconductor layer is a common hole injection layer, or the common semiconductor layers are a common hole injection layer and a common hole transport layer.

Further Layers

In accordance with the invention, the organic light-emitting diode may comprise, besides the layers already mentioned above, further layers or common layers. Exemplary embodiments of respective layers or common layers are described in the following:

Substrate

The substrate may be any substrate that is commonly used in manufacturing of electronic devices, preferably organic light-emitting diodes. If light is to be emitted through the substrate, the substrate shall be a transparent or semitransparent material, for example a glass substrate or a transparent plastic substrate. If light is to be emitted through the top surface, the substrate may be both a transparent as well as a non-transparent material, for example a glass substrate, a plastic substrate, a metal substrate or a silicon substrate.

Anode Electrode

Every individual pixel may have its own anode that may not touch anodes of other individual pixels.

The anode electrode also named anode layer may be formed by depositing or sputtering a material that is used to form the anode electrode. The anode or anode layer is not formed as a common anode layer. The material used to form the anode electrode may be a high work-function material, so as to facilitate hole injection. The anode material may also be selected from a low work function material (i.e. aluminum). The anode electrode may be a transparent or reflective electrode. Transparent conductive oxides, preferably indium tin oxide (ITO), indium zinc oxide (IZO), tin-dioxide (SnO2), aluminum zinc oxide (AlZO) and zinc oxide (ZnO), may be used to form the anode electrode. The anode electrode may also be formed using metals, typically silver (Ag), gold (Au), or metal alloys.

According to one embodiment, wherein the anode layer may comprise a first anode sub-layer comprising or consisting of Ag or Au, a second anode-sub-layer comprising or consisting of ITO or IZO and optionally a third anode sub-layer comprising or consisting of ITO or IZO. Preferably the first anode sub-layer may comprise or consists of Ag, the second anode-sublayer may comprise or consists of ITO and the third anode sub-layer may comprise or consists of ITO. Preferably, the transparent conductive oxide in the second and third anode sub-layer may be selected the same.

According to one embodiment, wherein the anode layer may comprise a first anode sub-layer comprising Ag or Au having a thickness of 100 to 150 nm, a second anode-sub-layer comprising ITO or IZO having a thickness of 3 to 20 nm and a third anode sub-layer comprising ITO or IZO having a thickness of 3 to 20 nm.

Anode Sub-Layer

The anode layer may comprise a first anode sub-layer and a second anode sub-layer, wherein the first anode sub-layer comprises a first metal having a work function in the range of ≥4 and ≤6 eV, and the second anode sub-layer comprises a transparent conductive oxide (TCO).

Every individual pixel may have its own anode that may not touch anodes of other individual pixels. The anode sub-layers are not formed as a common layer.

According to one embodiment the anode layer comprises a first anode sub-layer and a second anode sub-layer and optional a third anode sub layer, wherein the first anode sub-layer comprises a first metal having a work function in the range of ≥4 and ≤6 eV, and the second anode sub-layer comprises a transparent conductive oxide (TCO); wherein the hole injection layer is arranged between the first light emitting layer and the anode layer, the first anode sub-layer is arranged closer to the substrate, and the second anode sub-layer is arranged closer to the hole injection layer.

First Anode Sub-Layer

According to one embodiment, wherein the first metal of the first anode sub-layer may have a work function in the range of ≥4.2 and ≤6 eV. The first metal may be selected from a metal or a metal alloy.

According to one embodiment, wherein the first metal of the first anode sub-layer may be selected from the group comprising Ag, Mg, Al, Cr, Pt, Au, Pd, Ni, Nd, Ir, preferably Ag, Au or Al, and more preferred Ag.

The first anode sub-layer may have a thickness in the range of 5 to 200 nm, alternatively 8 to 180 nm, alternatively 8 to 150 nm, alternatively 100 to 150 nm.

The first anode sub-layer may be formed by depositing the first metal via vacuum thermal evaporation.

It is to be understood that the first anode layer is not part of the substrate.

Second Anode Sub-Layer

According to one embodiment, wherein the transparent conductive oxide may be selected from the group comprising indium tin oxide (ITO) or indium zinc oxide (IZO), more preferred indium tin oxide (ITO). preferably ITO or IZO.

The first anode sub-layer may have a thickness in the range of 3 to 200 nm, alternatively 3 to 180 nm, alternatively 3 to 150 nm, alternatively 3 to 20 nm.

The second anode sub-layer may be formed by sputtering of the transparent conductive oxide.

Third Anode Sub-Layer

According to one embodiment the anode layer of the organic light-emitting diode may comprise at least three anode sub-layers of a first anode sub-layer, a second anode sub-layer and third anode sub-layer. According to one embodiment the anode layer of the organic light-emitting diode may comprise in addition to the first and second anode sub-layers a third anode sub-layer, wherein the third anode sub-layer comprises a transparent conductive oxide, wherein the third anode sub-layer may be arranged between the substrate and the first anode sub-layer.

The third anode sub-layer may have a thickness in the range of 3 to 200 nm, alternatively 3 to 180 nm, alternatively 3 to 150 nm, alternatively 3 to 20 nm.

The third anode sub-layer may be formed by sputtering of the transparent conductive oxide.

It is to be understood that the third anode layer is not part of the substrate.

Hole Injection Layer

The common hole injection layer (HIL) may be formed for the plurality of OLED pixels in the OLED display. In one embodiment, the common HIL may extend over all pixels of the plurality of pixels or extends over at least two pixels of the plurality of pixels in the OLED display.

Every individual pixel may have its own anode that may not touch anodes of other individual pixels.

Further, the active OLED display has driving circuit configured to separately drive the individual pixels of the plurality of pixels provided in the OLED display. In one embodiment, a step of separately driving may comprise separate control of the driving current applied the individual pixels.

The common HIL may comprise or be made of a hole injection material, wherein the hole injection material may comprise a metal compound. According to one embodiment the hole injection layer comprises a hole injection material and optional a matrix compound.

According to another embodiment the hole injection layer comprises in addition a matrix compound that can be an organic compound.

The hole injection material is preferably an organic compound and/or a metal compound.

It is to be understood that the HIL material consists of one or more hole injection compounds, whereas the term hole injection material is a broader term used throughout this application for all semiconducting materials comprising at least one hole injection material compound that provide a hole injection from anodes into hole transport matrices, without substantially increasing the concentration of free charge carriers above the level which corresponds to conductivities observed in a neat matrix or may capable of increasing the density of positive charge carriers in a hole transport material or hole transport layer, when added to a semiconductor.

The LUMO energy level of a metal compound, as a hole injection material, expressed in the absolute scale referring to vacuum energy level being zero, may be at least 150 meV, at least 200 meV, at least 250 meV, at least 300 meV, or at least 350 meV higher than the highest HOMO energy level of a covalent matrix compound or substantially covalent matrix compound.

The LUMO energy level of a metal compound, as a hole injection material, expressed in the absolute scale referring to vacuum energy level being zero, may be less than 1000 meV, less than 750 meV, 600 meV, less than 550 meV, less than 500 meV, less than 450 meV, or less than 400 meV above the highest HOMO energy level of a covalent matrix compound or substantially covalent matrix compound.

The LUMO energy level of the organic compound, as a hole injection material, expressed in the absolute scale referring to vacuum energy level being zero, when calculated using TURBOMOLE V6.5 (TURBOMOLE GmbH, Litzenhardtstrasse 19, 76135 Karlsruhe, Germany) by applying the hybrid functional B3LYP with a 6-31G* basis set in the gas phase, may be selected from ≤−3.5 eV, ≤−3.6 eV, ≤−3.7 eV, ≤−3.8 eV, ≤−3.9 eV≤−4.0 eV≤−4.5 eV, ≤−4.6 eV, ≤−4.7 eV, ≤−4.8 eV, ≤−4.85 eV, ≤−4.9 eV.

The common hole injection layer may have a thickness ≥1 nm and ≤100 nm, preferably ≥2 nm and ≤50 nm, more preferably ≥3 nm and ≤40 nm, more preferably ≥4 nm and ≤30 nm, more preferably ≥5 nm and ≤20 nm, more preferably ≥6 nm and ≤15 nm, more preferably ≥8 nm and ≤10 nm.

The HIL may be formed as a common HIL for the plurality of pixels or at least two pixels. The common HIL may extend over all pixels of the plurality of pixels or extends over at least two pixels of the plurality of pixels in the OLED display.

A hole injection layer (HIL) may be formed as a common hole injection layer (HIL) on anode electrodes, wherein the anode electrode is not formed as a common anode electrode layer, for example by vacuum deposition, spin coating, printing, casting, slot-die coating, Langmuir-Blodgett (LB) deposition, or the like. When the HIL is formed using vacuum deposition, the deposition conditions may vary according to the compound that is used to form the HIL, and the desired structure and thermal properties of the common HIL. In general, however, conditions for vacuum deposition may include a deposition temperature of 100° C. to 500° C., a pressure of $10^{-8}$ to $10^{-3}$ Torr (1 Torr equals 133.322 Pa), and a deposition rate of 0.1 to 10 nm/sec.

When the common HIL is formed using spin coating or printing, coating conditions may vary according to the compound that is used to form the common HIL, and the desired structure and thermal properties of the HIL. For example, the coating conditions may include a coating speed of about 2000 rpm to about 5000 rpm, and a thermal treatment temperature of about 80° C. to about 200° C. Thermal treatment removes a solvent after the coating is performed.

Examples of compounds that may be used to form the common HIL include a phthalocyanine compound, preferably copper phthalocyanine (CuPc), 4,4',4"-tris (3-methylphenylphenylamino) triphenylamine (m-MTDATA), TDATA, 2T-NATA, polyaniline/dodecyl benzenesulfonic acid (Pani/DBSA), poly(3,4-ethylenedioxythiophene)/poly (4-styrenesulfonate) (PEDOT/PSS), polyaniline/camphor sulfonic acid (Pani/CSA), and polyaniline)/poly(4-styrenesulfonate (PANI/PSS).

A common HIL may comprise or consist of hole injection material may be selected from tetrafluoro-tetracyanoquinonedimethane (F4TCNQ), 2,2'-(perfluoronaphthalen-2,6-diylidene) dimalononitrile or 2,2',2"-(cyclopropane-1,2,3-triylidene)tris(2-(p-cyanotetrafluorophenyl)acetonitrile) but not limited hereto. The common HIL may be selected from a hole-transporting covalent matrix compound doped with a hole injection material.

Typical examples of known doped hole transport materials are: copper phthalocyanine (CuPc), which HOMO level is approximately −5.2 eV, doped with tetrafluoro-tetracyanoquinonedimethane (F4TCNQ), which LUMO level is about −5.2 eV; zinc phthalocyanine (ZnPc) (HOMO=−5.2 eV) doped with F4TCNQ; α-NPD (N,N'-Bis(naphthalen-1-yl)-N,N'-bis(phenyl)-benzidine) doped with F4TCNQ. α-NPD doped with 2,2'-(perfluoronaphthalen-2,6-diylidene) dimalononitrile. The hole injection material concentrations can be selected from 1 to 20 wt.-%, more preferably from 3 wt.-% to 10 wt.-%.

According to one embodiment of the organic electronic device, wherein the common hole injection layer may comprise a first common hole injection sub-layer comprising the metal compound according to the invention and a second common hole injection sub-layer comprising the covalent matrix compound or substantially covalent matrix compound.

According to another embodiment of the organic electronic device, wherein the common hole injection layer may comprise a common first hole injection sub-layer comprising the hole injection material according to the invention and a common second hole injection sub-layer comprising a matrix compound that is a covalent matrix compound or substantially covalent matrix compound, wherein the common first hole injection sub-layer is arranged closer to the anode layer comprising a first anode sub-layer and a second anode sub-layer and the second common hole injection sub-layer is arranged closer to the at least one light emitting layer.

According to one embodiment, wherein the common first hole injection sub-layer that is arranged closer to the anode layer is doped and the second hole injection sub-layer is not doped.

According to one embodiment of the organic electronic device, wherein the common hole injection layer may comprise a first common hole injection sub-layer comprising the hole injection material according to the invention and a second common hole injection sub-layer comprising a matrix compound comprising of at least one arylamine compound, diarylamine compound, triarylamine compound, wherein the first common hole injection sub-layer is arranged closer to the anode layer and the second common hole injection sub-layer is arranged closer to the at least one light emitting layer.

According to one embodiment of the organic electronic device, wherein the common hole injection layer may comprise a first hole injection sub-layer comprising the hole injection material according to the invention and a second common hole injection sub-layer comprising the matrix compound comprising of at least one arylamine compound, diarylamine compound, triarylamine compound, wherein the first hole injection sub-layer is arranged closer to the anode layer comprising a first anode sub-layer and a second anode sub-layer and the second hole injection sub-layer is arranged closer to the at least one light emitting layer.

According to one embodiment the hole injection layer material can be selected from a compound of formula H1 to H20:

(H1)

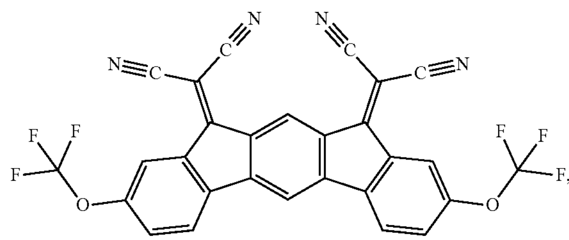

(H2)

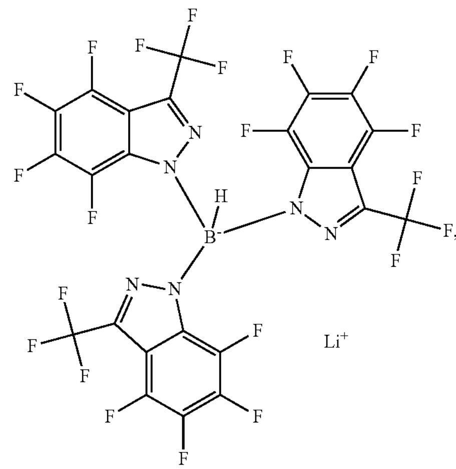

-continued
(H3)
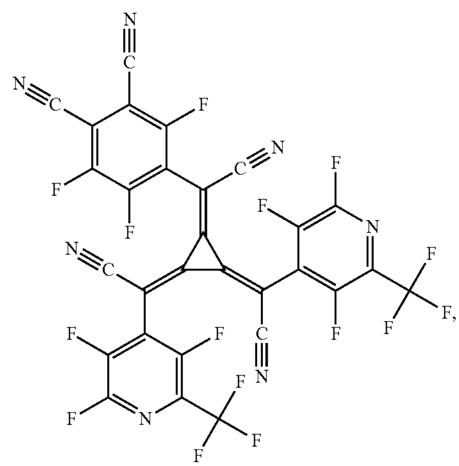
(H4)
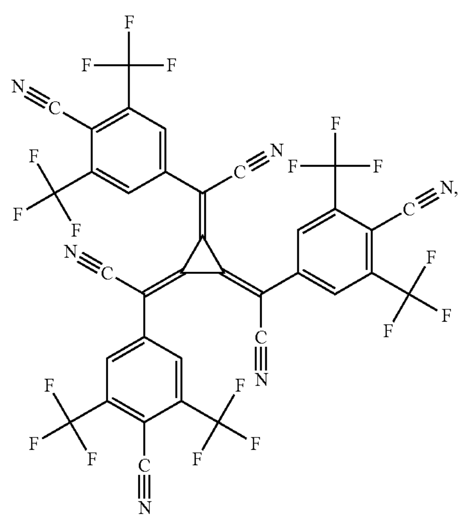
(H5)
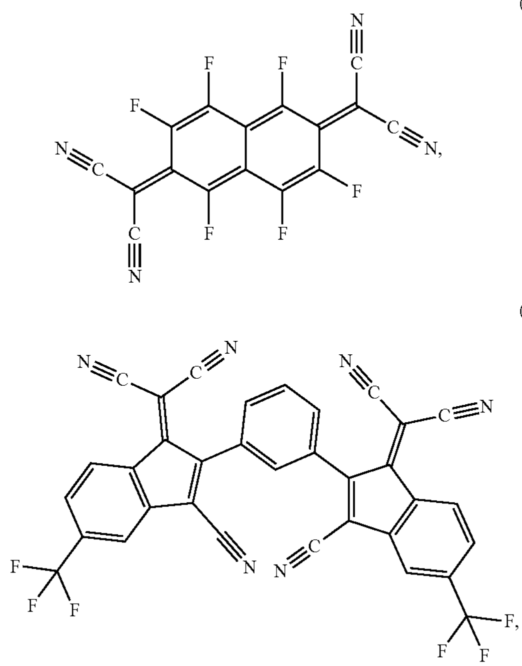
(H6)
-continued
(H7)
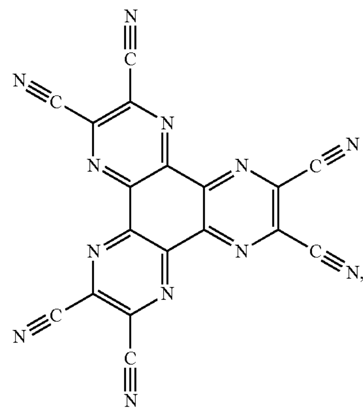
(H8)
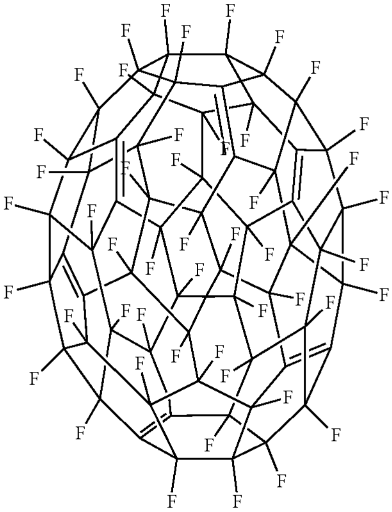
(H9)
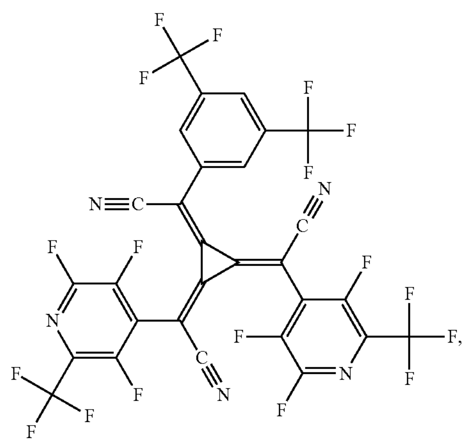

-continued
(H10)
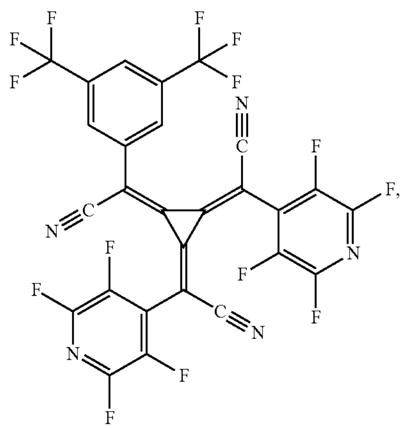
(H11)
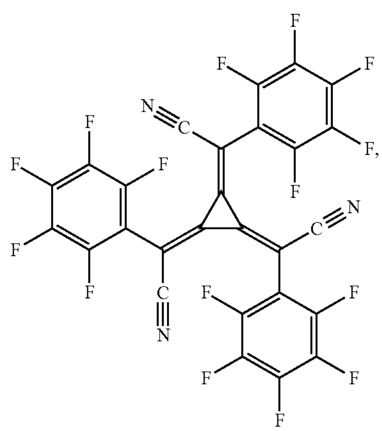
(H12)
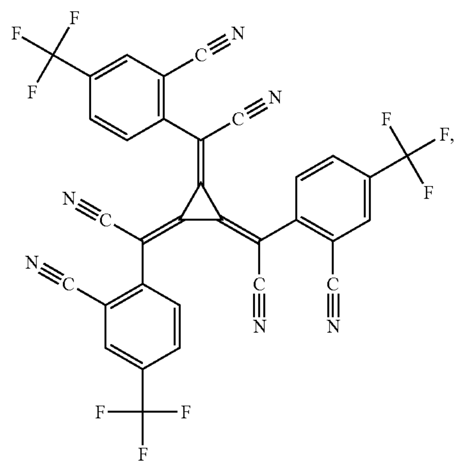
-continued
(H13)
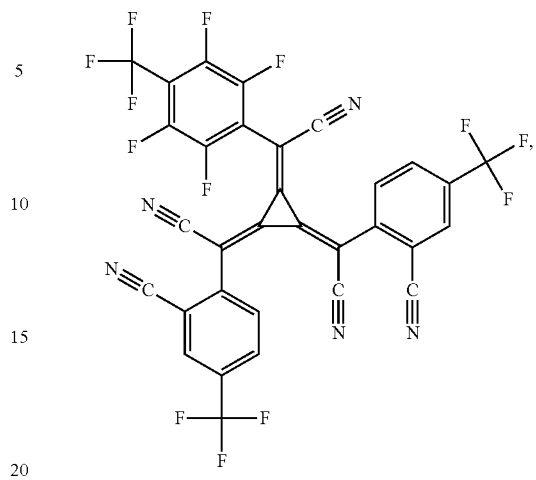
(H14)
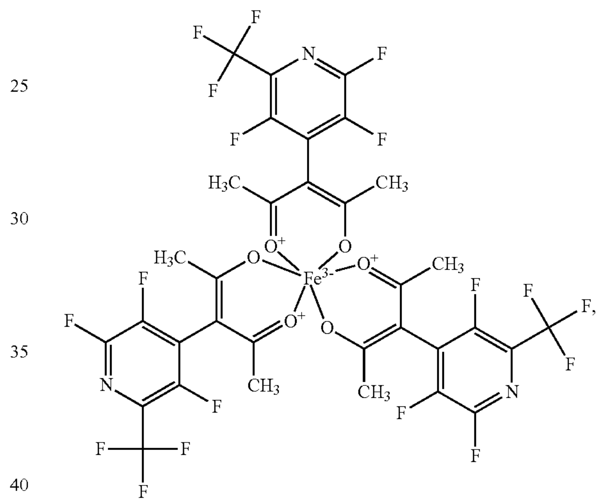
(H15)
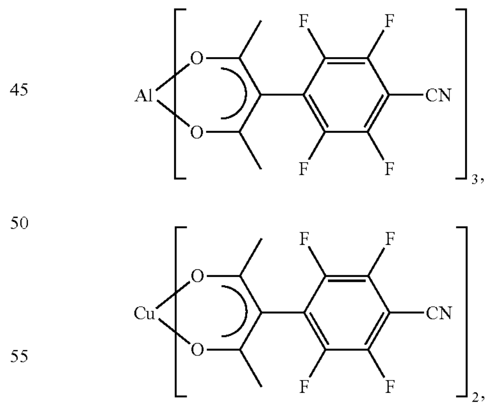
(H16)
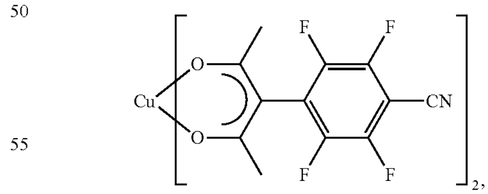
(H17)
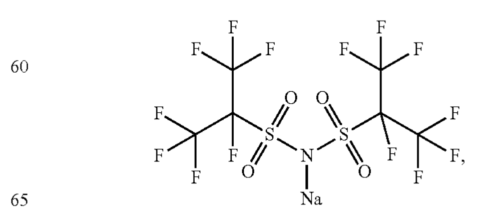

-continued (H18)

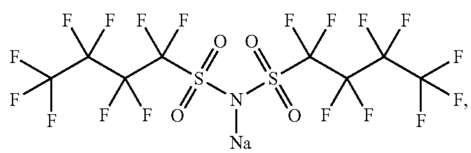

(H19)

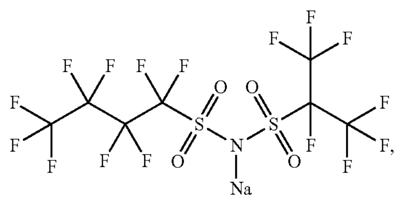

(H20)

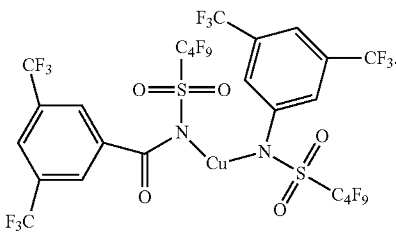

Hole Transport Layer (HTL)

The HTL may be formed as a common HTL for the plurality of pixels or at least two pixels. The common HTL may extend over all pixels of the plurality of pixels or extends over at least two pixels of the plurality of pixels in the OLED display.

A hole transport layer (HTL) may be formed on the common HIL by vacuum deposition, spin coating, slot-die coating, printing, casting, Langmuir-Blodgett (LB) deposition, or the like.

The hole transport layer may be formed as a common hole transport layer.

When the hole transport layer (HTL) or common hole transport layer (HTL) is formed by vacuum deposition or spin coating, the conditions for deposition and coating may be similar to those for the formation of the HIL. However, the conditions for the vacuum or solution deposition may vary, according to the compound that is used to form the hole transport layer (HTL) or common hole transport layer (HTL).

In one embodiment, wherein the organic light-emitting diode further comprises the hole transport layer (HTL) or common hole transport layer (HTL), wherein the hole transport layer (HTL) or common hole transport layer (HTL) is arranged between the common hole injection layer and the at least one emission layer.

In one embodiment, wherein the hole transport layer (HTL) or common hole transport layer (HTL) comprises a covalent matrix compound or substantially covalent matrix compound.

In one embodiment, wherein the at least one common hole injection layer and the hole transport layer (HTL) or common hole transport layer (HTL) comprise a covalent matrix compound or substantially covalent matrix compound, wherein the covalent matrix compound or substantially covalent matrix compound is selected the same in both layers.

The thickness of the HTL may be in the range of about 5 nm to about 250 nm, preferably, about 10 nm to about 200 nm, further about 20 nm to about 190 nm, further about 40 nm to about 180 nm, further about 60 nm to about 170 nm, further about 80 nm to about 160 nm, further about 100 nm to about 160 nm, further about 120 nm to about 140 nm.

When the thickness of the HTL is within this range, the HTL may have excellent hole transporting characteristics, without a substantial penalty in driving voltage.

The common hole transport layer (HTL) may be formed for the plurality of OLED pixels in the OLED display. In one embodiment, the common HTL may extend over all pixels of the plurality of pixels or extends over at least two pixels of the plurality of pixels in the OLED display. Similarly, the cathode may be formed as a common cathode for the plurality of pixels or at least two pixels. The common cathode may extend over all pixels of the plurality of pixels or extends over at least two pixels of the plurality of pixels in the OLED display. Every individual pixel may have its own anode that may not touch anodes of other individual pixels. Further, the active OLED display has driving circuit configured to separately drive the individual pixels of the plurality of pixels provided in the OLED display. In one embodiment, a step of separately driving may comprise separate control of the driving current applied the individual pixels.

The common HTL can be made of a hole transport matrix (HTM) material doped with a hole injection material. The hole transport matrix material may be doped with more than one hole injection material. It is to be understood that the HTM material consists of one or more HTM com-pounds, whereas the term hole transport material is a broader term used throughout this application for all semiconducting materials comprising at least one HTM compound. The hole transport matrix material may consist of one or more organic compounds.

The LUMO energy level of a metal compound, as a hole injection material, expressed in the absolute scale referring to vacuum energy level being zero, may be less than 1000 meV, less than 750 meV, 600 meV, less than 550 meV, less than 500 meV, less than 450 meV, or less than 400 meV above the highest HOMO energy level of the compounds forming the common second semiconductor layer, which is preferably a hole transport layer.

The HTM may comprise or consist of compounds having energies of their highest occupied molecular orbitals, expressed in the absolute scale referring to vacuum energy level being zero, in the range from calculated using the hybrid functional B3LYP with a Gaussian 6-31G* basis set as implemented in the program package TURBOMOLE V6.5, in the range from $<-4.27$ eV to $\geq -6.0$ eV, $<-4.3$ eV to $\geq -5.5$ eV, preferably $<-4.5$ eV to $\geq -5.4$ eV, more preferably from $-<-4.6$ eV to $\geq -5.3$ eV.

The common hole transport layer may have a thickness of less than 50 nm, less than 40 nm, less than 30 nm, less than 20 nm, or less than 15 nm. The common hole transport layer may have a thickness of more than 3 nm, more than 5 nm, more than 8 nm, or more than 10 nm. The anode may be made of a transparent conductive oxide (TCO), like indium tin oxide (ITO). Alternatively, the anode may be made of one or more thin metallic layers leading to a semitransparent anode. In another embodiment, the anode may be made of a thick metallic layer which is not transparent to visible light.

In one embodiment, the work function of the anode, expressed in the absolute scale referring to vacuum energy level being zero, may be less than 500 meV, less than 450 meV, less than 400 meV, less than 350 meV, or less than 300 meV above the highest LUMO energy level of compounds forming the hole injection material in the common hole injection layer.

Typical examples of known doped hole transport materials are: copper phthalocyanine (CuPc), which HOMO level is approximately −5.2 eV, doped with tetrafluoro-tetracyanoquinonedimethane (F4TCNQ), which LUMO level is about −5.2 eV; zinc phthalocyanine (ZnPc) (HOMO=−5.2 eV) doped with F4TCNQ; α-NPD (N,N'-Bis(naphthalen-1-yl)-N,N'-bis(phenyl)-benzidine) doped with F4TCNQ. α-NPD doped with 2,2'-(perfluoronaphthalen-2,6-diylidene) dimalononitrile. The hole injection material concentrations can be selected from 1 to 20 wt.-%, more preferably from 3 wt.-% to 10 wt.-%.

Electron Blocking Layer

The electron blocking layer (EBL) may be formed as a common electron blocking layer (EBL) or as separate layers, which are not a common electron blocking layer (EBL). The EBL may be formed as a common EBL for the plurality of pixels or at least two pixels. The common EBL may extend over all pixels of the plurality of pixels or extends over at least two pixels of the plurality of pixels in the OLED display. Preferably every individual pixel may have its own EBL that may not touch EBLs of other individual pixels.

The function of an electron blocking layer (EBL) is to prevent electrons from being transferred from a light emitting layer to the hole transport layer and thereby confine electrons to the light emitting layer. The EBL may be in direct contact with the common HTL and the EML. The electron blocking layer may be a non-doped layer (or in other words, it may be free of a hole injection material) made of an organic hole transport matrix material. The composition of the organic hole transport matrix material of the common hole transport layer may be the same as the composition of the organic hole transport matrix material of the electron blocking layer. In another embodiment of the invention, the composition of both hole transport matrix materials may be different.

Thereby, efficiency, operating voltage and/or lifetime may be improved. Typically, the electron blocking layer comprises a triarylamine compound. The triarylamine compound may have a LUMO level closer to vacuum level than the LUMO level of the hole transport layer. Each compound forming the electron blocking layer may have a HOMO level, expressed in the absolute scale referring to vacuum energy level being zero, higher than a HOMO level of any compound forming the hole transport matrix material of the common hole transport layer. The electron blocking layer may have a HOMO level that is further away from vacuum level compared to the HOMO level of the hole transport layer.

The organic matrix material of the electron blocking layer may have a hole mobility which is equal to or higher than the hole mobility of the matrix material of the hole transport layer. The hole transport matrix (HTM) material of the common HTL and/or of the EBL may be selected from compounds comprising a conjugated system of delocalized electrons, the conjugated system comprising lone electron pairs of at least two tertiary amine nitrogen atoms.

If the electron blocking layer has a high triplet level, it may also be described as triplet control layer. The function of the triplet control layer is to reduce quenching of triplets if a phosphorescent green or blue light emitting layer is used. Thereby, higher efficiency of light emission from a phosphorescent light emitting layer can be achieved. The triplet control layer is selected from triarylamine compounds with a triplet level above the triplet level of the phosphorescent emitter in the adjacent light emitting layer. Suitable compounds for the triplet control layer, in particular the triarylamine compounds, are described in EP 2 722 908 A1.

The thickness of the electron blocking layer may be selected between 2 and 20 nm. The EBL may have a layer thickness of more than 30 nm, more than 50 nm, more than 70 nm, more than 100 nm, or more than 110 nm. The thickness of the EBL may be less than 200 nm, less than 170 nm, less than 140 nm, or less than 130 nm. Compared to the EBL, the common HTL may be thinner by about one order of magnitude.

The electron blocking layer may comprise a compound, wherein the compound have energies of their highest occupied molecular orbitals, expressed in the absolute scale referring to vacuum energy level being zero, calculated using the hybrid functional B3LYP with a Gaussian 6-31G* basis set as implemented in the program package TURBOMOLE V6.5, in the range from <−4.7 eV to ≥−6.0 eV, <−4.8 eV to ≥−5.5 eV, preferably <−4.9 eV to ≥−5.4 eV, more preferably from −<−5.0 eV to ≥−5.3 eV.

Photoactive Layer (PAL)

The photoactive layer converts an electrical current into photons or photons into an electrical current. The photoactive layer may be formed as a common photoactive layer or as separate layers, which are not a common photoactive layer. The PAL may be formed as a common PAL for the plurality of pixels or at least two pixels. The common PAL may extend over all pixels of the plurality of pixels or extends over at least two pixels of the plurality of pixels in the OLED display.

The PAL may be formed on the HTL by vacuum deposition, spin coating, slot-die coating, printing, casting, LB deposition, or the like. When the PAL is formed using vacuum deposition or spin coating, the conditions for deposition and coating may be similar to those for the formation of the HIL. However, the conditions for deposition and coating may vary, according to the compound that is used to form the PAL.

It may be provided that the photoactive layer does not comprise the metal compound of the present invention.

Light Emitting Layer (EML)

The EML layer may be formed as a common EML layer or as separate EML layers, which are not a common EML layer. For RGB displays it is preferred that the EML layer is formed as separate layers, which are not a common EML layer. The EML may be formed as a common EML for the plurality of pixels or at least two pixels. The common EML may extend over all pixels of the plurality of pixels or extends over at least two pixels of the plurality of pixels in the OLED display.

The EML may be formed on the HTL by vacuum deposition, spin coating, slot-die coating, printing, casting, LB deposition, or the like. When the EML is formed using vacuum deposition or spin coating, the conditions for deposition and coating may be similar to those for the formation of the HIL. However, the conditions for deposition and coating may vary, according to the compound that is used to form the EML.

The common electron transport layer may comprise an organic electron transport matrix (ETM) material. Further, the common electron transport layer may comprise one or more n-dopants-Suitable compounds for the ETM contain aromatic or heteroaromatic structural moieties, as disclosed e.g. in documents EP 1 970 371 A1 or WO 2013/079217 A1.

It may be provided that the light emitting layer does not comprise the metal compound as described in the present invention for use in HIL and/or HTL.

The light emitting layer (EML) may be formed of a combination of a host and an emitter dopant. Example of the host are Alq3, 4,4'-N,N'-dicarbazole-biphenyl (CBP), poly (n-vinyl carbazole) (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl)benzene (TPBI), 3-tert-butyl-9,10-di-2-naphthylanthracenee (TBADN), distyrylarylene (DSA) and bis(2-(2-hydroxyphenyl)benzo-thiazolate)zinc (Zn(BTZ)2).

The emitter dopant may be a phosphorescent or fluorescent emitter. Phosphorescent emitters and emitters which emit light via a thermally activated delayed fluorescence (TADF) mechanism may be preferred due to their higher efficiency. The emitter may be a small molecule or a polymer.

Examples of red emitter dopants are PtOEP, Ir(piq)3, and Btp2lr(acac), but are not limited thereto. These compounds are phosphorescent emitters; however, fluorescent red emitter dopants could also be used.

Examples of phosphorescent green emitter dopants are Ir(ppy)3 (ppy=phenylpyridine), Ir(ppy)2(acac), Ir(mpyp)3.

Examples of phosphorescent blue emitter dopants are F2Irpic, (F2ppy)2Ir(tmd) and Ir(dfppz)3 and ter-fluorene. 4,4'-bis(4-diphenyl amiostyryl)biphenyl (DPAVBi), 2,5,8,11-tetra-tert-butyl perylene (TBPe) are examples of fluorescent blue emitter dopants.

The amount of the emitter dopant may be in the range from about 0.01 to about 50 parts by weight, based on 100 parts by weight of the host. Alternatively, the light emitting layer may consist of a light-emitting polymer. The EML may have a thickness of about 10 nm to about 100 nm, for example, from about 20 nm to about 60 nm. When the thickness of the EML is within this range, the EML may have excellent light emission, without a substantial penalty in driving voltage.

Hole Blocking Layer (HBL)

The hole blocking layer (HBL) may be formed as a common hole blocking layer (HBL) or as separate hole blocking layers (HBL), which are not a common hole blocking layer (HBL). The HBL may be formed as a common HBL for the plurality of pixels or at least two pixels. The common HBL may extend over all pixels of the plurality of pixels or extends over at least two pixels of the plurality of pixels in the OLED display.

A hole blocking layer (HBL) may be formed on the EML, by using vacuum deposition, spin coating, slot-die coating, printing, casting, LB deposition, or the like, in order to prevent the diffusion of holes into the ETL. When the EML comprises a phosphorescent dopant, the HBL may have also a triplet exciton blocking function.

The HBL may also be named auxiliary ETL or a-ETL.

When the HBL is formed using vacuum deposition or spin coating, the conditions for deposition and coating may be similar to those for the formation of the HIL. However, the conditions for deposition and coating may vary, according to the compound that is used to form the HBL. Any compound that is commonly used to form a HBL may be used. Examples of compounds for forming the HBL include oxadiazole derivatives, triazole derivatives, phenanthroline derivatives and triazine derivatives.

The HBL may have a thickness in the range from about 5 nm to about 100 nm, for example, from about 10 nm to about 30 nm. When the thickness of the HBL is within this range, the HBL may have excellent hole-blocking properties, without a substantial penalty in driving voltage.

Electron Transport Layer (ETL)

The electron transport layer (ETL) may be formed as a common electron transport layer (ETL) or as separate electron transport layers (ETL), which are not a common electron transport layer (ETL).

The ETL may be formed as a common ETL for the plurality of pixels or at least two pixels. The common ETL may extend over all pixels of the plurality of pixels or extends over at least two pixels of the plurality of pixels in the OLED display.

Every individual pixel may have its own ETL that may not touch ETLs of other individual pixels.

The organic light-emitting diode according to the present invention may further comprise an electron transport layer (ETL).

According to another embodiment, the electron transport layer may further comprise an azine compound, preferably a triazine compound.

In one embodiment, wherein the electron transport layer may further comprise a dopant selected from an alkali organic complex, preferably LiQ.

The thickness of the ETL may be in the range from about 15 nm to about 50 nm, for example, in the range from about 20 nm to about 40 nm. When the thickness of the EIL is within this range, the ETL may have satisfactory electron-injecting properties, without a substantial penalty in driving voltage.

According to another embodiment, the organic light-emitting diode may further comprise a hole blocking layer and an electron transport layer, wherein the hole blocking layer and the electron transport layer comprise an azine compound. Preferably, the azine compound is a triazine compound.

Electron Injection Layer (ETL)

The EIL may be formed as a common EIL layer or as separate EIL layers, which are not a common EIL layer.

The EIL may be formed as a common EIL for the plurality of pixels or at least two pixels. The common EIL may extend over all pixels of the plurality of pixels or extends over at least two pixels of the plurality of pixels in the OLED display.

An optional EIL, which may facilitate injection of electrons from the cathode, may be formed on the ETL, preferably directly on the electron transport layer. Examples of materials for forming the EIL include lithium 8-hydroxyquinolinolate (LiQ), LiF, NaCl, CsF, Li2O, BaO, Ca, Ba, Yb, Mg which are known in the art. Deposition and coating conditions for forming the EIL are similar to those for formation of the HIL, although the deposition and coating conditions may vary, according to the material that is used to form the EIL.

The thickness of the EIL may be in the range from about 0.1 nm to about 10 nm, for example, in the range from about 0.5 nm to about 9 nm. When the thickness of the EIL is within this range, the EIL may have satisfactory electron-injecting properties, without a substantial penalty in driving voltage.

Cathode Electrode

The cathode electrode may be formed as a common cathode electrode layer or as separate cathode electrode layers, which are not a common cathode electrode layer.

The cathode may be formed as a common cathode for the plurality of pixels or at least two pixels. The common cathode may extend over all pixels of the plurality of pixels or extends over at least two pixels of the plurality of pixels in the OLED display.

The cathode electrode, also named cathode layer, is formed on the ETL or optional EIL.

The cathode can be made of a metal or a metal alloy with a low work function. Transparent cathodes made of a TCO are also well-known in the art. Preferably the cathode electrode may be formed of a metal, an alloy, an electrically conductive compound, or a mixture thereof. The cathode electrode may have a low work function. For example, the cathode electrode may be formed of lithium (Li), magnesium (Mg), aluminum (Al), aluminum (Al)-lithium (Li), calcium (Ca), barium (Ba), ytterbium (Yb), magnesium (Mg)-indium (In), magnesium (Mg)-silver (Ag), or the like. Alternatively, the cathode electrode may be formed of a transparent conductive oxide, preferably ITO or IZO.

The thickness of the cathode electrode may be in the range from about 5 nm to about 1000 nm, for example, in the range from about 10 nm to about 100 nm. When the thickness of the cathode electrode is in the range from about 5 nm to about 50 nm, the cathode electrode may be transparent or semitransparent even if formed from a metal or metal alloy.

It is to be understood that the cathode electrode is not part of an electron injection layer or the electron transport layer.

Stack of Organic Layers

The stack of organic layers may be made of organic compounds having a molecular weight of less than 2000 g/mol. In an alternative embodiment, the organic compounds may have a molecular weight of less than 1000 g/mol.

The stack of organic layers or at least one organic layer thereof that is a HIL may be formed as a common stack of organic layers or as a common HIL for the plurality of pixels or at least two pixels. The common stack of organic layers may or the HIL extend over all pixels of the plurality of pixels or extends over at least two pixels of the plurality of pixels in the OLED display.

According to one embodiment the HIL and the HTL of the stack of organic layers extend over all pixels of the plurality of pixels or extends over at least two pixels of the plurality of pixels in the OLED display.

According to one embodiment the HIL, HTL and the HBL of the stack of organic layers extend over all pixels of the plurality of pixels or extends over at least two pixels of the plurality of pixels in the OLED display.

According to one embodiment the HIL, HTL and the EBL of the stack of organic layers extend over all pixels of the plurality of pixels or extends over at least two pixels of the plurality of pixels in the OLED display.

According to one embodiment the HIL, HTL, EBL and the ETL of the stack of organic layers may extend over all pixels of the plurality of pixels or extends over at least two pixels of the plurality of pixels in the OLED display.

According to one embodiment the HIL the HTL and n-side of the stack of organic layers extend over all pixels of the plurality of pixels or extends over at least two pixels of the plurality of pixels in the OLED display.

According to one embodiment the HIL, HTL, HBL and n-side of the stack of organic layers extend over all pixels of the plurality of pixels or extends over at least two pixels of the plurality of pixels in the OLED display.

According to one embodiment the HIL, HTL, EBL and n-side of the stack of organic layers extend over all pixels of the plurality of pixels or extends over at least two pixels of the plurality of pixels in the OLED display.

According to one embodiment the HIL, HTL, EBL, ETL and n-side of the stack of organic layers may extend over all pixels of the plurality of pixels or extends over at least two pixels of the plurality of pixels in the OLED display.

Preferably every individual pixel may have its own ETL that may not touch ETLs of other individual pixels.

Preferably every individual pixel may have its own ETL that may not touch ETLs of other individual pixels.

Preferably every individual pixel may have its own EBL that may not touch EBLs of other individual pixels.

Preferably every individual pixel may have its own n-side that may not touch n-side of other individual pixels.

Method of Manufacture

Another aspect refers to a method for manufacture at least one common layer.

The method for manufacture of at least one common layer comprises, wherein the method for manufacture of at least one common layer comprises that each common layer is deposited onto the complete display area through one large mask opening in one processing step.

Hereinafter, the embodiments are illustrated in more detail with reference to examples. However, the present disclosure is not limited to the following examples. Reference will now be made in detail to the exemplary aspects.

DESCRIPTION OF THE DRAWINGS

The aforementioned components, as well as the claimed components and the components to be used in accordance with the invention in the described embodiments, are not subject to any special exceptions with respect to their size, shape, material selection and technical concept such that the selection criteria known in the pertinent field can be applied without limitations.

Additional details, characteristics and advantages of the object of the invention are disclosed in the dependent claims and the following description of the respective figures which in an exemplary fashion show preferred embodiment according to the invention. Any embodiment does not necessarily represent the full scope of the invention, however, and reference is made therefore to the claims and herein for interpreting the scope of the invention. It is to be understood that both the foregoing general description and the following detailed description are exemplary and explanatory only and are intended to provide further explanation as claimed.

FIG. 1 is a schematic sectional view of a display with two pixels and a common HIL, a common HTL and a common cathode layer;

FIG. 2 is a schematic sectional view of a test element;

FIG. 3 is a schematic sectional view of deposited layer stack.

FIG. 4 is a schematic sectional view of a test element;

FIG. 5 shows an ITO coated substrate;

FIG. 6 is a diagram of a current-voltage measurement;

FIG. 7 is an exemplary diagram of resistances;

FIG. 8 is a schematic sectional view of an organic light-emitting diode;

FIG. 9 is a schematic sectional view of an organic light-emitting diode.

Hereinafter, the FIGS. 1 to 4 are illustrated in more detail with reference to examples. However, the present disclosure is not limited to the following figures.

Herein, when a first element is referred to as being formed or disposed “on” or “onto” a second element, the first element can be disposed directly on the second element, or one or more other elements may be disposed there between. When a first element is referred to as being formed or disposed “directly on” or “directly onto” a second element, no other elements are disposed there between.

Figure 1:
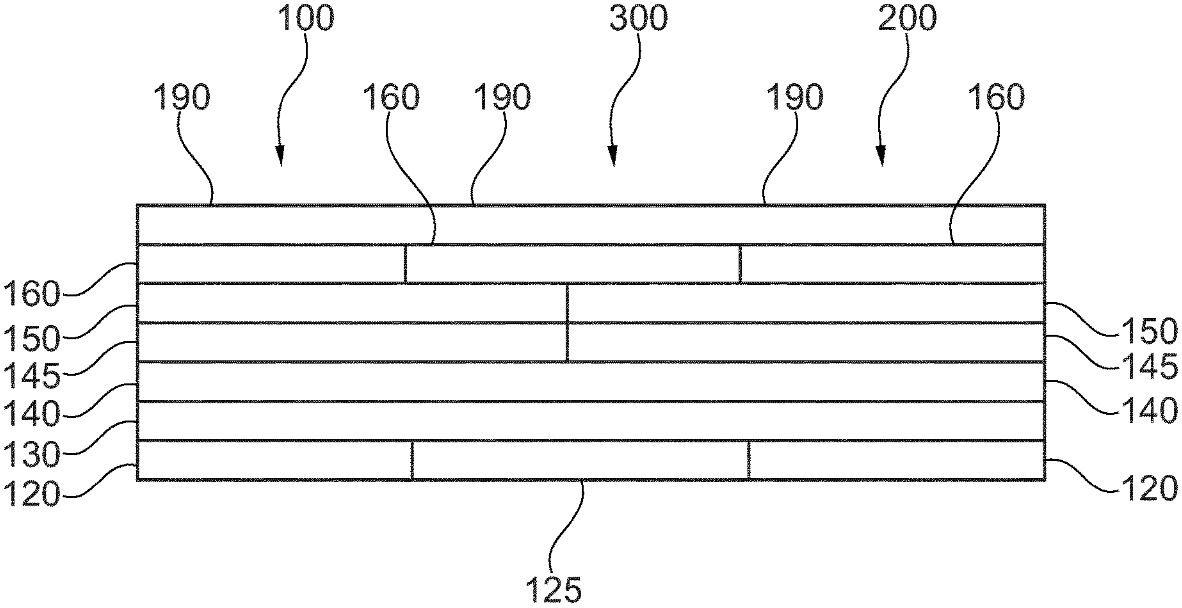
FIGS. 1 to 9

FIG. 1 is a schematic sectional view of a display with two pixels (100; 200), according to an exemplary embodiment. The first pixel (100) comprises an anode layer (120) and the second pixel comprises an anode layer (120). The first pixel (100) has its own anode layer (120) and the second pixel (200) has its own anode (120), wherein the anode (120) of the first pixel (100) does not touch the anode layer (120) of the other second pixels (200). Between anode (120) of the first pixel (100) and the anode (120) of the second pixel (200) a pixel definition layer (125) may be arranged. A common hole injection layer (HIL) (130) is disposed on the anode layers (120) extending from the first pixel (100) to the second pixel (200). Onto the common HIL (130) a common hole transport layer (HTL) (140) is disposed extending from the first pixel (100) to the second pixel (200). Onto the hole transport layer (HTL) (140), an electron blocking layer (EBL) (145) is disposed such that the first pixel (100) has its own electron blocking layer (EBL) (145) and the second pixel (200) has its own electron blocking layer (EBL) (145), the electron blocking layer (EBL) (145) of the first pixel (100) can touch the electron blocking layer (EBL) (145) of the other second pixels (200). Onto the electron blocking layer (EBL) (145), a light emitting layer (EML) (150) is disposed such that the first pixel (100) has its own light emitting layer (EML) (150) and the second pixel (200) has its own light emitting layer (EML) (150), wherein the light emitting layer (EML) (150) of the first pixel (100) can touch the light emitting layer (EML) (150) of the other second pixels (200). Onto the light emitting layer (EML) (150), an electron transport layer (ETL) (160) is disposed such that the first pixel (100) has its own electron transport layer (ETL) (160) and the second pixel (200) has its own electron transport layer (ETL) (160). Onto the electron transport layer (ETL) (160), a common cathode layer (190) is disposed extending from the first pixel (100) to the second pixel (200). Between the first pixel (100) and the second pixel (200) a separation section (300) is arranged that has no anode layer (120) but a pixel definition layer (125) function as a sheet resistance layer, which is not an anode (120).

As can be seen in FIG. 1 the separation section (300) comprises at least one layer, which is a common hole injection layer (HIL) (130) and extends as a common layer from pixel (100) through the separation section (300) to pixel (200). The separation section (300) comprises at least two layers that are an electron blocking layer (EBL) (145) and a light emitting layer (EML) (150), which each extends from the pixel (100) and pixel (200) into the separation section (300). The electron transport layer (ETL) (160) and the hole transport layer (HTL) (140) of the separation section (300), do not extend into the pixel (100) and pixel (200).

FIG. 1 is an example only and the present invention is not restricted to this embodiment. There are a plurality of layer configuration possible in which a layer for example extends from one pixel into the separation section (300) or not. Further the material composition of each non common layer of the plurality of pixels and separation sections, such as pixel (100), (200) and the separation section (300), can be selected individually different and or same.

Figure 2:
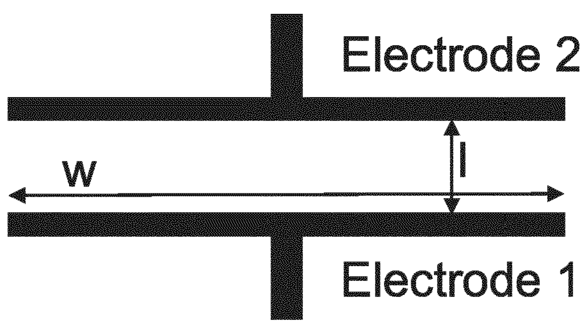

FIG. 2 shows the test element comprising 2 highly conductive electrodes with a gap "l" between the 2 highly conductive electrodes and a width "w" for the respective highly conductive electrodes.

Figure 3:
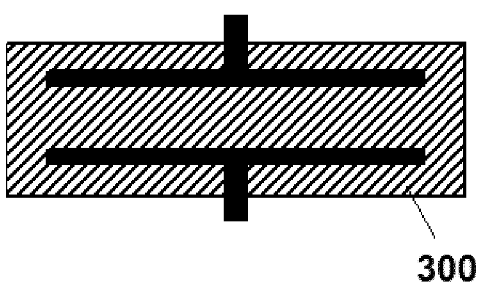

FIG. 3 shows schematic representation of a deposited layer stack on a test element group for determining the sheet resistance. The test element consists of a channel (test element). The deposition layer (300) lies on top of the electrode.

Figure 4:
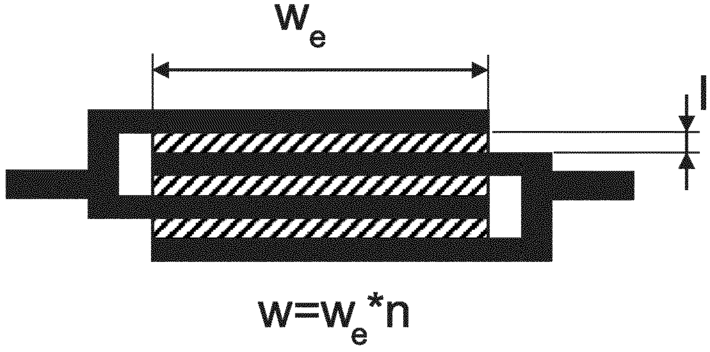

FIG. 4 shows the test element comprising 2 highly conductive electrodes with interdigitated finger pattern with a gap "l" between electrode fingers and total width "w" as product of interdigitation width "we" and number of interdigitation areas.

Hereinafter, the embodiments are illustrated in more detail with reference to examples. However, the present disclosure is not limited to the following examples.

Figure 5:
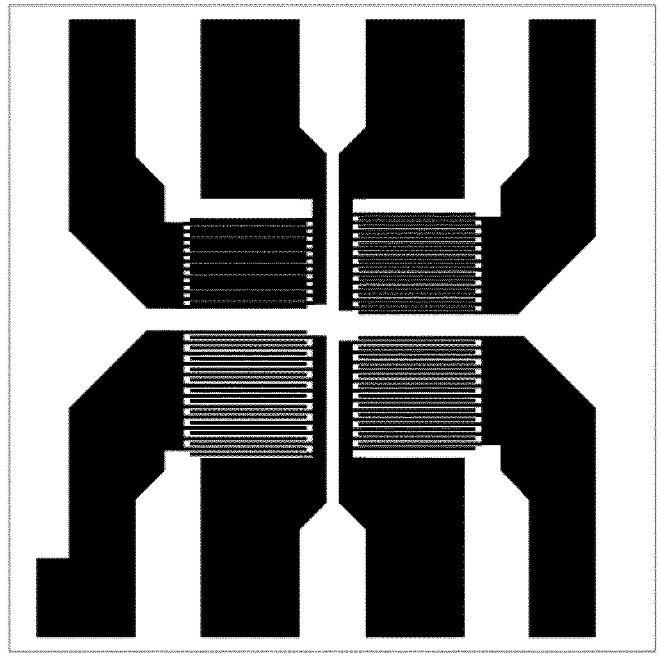

FIG. 5 shows an ITO coated substrate with 90 nm ITO with 10 Ohm/sq sheet resistance patterned with electrode pairs with 4 different channel lengths combined on one substrate with 25×25 $mm^2$ dimension.

Figure 6:
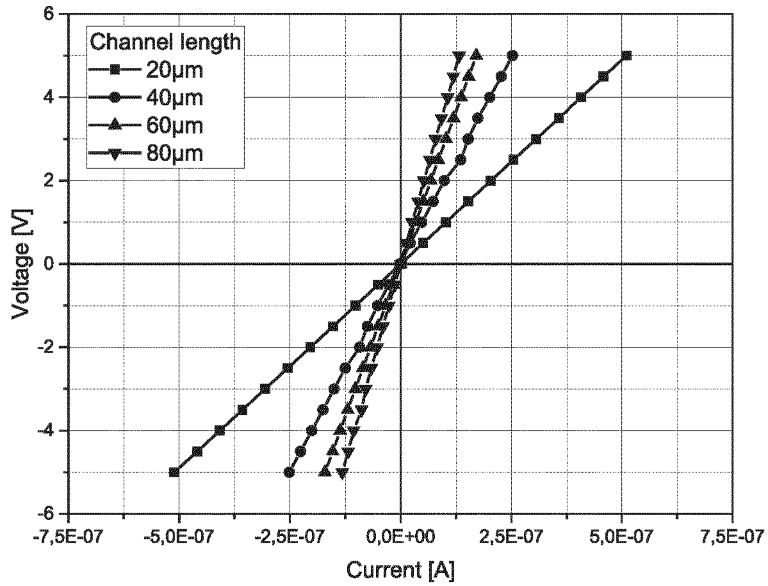

FIG. 6 shows an exemplary diagram of a current-voltage measurement on a substrate shown in FIG. 5.

Figure 7:
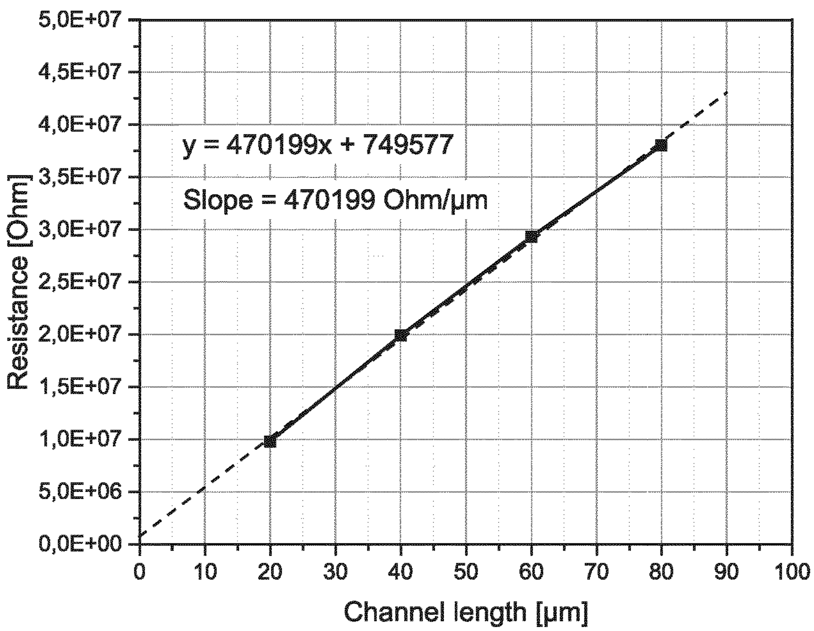

FIG. 7 shows an exemplary diagram of resistances derived from current-voltage measurement displayed in FIG. 6 plotted over corresponding channel length and calculation of slope thereof.

Figure 8:
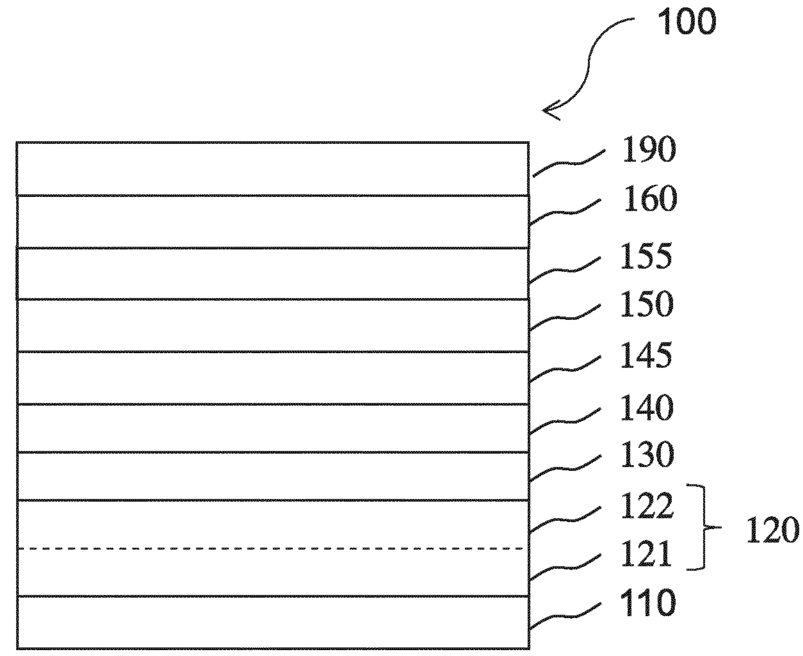

FIG. 8 is a schematic sectional view of an organic light-emitting diode (OLED) 100, according to an exemplary embodiment of the present invention. The OLED 100 includes a substrate (110), an anode layer (120) that comprises a first anode sub-layer (121) and a second anode sub-layer (122), a semiconductor layer comprising compound of Formula (I) (130), a hole transport layer (HTL) (140), an electron blocking layer (EBL) (145), an emission layer (EML) (150), a hole blocking layer (EBL) (155), an electron transport layer (ETL) (160) and a cathode layer (190). The layers are disposed exactly in the order as mentioned before.

Figure 9:
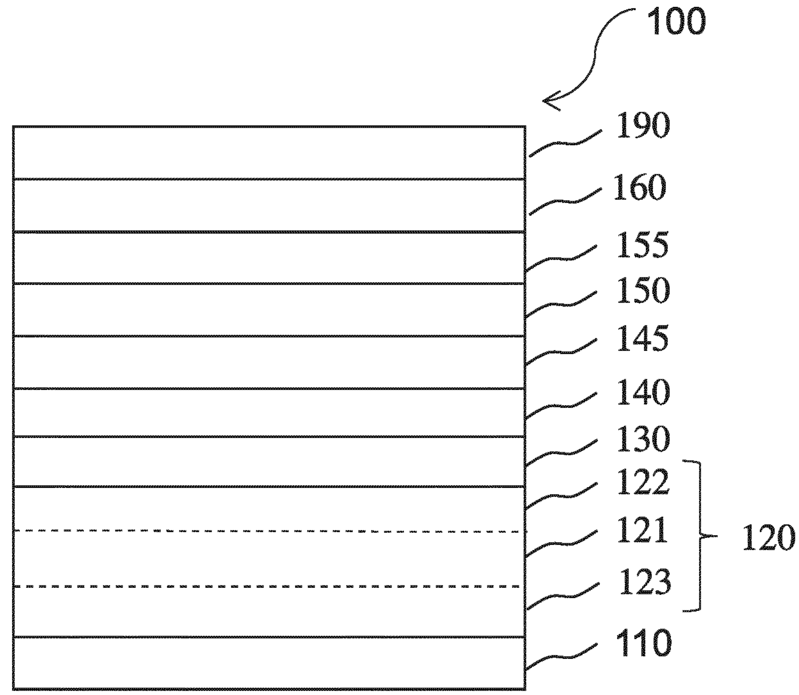

FIG. 9 is a schematic sectional view of an organic light-emitting diode (OLED) 100, according to an exemplary embodiment of the present invention. The OLED 100 includes a substrate (110), an anode layer (120) that comprises a first anode sub-layer (121), a second anode sub-layer (122) and a third anode sub-layer (123), a semiconductor layer comprising compound of Formula (I) (130), a hole transport layer (HTL) (140), an electron blocking layer (EBL) (145), an emission layer (EML) (150), a hole blocking layer (EBL) (155), an electron transport layer (ETL) (160) and a cathode layer (190). The layers are disposed exactly in the order as mentioned before.

Hereinafter, the embodiments are illustrated in more detail with reference to examples. However, the present disclosure is not limited to the following examples.

DETAILED DESCRIPTION

The invention is furthermore illustrated by the following examples which are illustrative only and non-binding.

The compound may be prepared as described in the literature or alternative compounds may be prepared following similar compounds as described in the literature.

Calculated HOMO and LUMO

The HOMO and LUMO are calculated with the program package TURBOMOLE V6.5 (TURBOMOLE GmbH, Litzenhardtstrasse 19, 76135 Karlsruhe, Germany). The optimized geometries and the HOMO and LUMO energy levels of the molecular structures are determined by applying the hybrid functional B3LYP with a 6-31G* basis set in the gas phase. If more than one conformation is viable, the conformation with the lowest total energy is selected. The HOMO and LUMO levels are recorded in electron volt (eV).

Transmission Line Method Described in More Detail

According the present invention the transmission line method for measuring the sheet resistance the first common semiconductor layer comprising the organic p-dopant and the second common semiconductor layer on the first common semiconductor can be carried out as described below.

Substrate and Sample Preparation

The ITO coated substrates with 90 nm ITO with 10 Ohm/sq sheet resistance were patterned with interdigitated finger structure according to FIG. 4. 12 ITO fingers on both electrodes form a total of 23 conductive areas: n=23. Interdigitation length $w_e$ was 4.5 mm. Thus total channel width was 103.5 mm. Channel length w was varied between 20 and 80 μm in 20 μm steps. Electrode pairs with 4 different channel lengths were combined on one substrate with 25×25 $mm^2$ dimension like displayed in FIG. 5. Organic layers were deposited on the substrate covering the complete interdigitated finger pattern. On the substrates a first common semiconductor layer comprises at least one hole injection material with a 10 nm thickness, for example the first common semiconductor layer is a hole injection layer that consists of a doped covalent matrix compound, suitable covalent matrix compounds are described in the specification, was deposited by co-evaporation. The temperature range depends on the material and is limited by the vaporization temperature at which vaporization begins and the decomposition temperature. These values are material parameters and are different for each material. The values are typically between 50° C. and 500° C., mostly between 150° C. and 350° C. For example, the covalent matrix compound deposition took place at constant rate of 1 Å/s (Angström per second) with evaporation source temperature of 272° C. The hole injection material source was for example operated with 0.068 Å/s at 174° C. On this layer the second common semiconductor layer, which is for example a common hole transport layer or a common electron blocking layer, wherein a hole transport layer is preferred, with a thickness of 128 nm was deposited at a deposition rate of 2 Å/s and temperature of 280° C. Chamber pressure was 3e-7 mbar during the whole deposition process. However, as explained above, the evaporation temperatures used depend on the vaporization temperature at which vaporization begins and the decomposition temperature. Evaporation temperatures for organic materials are material dependent and usually between 50° C. and 500° C. The obtained substrate layer device were encapsulated in a Nitrogen filled glovebox using glass lids with integrated desiccant, to prevent sample degradation, after organic layer deposition.

According the present invention the transmission line method for measuring the sheet resistance the common first semiconductor layer comprising the organic p-dopant, the common second semiconductor layer on the common first semiconductor and the common third semiconductor layer on the common third semiconductor layer can be carried out as described below.

The ITO coated substrates with 90 nm ITO with 10 Ohm/sq sheet resistance were patterned with interdigitated finger structure according to FIG. 4. 12 ITO fingers on both electrodes form a total of 23 conductive areas: n=23. Interdigitation length $w_e$ was 4.5 mm. Thus total channel width was 103.5 mm. Channel length w was varied between 20 and 80 μm in 20 μm steps. Electrode pairs with 4 different channel lengths were combined on one substrate with 25×25 $mm^2$ dimension like displayed in FIG. 5. Organic layers were deposited on the substrate covering the complete interdigitated finger pattern. On the substrates a first common semiconductor layer comprises at least one hole injection material with a 10 nm thickness, for example the first common semiconductor layer is a hole injection layer that consists of a doped covalent matrix compound, suitable covalent matrix compounds are described in the specification, was deposited by co-evaporation. The temperature range depends on the material and is limited by the vaporization temperature at which vaporization begins and the decomposition temperature. These values are material parameters and are different for each material. The values are typically between 50° C. and 500° C., mostly between 150° C. and 350° C. For example, the covalent matrix compound deposition took place at constant rate of 1 Å/s (Angström per second) with evaporation source temperature of 272° C. The hole injection material source was for example operated with 0.068 Å/s at 174° C. On this layer the second common semiconductor layer, which is for example a common hole transport layer or a common electron blocking layer, wherein a hole transport layer is preferred, with a thickness of 128 nm was deposited at a deposition rate of 2 Å/s and temperature of 280° C. On this layer the third common semiconductor layer, which is for example a common electron-blocking layer, with a thickness of 5 nm was deposited at a deposition rate of 1 Å/s and temperature of 244° C. Chamber pressure was 3e-7 mbar during the whole deposition process. However, as explained above, the evaporation temperatures used depend on the vaporization temperature at which vaporization begins and the decomposition temperature. Evaporation temperatures for organic materials are material dependent and usually between 50° C. and 500° C. The obtained substrate layer device were encapsulated in a Nitrogen filled glovebox using glass lids with integrated desiccant, to prevent sample degradation, after organic layer deposition.

According the present invention the transmission line method for measuring the sheet resistance the common first semiconductor layer comprising the organic p-dopant, the common second semiconductor layer on the common first semiconductor, the common third semiconductor layer on the common second semiconductor layer, and a common light-emitting layer (EML) on the common third semiconductor layer can be carried out as described below.

The ITO coated substrates with 90 nm ITO with 10 Ohm/sq sheet resistance were patterned with interdigitated finger structure according to FIG. 4. 12 ITO fingers on both electrodes form a total of 23 conductive areas: n=23. Interdigitation length $w_e$ was 4.5 mm. Thus total channel width was 103.5 mm. Channel length w was varied between 20 and 80 μm in 20 μm steps. Electrode pairs with 4 different channel lengths were combined on one substrate with 25×25 $mm^2$ dimension like displayed in FIG. 5. Organic layers were deposited on the substrate covering the complete interdigitated finger pattern. On the substrates a first common semiconductor layer comprises at least one hole injection material with a 10 nm thickness, for example the first common semiconductor layer is a hole injection layer that consists of a doped covalent matrix compound, suitable covalent matrix compounds are described in the specification, was deposited by co-evaporation. The temperature range depends on the material and is limited by the vaporization temperature at which vaporization begins and the decomposition temperature. These values are material parameters and are different for each material. The values are typically between 50° C. and 500° C., mostly between 150° C. and 350° C. For example, the covalent matrix compound deposition took place at constant rate of 1 Å/s (Angström per second) with evaporation source temperature of 272° C. The hole injection material source was for example operated with 0.068 Å/s at 174° C. On this layer the second common semiconductor layer, which is for example a common hole transport layer or a common electron blocking layer, wherein a hole transport layer is preferred, with a thickness of 128 nm was deposited at a deposition rate of 2 Å/s and temperature of 280° C. On this layer the third common semiconductor layer, which is for example a common electron-blocking layer, with a thickness of 5 nm was deposited at a deposition rate of 1 Å/s and temperature of 244° C. On this layer the emission layer, which is for example a blue emitting layer, with a thickness of 20 nm was deposited at a deposition rate of 1 Å/s and a temperature of 183° C. for the host compound and at a deposition rate of 0.03 Å/s and a temperature of 197° C. for the emitter dopant. Chamber pressure was 3e-7 mbar during the whole deposition process. However, as explained above, the evaporation temperatures used depend on the vaporization temperature at which vaporization begins and the decomposition temperature. Evaporation temperatures for organic materials are material dependent and usually between 50° C. and 500° C. The obtained substrate layer device were encapsulated in a Nitrogen filled glovebox using glass lids with integrated desiccant, to prevent sample degradation, after organic layer deposition.

General Procedure for Fabrication of OLEDs

For Examples 1 and 2 and Comparative Example 1, a glass substrate with an anode layer comprising a first anode sub-layer of 120 nm Ag, a second anode sub-layer of 8 nm ITO and a third anode sub-layer of 10 nm ITO was cut to a size of 50 mm×50 mm×0.7 mm, ultrasonically washed with water for 60 minutes and then with isopropanol for 20 minutes.

Then, substantially covalent matrix compound and a hole injection material were co-deposited in vacuum on the anode layer, to form a hole injection layer (HIL). Then, the substantially covalent matrix compound was vacuum deposited on the HIL, to form a HTL having a thickness of 128 nm. The formula of the substantially covalent matrix compound in the HTL was identical to the substantially covalent matrix compound used in the HIL.

Then was vacuum deposited on the HTL, to form an electron blocking layer (EBL) having a thickness of 5 nm.

Then 97 vol.-% H09 (Sun Fine Chemicals, Korea) as EML host and 3 vol.-% BD200 (Sun Fine Chemicals, Korea) as fluorescent blue emitter dopant were deposited on the EBL, to form a blue-emitting first emission layer (EML) with a thickness of 20 nm.

Then a hole blocking layer was formed with a thickness of 5 nm by depositing 2-(3'-(9,9-dimethyl-9H-fluoren-2-yl)-[1,1'-biphenyl]-3-yl)-4,6-diphenyl-1,3,5-triazine on the emission layer EML.

Then the electron transporting layer having a thickness of 31 nm was formed on the hole blocking layer by depositing 50 wt.-% 4'-(4-(4-(4,6-diphenyl-1,3,5-triazin-2-yl)phenyl)naphthalen-1-yl)-[1,1'-biphenyl]-4-carbonitrile and 50 wt.-% of LiQ.

Then the electron injection layer having a thickness of 2 nm was formed on the electron transporting layer by depositing Ytterbium at a rate of 0.01 to 1 Å/s at $10^{-7}$ mbar.

Then Ag:Mg (90:10 vol.-%) was evaporated at a rate of 0.01 to 1 Å/s at $10^{-7}$ mbar to form a cathode layer with a thickness of 100 nm on the electron injection layer.

The OLED stack is protected from ambient conditions by encapsulation of the device with a glass slide. Thereby, a cavity is formed, which includes a getter material for further protection.

To assess the performance of the inventive examples compared to the prior art, the current efficiency is measured at 20° C. The current-voltage characteristic is determined using a Keithley 2635 source measure unit, by sourcing an operating voltage U in V and measuring the current in mA flowing through the device under test. The voltage applied to the device is varied in steps of 0.1V in the range between 0V and 10V. Likewise, the luminance-voltage characteristics and CIE coordinates are determined by measuring the luminance in cd/$m^2$ using an Instrument Systems CAS-140CT array spectrometer (calibrated by Deutsche Akkreditierungsstelle (DAkkS)) for each of the voltage values.

Lifetime LT of the device is measured at ambient conditions (20° C.) and 30 mA/$cm^2$, using a Keithley 2400 source meter, and recorded in hours. The brightness of the device is measured using a calibrated photo diode. The lifetime LT is defined as the time till the brightness of the device is reduced to 97% of its initial value.

To determine the voltage stability over time U(100 h)−(1 h), a current density of at 30 mA/$cm^2$ was applied to the device. The operating voltage was measured after 1 hour and after 50 hours, followed by calculation of the voltage stability for the time period of 1 hour to 50 hours.

Table 2 shows HTL matrix materials that more preferred and some are used in Table 4.

TABLE 2

| HTL matrix materials |
| --- |
| F3<br>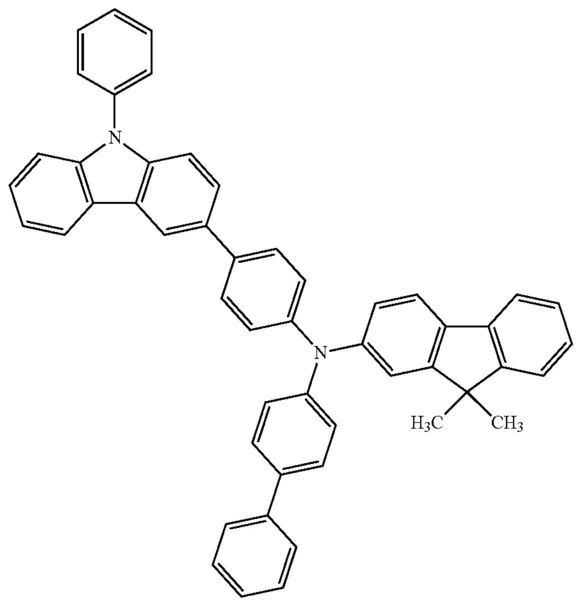 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21] |

TABLE 2-continued
| HTL matrix materials | |
|---|---|
| 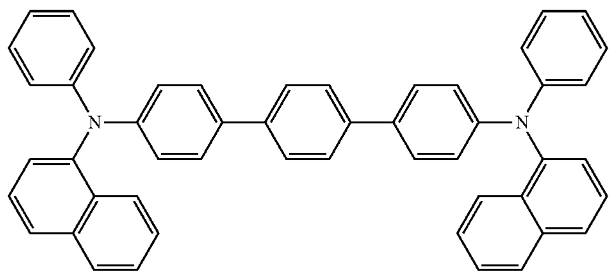 [SMILES: c1ccc(N(c2ccc(-c3ccc(-c4ccc(N(c5ccccc5)c5cccc6ccccc56)cc4)cc3)cc2)c2cccc3ccccc23)cc1] | F2 |
| 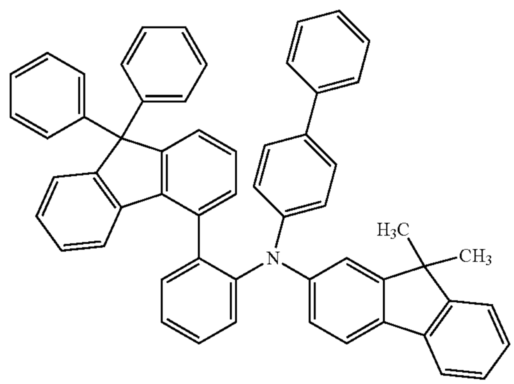 [SMILES: CC1(C)c2ccccc2-c2ccc(N(c3ccc(-c4ccccc4)cc3)c3ccccc3-c3cccc4c3-c3ccccc3C4(c3ccccc3)c3ccccc3)cc21] | F9 |
| 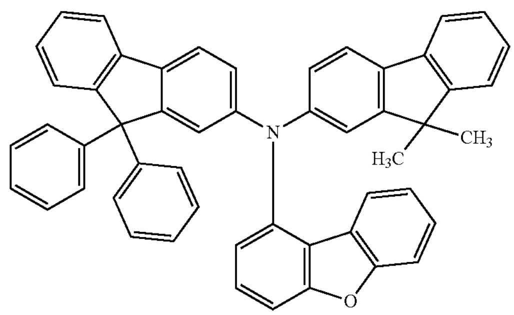 [SMILES: CC1(C)c2ccccc2-c2ccc(N(c3ccc4c(c3)C(c3ccccc3)(c3ccccc3)c3ccccc3-4)c3cccc4oc5ccccc5c34)cc21] | F4 |
| 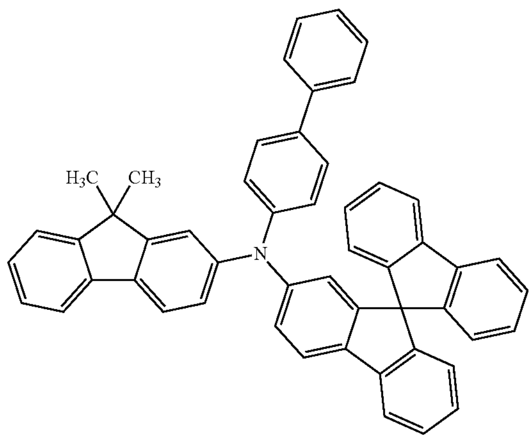 [SMILES: CC1(C)c2ccccc2-c2ccc(N(c3ccc(-c4ccccc4)cc3)c3ccc4c(c3)C3(c5ccccc5-c5ccccc53)c3ccccc3-4)cc21] | F21 |

TABLE 2-continued
| HTL matrix materials | |
|---|---|
| 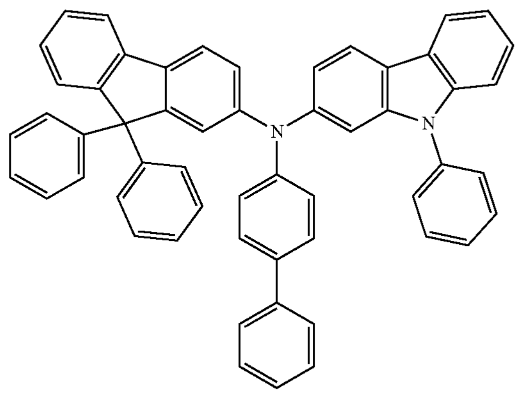 [SMILES: c1ccc(-c2ccc(N(c3ccc4c(c3)C(c3ccccc3)(c3ccccc3)c3ccccc3-4)c3ccc4c5ccccc5n(-c5ccccc5)c4c3)cc2)cc1] | F19 |
| 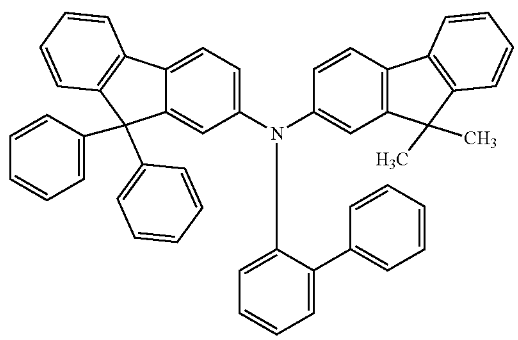 [SMILES: CC1(C)c2ccccc2-c2ccc(N(c3ccc4c(c3)C(c3ccccc3)(c3ccccc3)c3ccccc3-4)c3ccccc3-c3ccccc3)cc21] | F5 |
| 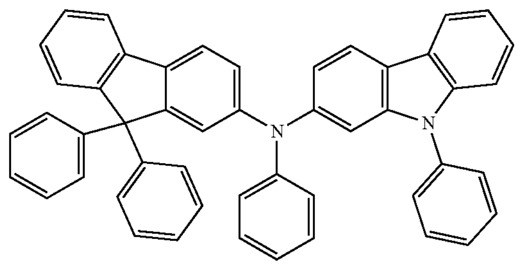 [SMILES: c1ccc(N(c2ccc3c(c2)C(c2ccccc2)(c2ccccc2)c2ccccc2-3)c2ccc3c4ccccc4n(-c4ccccc4)c3c2)cc1] | F18 |
| 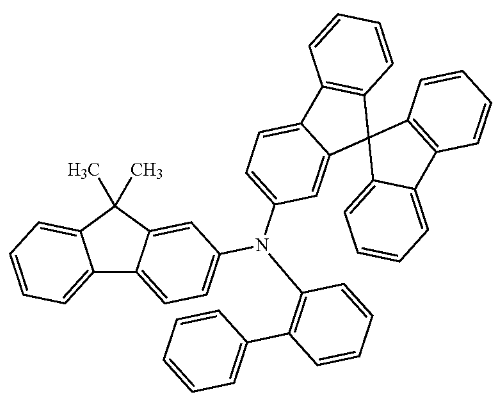 [SMILES: CC1(C)c2ccccc2-c2ccc(N(c3ccc4c(c3)C3(c5ccccc5-c5ccccc53)c3ccccc3-4)c3ccccc3-c3ccccc3)cc21] | F11 |

TABLE 2-continued
| HTL matrix materials | |
|---|---|
| 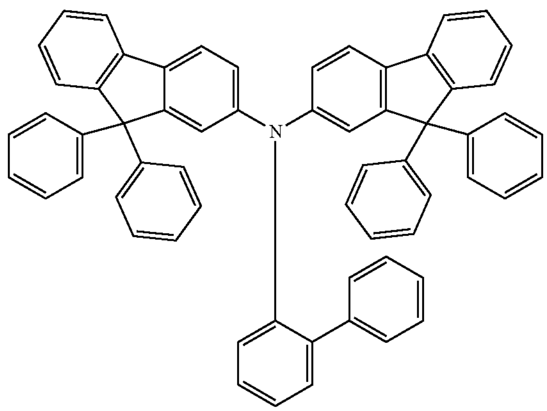 [SMILES: c1ccc(-c2ccccc2N(c2ccc3c(c2)C(c2ccccc2)(c2ccccc2)c2ccccc2-3)c2ccc3c(c2)C(c2ccccc2)(c2ccccc2)c2ccccc2-3)cc1] | F6 |
| 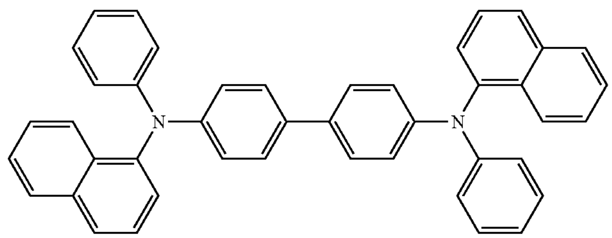 [SMILES: c1ccc(N(c2ccc(-c3ccc(N(c4ccccc4)c4cccc5ccccc45)cc3)cc2)c2cccc3ccccc23)cc1] | F1 |
| 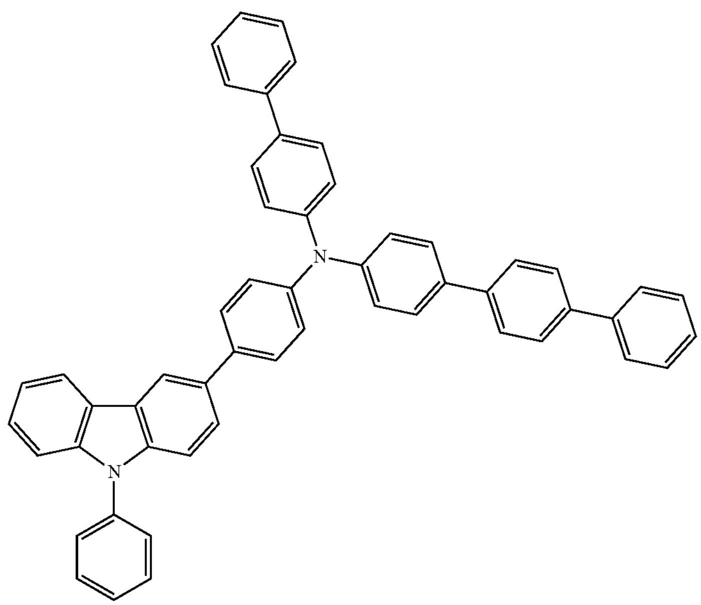 [SMILES: c1ccc(-c2ccc(-c3ccc(N(c4ccc(-c5ccccc5)cc4)c4ccc(-c5ccc6c(c5)c5ccccc5n6-c5ccccc5)cc4)cc3)cc2)cc1] | F20 |

Table 3 shows EBL matrix materials that are more preferred and some are used in Table 4.
TABLE 3
| EBL matrix materials |
| --- |
| 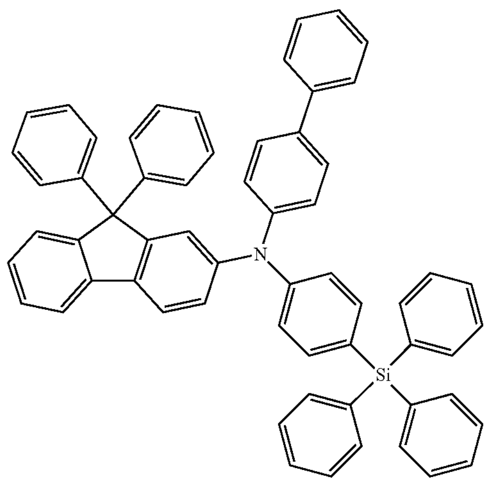 F22 |
| 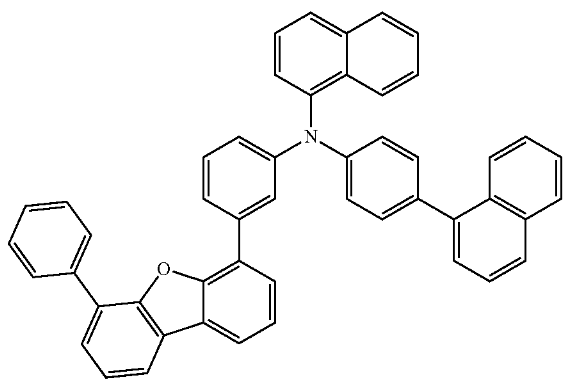 F23 |
| 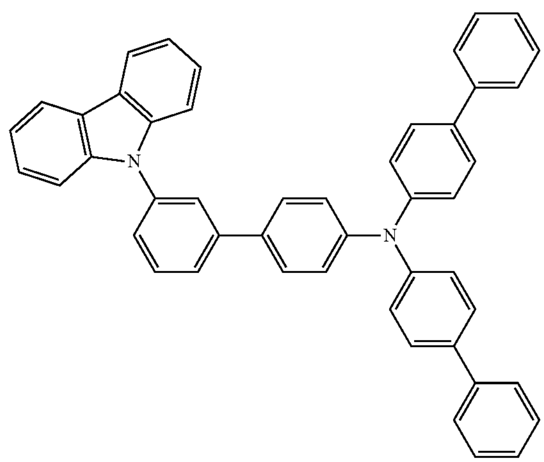 F24 |

TABLE 3-continued
| EBL matrix materials |
| --- |
| 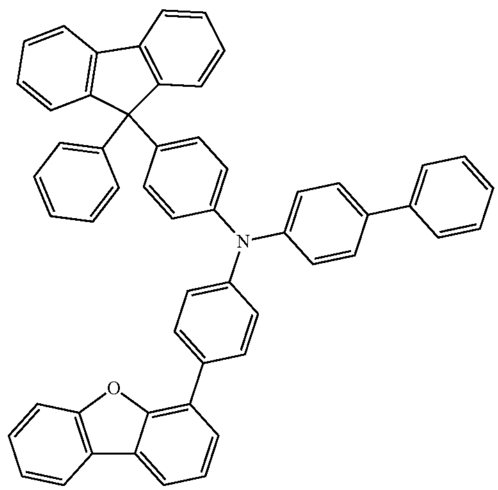 F25 |

TABLE 4
|  | Structure of HIL | HIL (p-dopant concentration [wt %]) | HIL (Host) | HIL Thickness [nm] | HTL | EBL | Rs of HIL + HTL [GΩ/s]** | Rs of HIL, HTL, and EBL [GΩ/s]** | Rs of HIL, HTL, EBL, EML [GΩ/s]** | Voltage [V] at 15 mA/cm | EQE [%] at 15 mA/cm | LT97 at 30 mA/cm |
|---|---|---|---|---|---|---|---|---|---|---|---|---|
| Comparative example 1 | 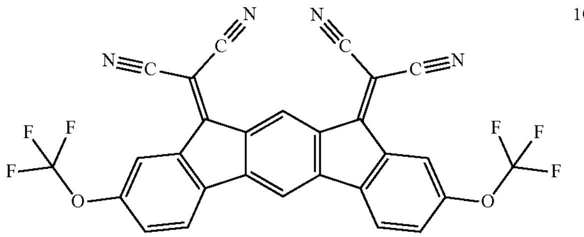 H1 | 100 wt % | — | 10 | F3 | F21 | 2 | 2 | 2 | 3.99 | 13.6 | 100 |
| Comparative example 2 | 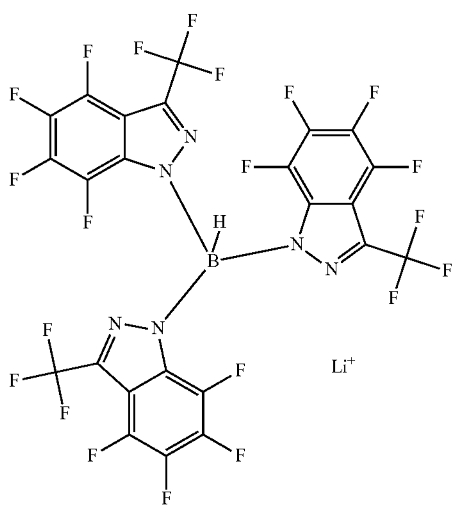 H2 | 100 wt % | — | 1 | F3 | F21 | 14 | 14 | 14 | 4.02 | 15.1 | 44 |

TABLE 4-continued
| | Structure of HIL | HIL (p-dopant concen-tration [wt %]) | HIL (Host) | HIL Thickness [nm] | HTL | EBL | Rs of HIL + HTL [GΩ/s]** | Rs of HIL, HTL, and EBL [GΩ/s]** | Rs of HIL, HTL, EBL, EML [GΩ/s]** | Voltage [V] at 15 mA/cm | EQE [%] at 15 mA/cm | LT97 at 30 mA/cm |
|---|---|---|---|---|---|---|---|---|---|---|---|---|
| Prior art | 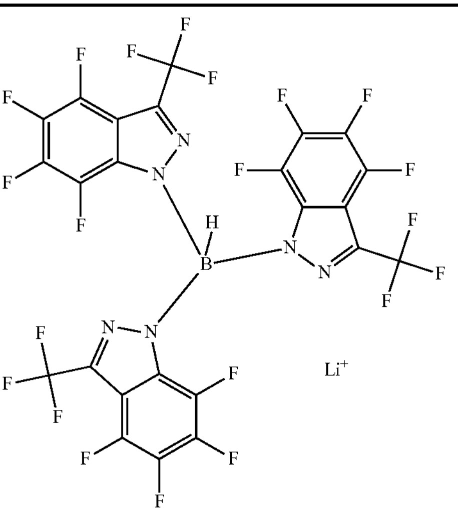 | 100 wt % | — | 10 | F3 | — | 19 | — | — | — | — | — |

TABLE 4-continued
| | Structure of HIL | HIL (p-dopant concen-tration [wt %]) | HIL (Host) | HIL Thickness [nm] | HTL | EBL | Rs of HIL + HTL [GΩ/s]** | Rs of HIL, HTL, and EBL [GΩ/s]** | Rs of HIL, HTL, EBL, EML [GΩ/s]** | Voltage [V] at 15 mA/cm | EQE [%] at 15 mA/cm | LT97 at 30 mA/cm |
|---|---|---|---|---|---|---|---|---|---|---|---|---|
| Inventive example 1 | 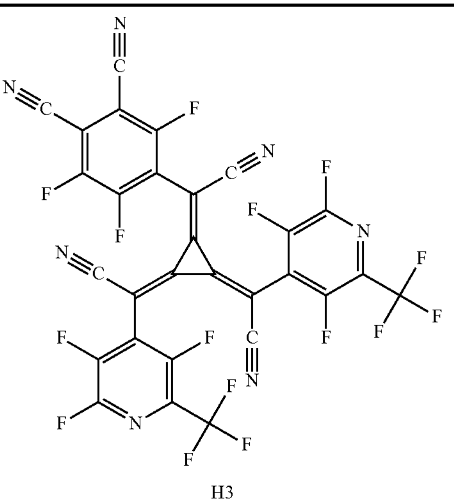 H3 | 2.9 wt % | F9 | 10 | F9 | F22 | 958 | 952 | 949 | 3.84 | 12.4 | 224 |

TABLE 4-continued
| | Structure of HIL | HIL (p-dopant concen-tration [wt %]) | HIL (Host) | HIL Thickness [nm] | HTL | EBL | Rs of HIL + HTL [GΩ/s]** | Rs of HIL, HTL, and EBL [GΩ/s]** | Rs of HIL, HTL, EBL, EML [GΩ/s]** | Voltage [V] at 15 mA/cm | EQE [%] at 15 mA/cm | LT97 at 30 mA/cm |
|---|---|---|---|---|---|---|---|---|---|---|---|---|
| Inventive example 2 | 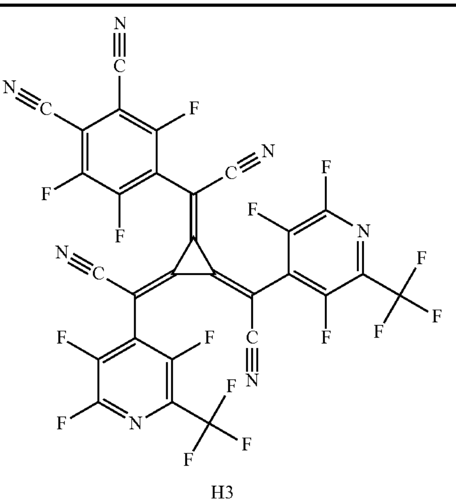 H3 | 2 wt % | F5 | 10 | F5 | F21 | 386 | 383 | 380 | 3.70 | 13.8 | 129 |

TABLE 4-continued
| | Structure of HIL | HIL (p-dopant concen-tration [wt %]) | HIL (Host) | HIL Thickness [nm] | HTL | EBL | Rs of HIL + HTL [GΩ/s]** | Rs of HIL, HTL, and EBL [GΩ/s]** | Rs of HIL, HTL, EBL, EML [GΩ/s]** | Voltage [V] at 15 mA/cm | EQE [%] at 15 mA/cm | LT97 at 30 mA/cm |
|---|---|---|---|---|---|---|---|---|---|---|---|---|
| Inventive example 3 | 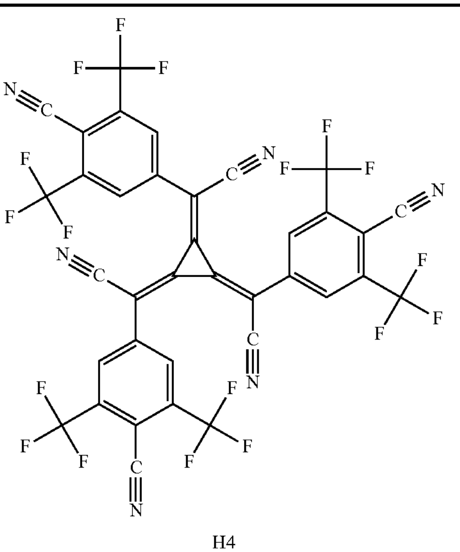 H4 | 1.9 wt % | F9 | 10 | F9 | F22 | 5481 | 5474 | 5470 | 3.85 | 12.6 | 182 |

TABLE 4-continued
| | Structure of HIL | HIL (p-dopant concen-tration [wt %]) | HIL (Host) | HIL Thickness [nm] | HTL | EBL | Rs of HIL + HTL [GΩ/s]** | Rs of HIL, HTL, and EBL [GΩ/s]** | Rs of HIL, HTL, EBL, EML [GΩ/s]** | Voltage [V] at 15 mA/cm | EQE [%] at 15 mA/cm | LT97 at 30 mA/cm |
|---|---|---|---|---|---|---|---|---|---|---|---|---|
| Inventive example 4 | 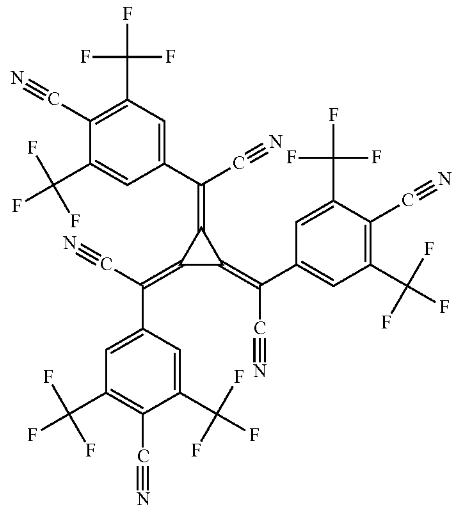 H4 | 1.8 wt % | F5 | 10 | F5 | F21 | 96 | 96 | 96 | 3.68 | 13.8 | 134 |
| Inventive example 5 | 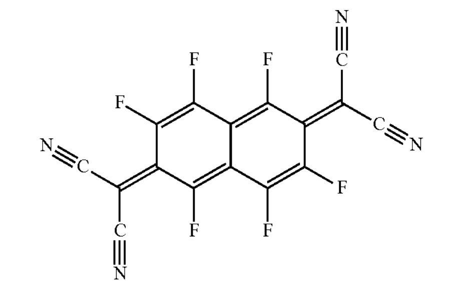 H5 | 10 wt % | F19 | 10 | F19 | F21 | 319 | 316 | 314 | 3.82 | 13.8 | 45 |

TABLE 4-continued
| | Structure of HIL | HIL (p-dopant concen-tration [wt %]) | HIL (Host) | HIL Thickness [nm] | HTL | EBL | Rs of HIL + HTL [GΩ/s]** | Rs of HIL, HTL, and EBL [GΩ/s]** | Rs of HIL, HTL, EBL, EML [GΩ/s]** | Voltage [V] at 15 mA/cm | EQE [%] at 15 mA/cm | LT97 at 30 mA/cm |
|---|---|---|---|---|---|---|---|---|---|---|---|---|
| Inventive example 6 | 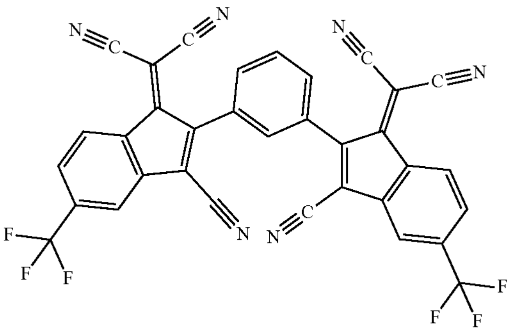 H6 | 10.6 wt % | F3 | 10 | F3 | F21 | 298474 | 296470 | 295477 | 3.85 | 14.7 | 292 |
| Inventive example 7 | 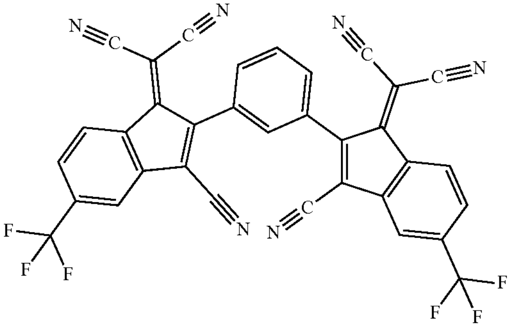 H6 | 100 wt % | — | 2 | F3 | F21 | 25981 | 25731 | 25619 | 3.89 | 15.0 | 81 |

TABLE 4-continued
| | Structure of HIL | HIL (p-dopant concen-tration [wt %]) | HIL (Host) | HIL Thickness [nm] | HTL | EBL | Rs of HIL + HTL [GΩ/s]** | Rs of HIL, HTL, and EBL [GΩ/s]** | Rs of HIL, HTL, EBL, EML [GΩ/s]** | Voltage [V] at 15 mA/cm | EQE [%] at 15 mA/cm | LT97 at 30 mA/cm |
|---|---|---|---|---|---|---|---|---|---|---|---|---|
| Inventive example 8 | 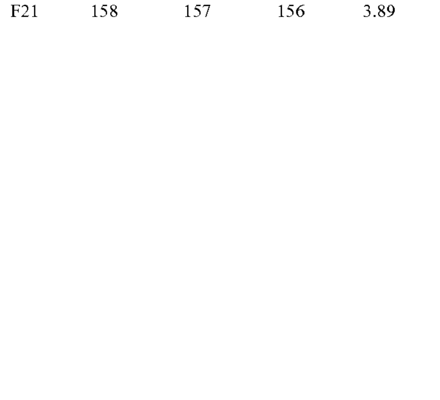 H7 | 100 wt % | — | 5.1 | F3 | F21 | 158 | 157 | 156 | 3.89 | 14.0 | 88 |
| Inventive example 9 | 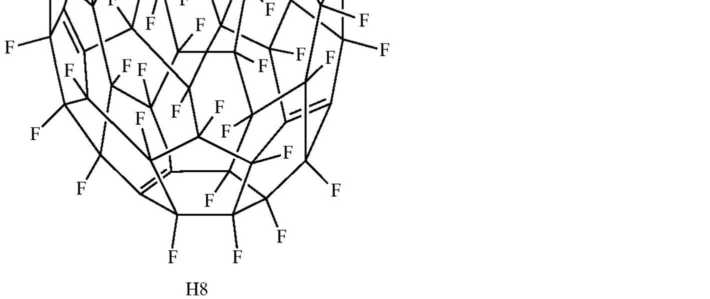 H8 | 1.69 wt % | F18 | 10 | F18 | F23 | 556 | 555 | 553 | 3.61 | 19.8 | 74 |

TABLE 4-continued
| | Structure of HIL | HIL (p-dopant concen-tration [wt %]) | HIL (Host) | HIL Thickness [nm] | HTL | EBL | Rs of HIL + HTL [GΩ/s]** | Rs of HIL, HTL, and EBL [GΩ/s]** | Rs of HIL, HTL, EBL, EML [GΩ/s]** | Voltage [V] at 15 mA/cm | EQE [%] at 15 mA/cm | LT97 at 30 mA/cm |
|---|---|---|---|---|---|---|---|---|---|---|---|---|
| Inventive example 10 | 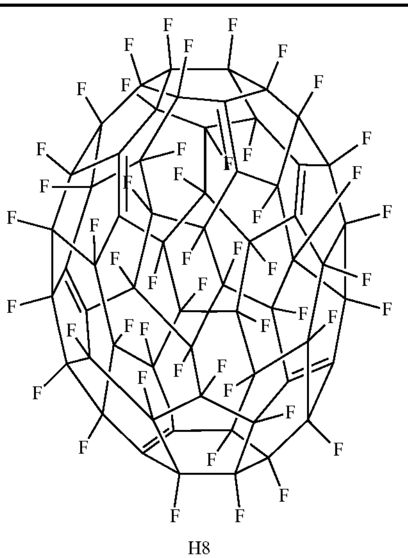 H8 | 8.19 wt % | F9 | 10 | F9 | F23 | 236 | 234 | 232 | 3.68 | 17.8 | 76 |

TABLE 4-continued
| | Structure of HIL | HIL (p-dopant concen-tration [wt %]) | HIL (Host) | HIL Thickness [nm] | HTL | EBL | Rs of HIL + HTL [GΩ/s]** | Rs of HIL, HTL, and EBL [GΩ/s]** | Rs of HIL, HTL, EBL, EML [GΩ/s]** | Voltage [V] at 15 mA/cm | EQE [%] at 15 mA/cm | LT97 at 30 mA/cm |
|---|---|---|---|---|---|---|---|---|---|---|---|---|
| Inventive example 11 | 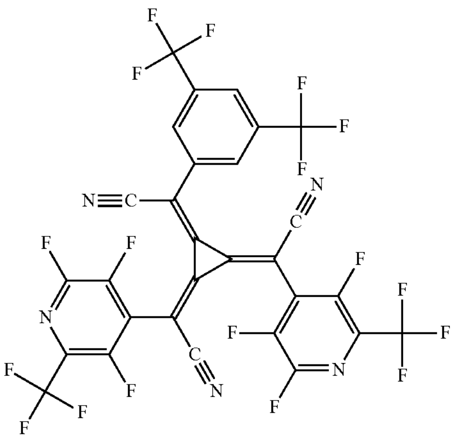 H9 | 5 wt % | F11 | 11 | F11 | F23 | 257 | 255 | 254 | 3.72 | 13.0 | 217 |
| Inventive example 12 | 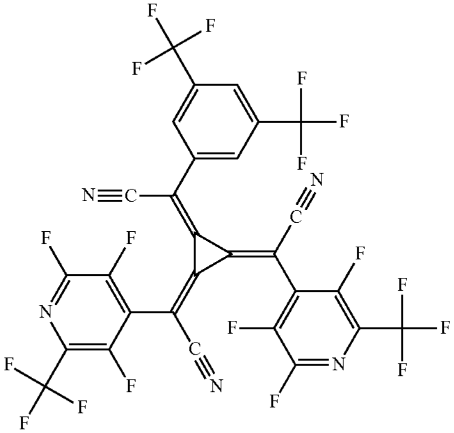 H9 | 9.7 wt % | F5 | 10 | F6 | F23 | 555 | 553 | 549 | 3.88 | 12.8 | 81 |

TABLE 4-continued
| | Structure of HIL | HIL (p-dopant concen-tration [wt %]) | HIL (Host) | HIL Thickness [nm] | HTL | EBL | Rs of HIL + HTL [GΩ/s]** | Rs of HIL, HTL, and EBL [GΩ/s]** | Rs of HIL, HTL, EBL, EML [GΩ/s]** | Voltage [V] at 15 mA/cm | EQE [%] at 15 mA/cm | LT97 at 30 mA/cm |
|---|---|---|---|---|---|---|---|---|---|---|---|---|
| Inventive example 13 | 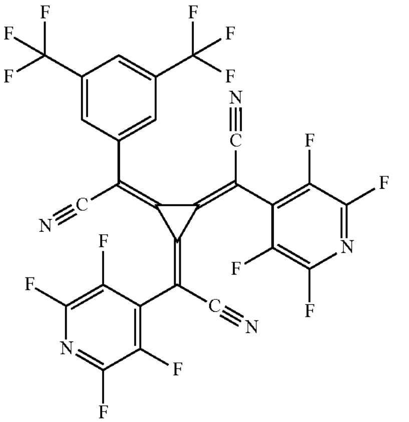 H10 | 11.8 wt % | F3 | 10 | F3 | F25 | 285 | 285 | 284 | 3.82 | 14.3 | 104 |
| Inventive example 14 | 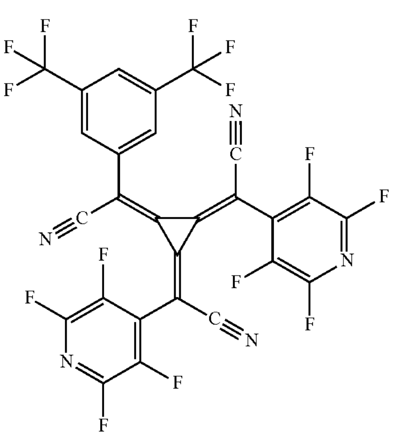 H10 | 100 wt % | — | 0.5 | F3 | F25 | 62 | 62 | 62 | 3.90 | 13.1 | 64 |

TABLE 4-continued
| | Structure of HIL | HIL (p-dopant concen-tration [wt %]) | HIL (Host) | HIL Thickness [nm] | HTL | EBL | Rs of HIL + HTL [GΩ/s]** | Rs of HIL, HTL, and EBL [GΩ/s]** | Rs of HIL, HTL, EBL, EML [GΩ/s]** | Voltage [V] at 15 mA/cm | EQE [%] at 15 mA/cm | LT97 at 30 mA/cm |
|---|---|---|---|---|---|---|---|---|---|---|---|---|
| Inventive example 15 | 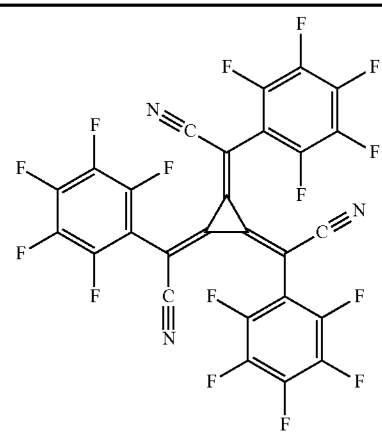 H11 | 100 wt % | — | 0.6 | F3 | F21 | 138 | 138 | 137 | 3.83 | 14.5 | |
| Inventive example 16 | 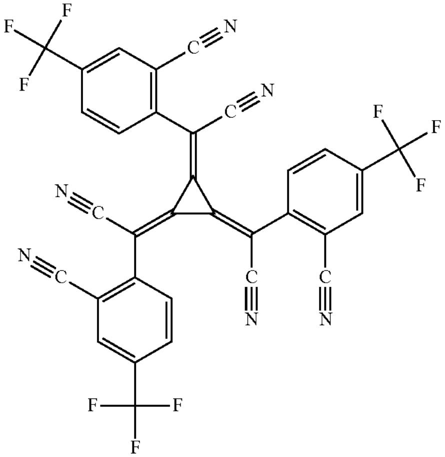 H12 | 100 wt % | — | 1 | F3 | F21 | 204 | 204 | 202 | 3.83 | 13.5 | 83 |

TABLE 4-continued
| | Structure of HIL | HIL (p-dopant concen-tration [wt %]) | HIL (Host) | HIL Thickness [nm] | HTL | EBL | Rs of HIL + HTL [GΩ/s]** | Rs of HIL, HTL, and EBL [GΩ/s]** | Rs of HIL, HTL, EBL, EML [GΩ/s]** | Voltage [V] at 15 mA/cm | EQE [%] at 15 mA/cm | LT97 at 30 mA/cm |
|---|---|---|---|---|---|---|---|---|---|---|---|---|
| Inventive example 17 | 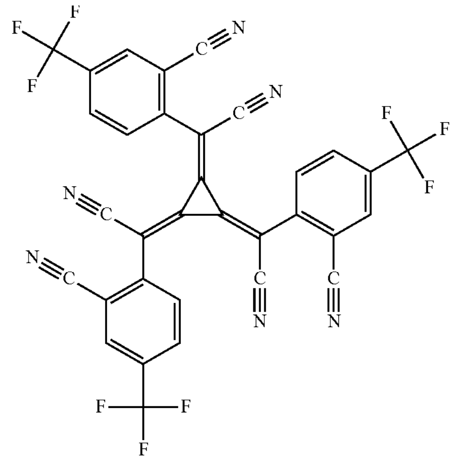 H12 | 100 wt % | — | 2 | F18 | F21 | 405 | 404 | 401 | 3.82 | 14.3 | 80 |

TABLE 4-continued
| | Structure of HIL | HIL (p-dopant concen-tration [wt %]) | HIL (Host) | HIL Thickness [nm] | HTL | EBL | Rs of HIL + HTL [GΩ/s]** | Rs of HIL, HTL, and EBL [GΩ/s]** | Rs of HIL, HTL, EBL, EML [GΩ/s]** | Voltage [V] at 15 mA/cm | EQE [%] at 15 mA/cm | LT97 at 30 mA/cm |
|---|---|---|---|---|---|---|---|---|---|---|---|---|
| Inventive example 18 | 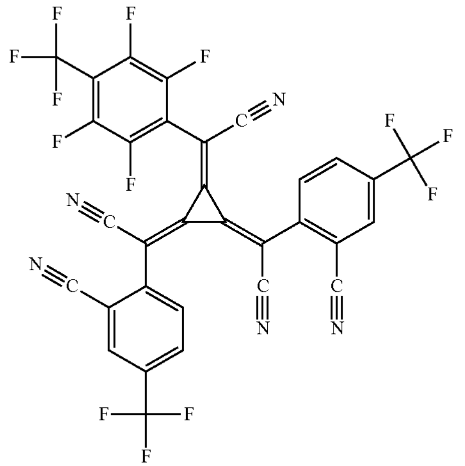 H13 | 20.8 wt % | F3 | 12 | F3 | F21 | 570 | 565 | 562 | 3.88 | 13.6 | 92 |

TABLE 4-continued
| | Structure of HIL | HIL (p-dopant concentration [wt %]) | HIL (Host) | HIL Thickness [nm] | HTL | EBL | Rs of HIL + HTL [GΩ/s]** | Rs of HIL, HTL, and EBL [GΩ/s]** | Rs of HIL, HTL, EBL, EML [GΩ/s]** | Voltage [V] at 15 mA/cm | EQE [%] at 15 mA/cm | LT97 at 30 mA/cm |
|---|---|---|---|---|---|---|---|---|---|---|---|---|
| Inventive example 19 | 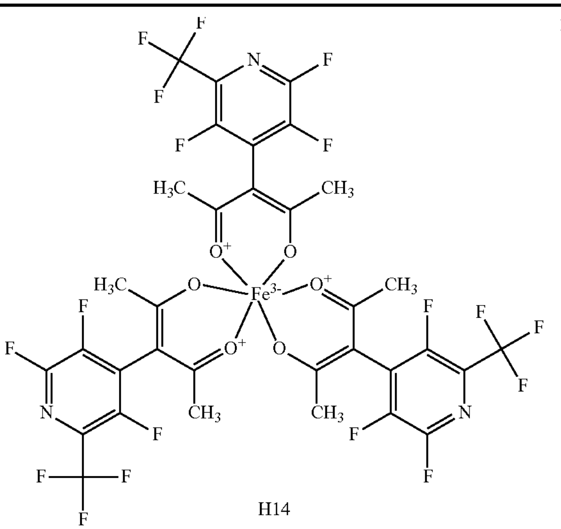 H14 | 13.5 wt % | F3 | 11 | F3 | F21 | 8683 | 8605 | 8539 | 3.86 | 13.7 | 67 |

TABLE 4-continued
| | Structure of HIL | HIL (p-dopant concentration [wt %]) | HIL (Host) | HIL Thickness [nm] | HTL | EBL | Rs of HIL + HTL [GΩ/s]** | Rs of HIL, HTL, and EBL [GΩ/s]** | Rs of HIL, HTL, EBL, EML [GΩ/s]** | Voltage [V] at 15 mA/cm | EQE [%] at 15 mA/cm | LT97 at 30 mA/cm |
|---|---|---|---|---|---|---|---|---|---|---|---|---|
| Inventive example 20 | 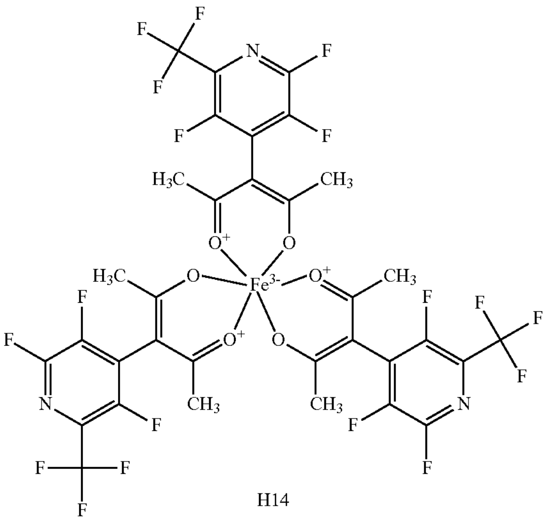 H14 | 21.8 wt % | F5 | 11 | F5 | F21 | 15455 | 15446 | 15395 | 3.72 | 13.7 | 211 |
| Inventive example 21 | 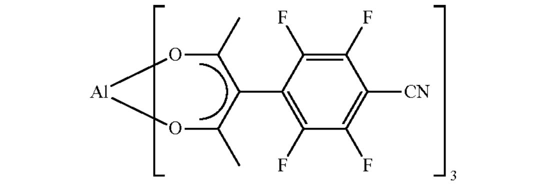 H15 | 20.2 wt % | F3 | 10 | F3 | F25 | 30244 | 30191 | 29997 | 3.84 | 12.7 | 100 |
| Inventive example 22 | 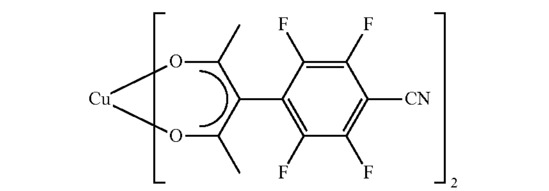 H16 | 10 wt % | F3 | 10 | F3 | F25 | 96159 | 95896 | 95040 | 3.89 | 12.9 | 88 |

TABLE 4-continued
| | Structure of HIL | HIL (p-dopant concen-tration [wt %]) | HIL (Host) | HIL Thickness [nm] | HTL | EBL | Rs of HIL + HTL [GΩ/s]** | Rs of HIL, HTL, and EBL [GΩ/s]** | Rs of HIL, HTL, EBL, EML [GΩ/s]** | Voltage [V] at 15 mA/cm | EQE [%] at 15 mA/cm | LT97 at 30 mA/cm |
|---|---|---|---|---|---|---|---|---|---|---|---|---|
| Inventive example 23 | 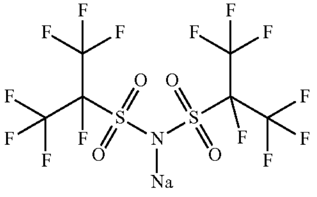 H17 | 6 wt % | F2 | 10 | F2 | F21 | 115 | 114 | 113 | 3.73 | 12.2 | 154 |
| Inventive example 24 | 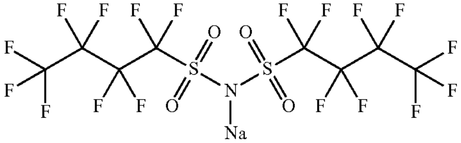 H18 | 100 wt % | — | 1.1 | F3 | F21 | 264 | 262 | 261 | 3.86 | 13.1 | 189 |
| Inventive example 25 | 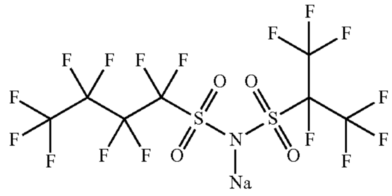 H19 | 7.8 wt % | F18 | 11 | F18 | F21 | 163 | 162 | 161 | 3.88 | 14.8 | 55 |
| Inventive example 26 | 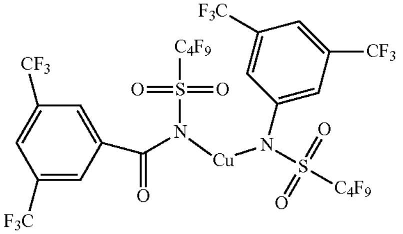 H20 | 2.99 wt % | F3 | 11 | F3 | F21 | 143 | 142 | 142 | 3.82 | 15.0 | 58 |

TABLE 4-continued
| | Structure of HIL | HIL (p-dopant concentration [wt %]) | HIL (Host) | HIL Thickness [nm] | HTL | EBL | Rs of HIL + HTL [GΩ/s]** | Rs of HIL, HTL, and EBL [GΩ/s]** | Rs of HIL, HTL, EBL, EML [GΩ/s]** | Voltage [V] at 15 mA/cm | EQE [%] at 15 mA/cm | LT97 at 30 mA/cm |
|---|---|---|---|---|---|---|---|---|---|---|---|---|
| Inventive example 27 | 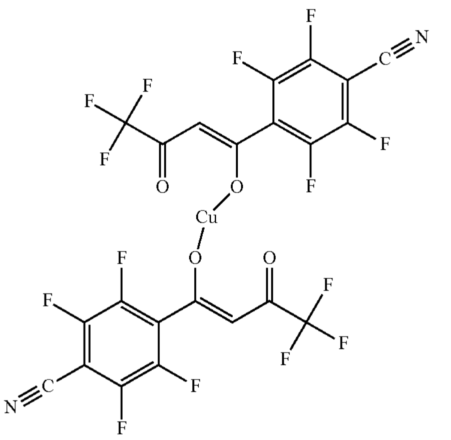 | 10 wt % | F3 | 10 | F3 | F22 | 13910 | 13828 | 13718 | 3.90 | 14.2 | 137 |
| Inventive example 28 | 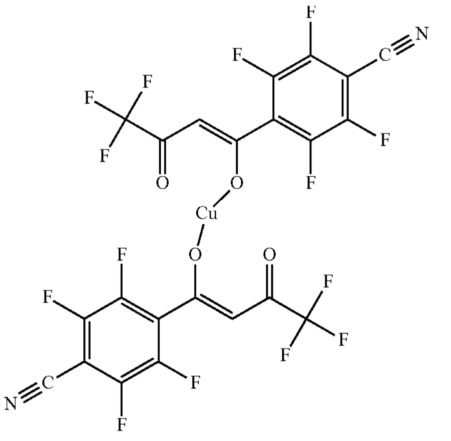 | 15 wt % | F3 | 10 | F3 | F22 | 11861 | 11569 | 11391 | 3.89 | 14.2 | 130 |

TABLE 4-continued
| | Structure of HIL | HIL (p-dopant concen-tration [wt %]) | HIL (Host) | HIL Thickness [nm] | HTL | EBL | Rs of HIL + HTL [GΩ/s]** | Rs of HIL, HTL, and EBL [GΩ/s]** | Rs of HIL, HTL, EBL, EML [GΩ/s]** | Voltage [V] at 15 mA/cm | EQE [%] at 15 mA/cm | LT97 at 30 mA/cm |
|---|---|---|---|---|---|---|---|---|---|---|---|---|
| Inventive example 29 | 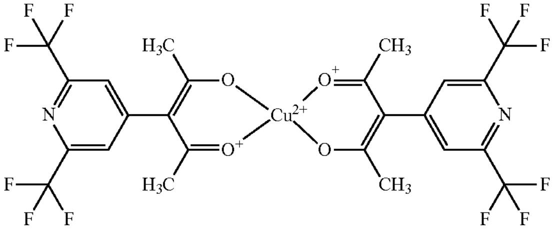 | 5 wt % | F3 | 10 | F3 | F22 | 9823 | 9541 | 9260 | 3.96 | 15.1 | 144 |
| Inventive example 30 | 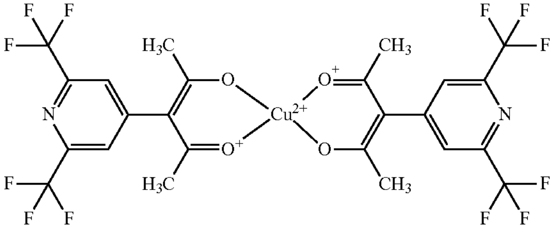 | 10 wt % | F3 | 10 | F3 | F22 | 728 | 719 | 701 | 3.91 | 15.2 | 78 |
| Inventive example 31 | 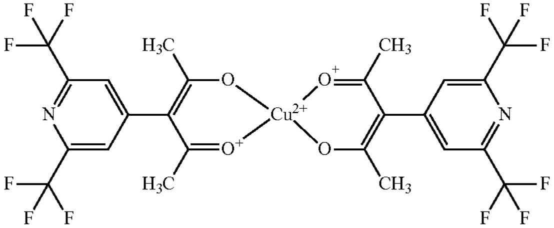 | 15 wt % | F3 | 10 | F3 | F22 | 202 | 197 | 194 | 3.90 | 15.2 | 80 |

Technical Effect of the Invention

As can be seen from Table 4 the device has a beneficial operational voltage since the operational voltage is low and at the same time the sheet resistance is high or higher as 50 giga ohms per square. Moreover, in addition to the operational voltage the EQE and/or the lifetime is improved.

The particular combinations of elements and features in the above detailed embodiments are exemplary only; the interchanging and substitution of these teachings with other teachings in this and the patents/applications incorporated by reference are also expressly contemplated. As those skilled in the art will recognize, variations, modifications, and other implementations of what is described herein can occur to those of ordinary skill in the art without departing from the spirit and the scope of the invention as claimed. Accordingly, the foregoing description is by way of example only and is not intended as limiting. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. The invention's scope is defined in the following claims and the equivalents thereto. Furthermore, reference signs used in the description and claims do not limit the scope of the invention as claimed.

The invention claimed is:

1. An active-matrix OLED display, comprising a plurality of OLED pixels, wherein each pixel itself comprises a stack of organic layers, wherein at least a first OLED pixel and a second OLED pixel comprising
- an anode layer,
- a common cathode layer,
- at least a stack of organic layers, comprising
  - a plurality of semiconductor layers, and the plurality of semiconductor layers comprising at least two or more common semiconductor layers, wherein the plurality of semiconductor layers comprising
    - at least a common first semiconductor layer that is a common hole injection layer, wherein the common hole injection layer comprises a hole injection material, and wherein the common hole injection layer extends over all pixels of the plurality of pixels or extends over at least two pixels of the plurality of pixels in the OLED display,
    - at least a common second semiconductor layer, at least one emission layer, which is optional a common emission layer, and wherein the common hole injection layer and the common second semiconductor layer have together a sheet resistance of ≥50 giga ohms per square.

2. The active-matrix OLED display according to claim 1, wherein the common second semiconductor layer is selected from the group consisting of a common hole transport layer and a common electron blocking layer.

3. The active-matrix OLED display according to claim 2, wherein the common hole injection layer is at least partly arranged in direct contact to the anode layer and the common hole transport layer is arranged between the common emission layer and the common hole injection layer.

4. The active-matrix OLED display according to claim 2, wherein the common hole injection layer and the common hole transport layer have together a sheet resistance selected from ≥100 giga ohms per square.

5. The active-matrix OLED display according to claim 2, wherein the layer selected from the group of common second semiconductor layer or the common hole transport layer, has a layer thickness selected from ≥5 nm and ≤250 nm.

6. The active-matrix OLED display according to claim 2, wherein the layer selected from the group of common second semiconductor layer or common hole transport layer, comprises a compound having energies of their highest occupied molecular orbitals, expressed in the absolute scale referring to vacuum energy level being zero, calculated using the hybrid functional B3LYP with a Gaussian 6-31G* basis set as implemented in the program package TURBOMOLE V6.5, in the range of $$< -4.27 \text{ eV to } \geq -6.0 \text{ eV}.$$

7. The active-matrix OLED display according to claim 1, wherein the common hole injection layer is in direct contact with the second common semiconductor layer that is a common hole transport layer or common electron blocking layer.

8. The active-matrix OLED display according to claim 1, wherein the common second semiconductor layer is a common hole transport layer.

9. The active-matrix OLED display according to claim 1, wherein the plurality of common semiconductor layers comprises in addition a common third semiconductor layer, wherein the common first semiconductor layer, the common second semiconductor layer and the common third semiconductor layer have together a sheet resistance of ≥50 giga ohms per square.

10. The active-matrix OLED display according to claim 9, wherein the common third semiconductor layer is a common electron blocking layer, wherein the common first semiconductor layer is a common hole injection layer, and the common second semiconductor layer is a common hole transport layer; and wherein the common first semiconductor layer that is a common hole injection layer, and the common second semiconductor layer that is a common hole transport layer, and the common third semiconductor layer that is a common electron blocking layer have together a sheet resistance of ≥50 giga ohms per square.

11. The active-matrix OLED display according to claim 10, wherein the electron blocking layer comprises a compound having energies of their highest occupied molecular orbitals, expressed in the absolute scale referring to vacuum energy level being zero, calculated using the hybrid functional B3LYP with a Gaussian 6-31G* basis set as implemented in the program package TURBOMOLE V6.5, in the range from $$< -4.7 \text{ eV to } \geq -6.0 \text{ eV}.$$

12. The active-matrix OLED display according to claim 10, wherein the electron blocking layer has a layer thickness of ≥1 nm and ≤20 nm.

13. The active-matrix OLED display according to claim 9, wherein the common third semiconductor layer that is a common electron blocking layer is arranged between the common second semiconductor layer that is a common hole transport layer and the emission layer.

14. The active-matrix OLED display according to claim 9, wherein the common hole injection layer, the common second semiconductor layer, the common third semiconductor layer, and the common emission layer have together a sheet resistance of ≥50 giga ohms per square.

15. The active-matrix OLED display according to claim 1, wherein the emission layer of each pixel is doped with a color defining emitter dopant, wherein the color of the color defining emitter dopant is independently selected for each pixel or selected the same.

16. The active-matrix OLED display according to claim 1, wherein the sheet resistance is determined by transmission line method.

17. The active-matrix OLED display according to claim 1, wherein the anode layer of the first OLED pixel and the anode layer of the second OLED pixel are separated by a pixel definition layer, so that the anode layer of the first OLED pixel and the anode layer of the second OLED pixel are not a common layer and do not contact each other.

18. The active-matrix OLED display according to claim 1, wherein every individual pixel may have its own anode that may not touch anodes of other individual pixels.

19. The active-matrix OLED display according to claim 1, wherein at least the first OLED pixel and the second OLED pixel comprises each an anode layer, wherein the anode layer of the first OLED pixel and the second OLED pixel are optional separated by a pixel definition layer, wherein the anode layer is not a common layer, and wherein the common hole injection layer is at least partly arranged in direct contact to the anode layer and the at least common second semiconductor layer is arranged between the emission layer and the common hole injection layer.

20. The active-matrix OLED display according to claim 19, wherein the at least common second semiconductor layer is a common hole transport layer.

21. The active-matrix OLED display according to claim 19, wherein the emission layer is a common emission layer.

22. The active-matrix OLED display according to claim 19, wherein the emission layer is optionally a common emission layer.

23. The active-matrix OLED display according to claim 1, wherein the common hole injection layer contains a hole injection material and the common hole injection layer is selected from the group consisting of an i-hole injection layer and hole injection material doped layer.

24. The active-matrix OLED display according to claim 23, wherein the concentration of hole injection material, based on the weight of the hole injection material-doped hole injection layer, is ≥0.1 wt.-% and ≤40 wt.

25. The active-matrix OLED display according to claim 1, wherein the common stack of organic layers comprises in addition a common organic layer selected from the group consisting of common electron injection layer, common hole blocking layer and electron transport layer.

26. The active-matrix OLED display according to claim 1, wherein at least one anode layer comprises a first anode sub-layer and a second anode sub-layer, wherein the first anode sub-layer comprises a first metal having a work function in the range of ≥4 and ≤6 eV, and the second anode sub-layer comprises a transparent conductive oxide; and the second anode sub-layer is arranged closer to the common hole injection layer.

27. Method for manufacture of at least one common layer according to claim 1, wherein the method for manufacture of at least one common layer comprises that each common layer is deposited onto the complete display area through one large mask opening in one processing step.

28. The active-matrix OLED display according to claim 1, wherein the common stack of organic layers comprises in addition a common electron transport layer.

29. The active-matrix OLED display according to claim 28, wherein the common electron-transport layer is arranged between the emission layer and the common cathode layer.

30. The active-matrix OLED display according to claim 29, wherein the common electron injection layer is in direct contact with the common cathode layer.

31. The active-matrix OLED according to claim 1, wherein the layer selected from the group of common first semiconductor layer or the common hole injection layer, has a layer thickness selected from ≥1 nm and ≤100 nm.

32. The active-matrix OLED display according to claim 1, wherein the active-matrix OLED display comprises a driving circuit configured to separately driving the pixels of the plurality of organic-light emitting diode pixels.

* * * * *